(12) United States Patent
Watanabe

(10) Patent No.: US 6,313,673 B1
(45) Date of Patent: Nov. 6, 2001

(54) FREQUENCY-DIVIDING CIRCUIT CAPABLE OF GENERATING FREQUENCY-DIVIDED SIGNAL HAVING DUTY RATIO OF 50

(75) Inventor: Tetsuya Watanabe, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/397,771

(22) Filed: Sep. 16, 1999

(30) Foreign Application Priority Data

Mar. 30, 1999 (JP) .................................................. 11-088947

(51) Int. Cl.$^7$ .................................................. H03K 21/00
(52) U.S. Cl. ............................ 327/115; 327/117; 327/118
(58) Field of Search .................................... 327/115, 117, 327/118, 120, 121, 122, 154; 377/47, 48

(56) References Cited

U.S. PATENT DOCUMENTS

| | | | | |
|---|---|---|---|---|
| 4,656,649 | * | 4/1987 | Takahashi | 377/48 |
| 5,264,738 | * | 11/1993 | Veendrick et al. | 327/203 |
| 5,390,223 | * | 2/1995 | Lindholm | 377/49 |
| 5,425,074 | * | 6/1995 | Wong | 377/47 |
| 6,043,693 | * | 3/2000 | Thomas | 327/154 |
| 6,067,399 | * | 5/2000 | Knapp et al. | 377/47 |

FOREIGN PATENT DOCUMENTS

| | | |
|---|---|---|
| 7-152454 | 6/1995 | (JP) . |
| 8-330916 | 12/1996 | (JP) . |

* cited by examiner

*Primary Examiner*—Tuan T. Lam
*Assistant Examiner*—Hiep Nguyen
(74) *Attorney, Agent, or Firm*—McDermott, Will & Emery

(57) ABSTRACT

A signal obtained through logical operation of an output signal from a K·T delay circuit delaying a supplied signal by K cycles of an input signal and a feedback signal of an M·T delay circuit delaying a supplied signal by M cycles of the input signal through a feedback part is supplied to the M·T delay circuit. Among signals generated by the M·T delay circuit, signals out of phase by K/2 cycles of the input signal is Ored or ANDed by a duty control circuit for controlling a duty ratio. Alternatively, cascaded latch circuits operating in synchronization with a clock signal have a final output coupled to a first stage input through an inverter. The final output provides a frequency-divided signal. The number of components is reduced, layout efficiency is improved and a frequency-divided signal having a duty ratio of 50% is provided.

21 Claims, 29 Drawing Sheets

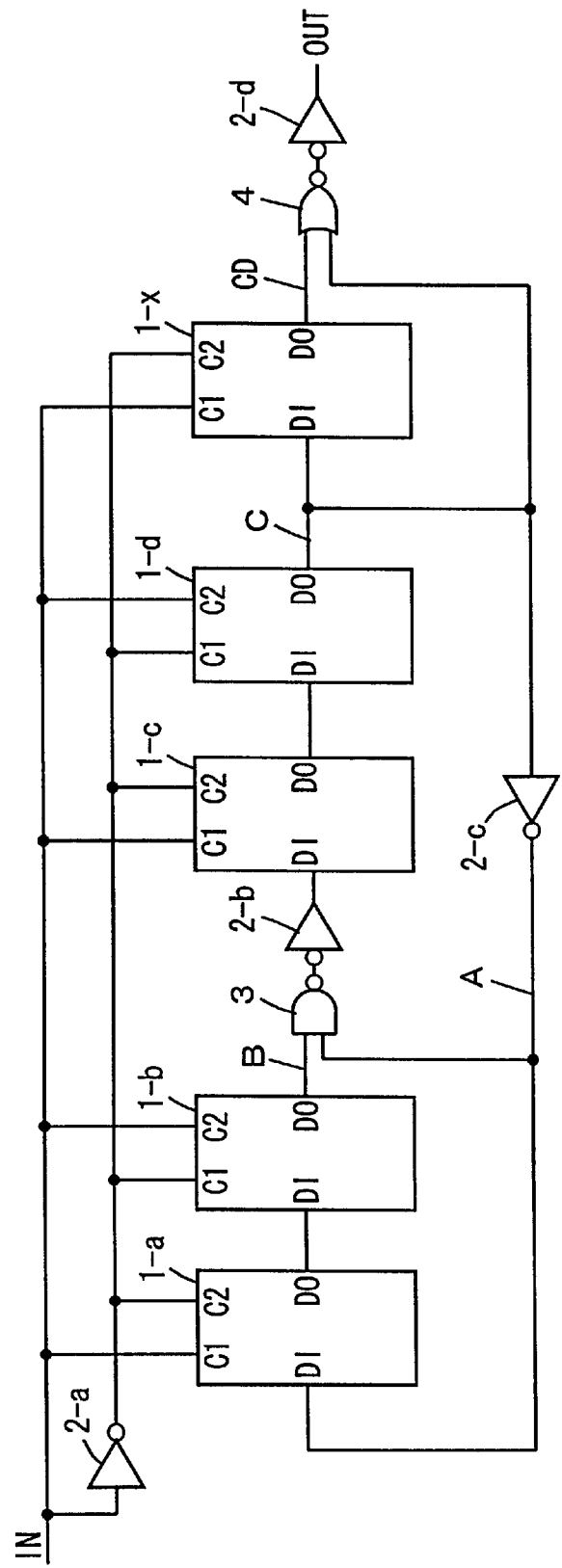
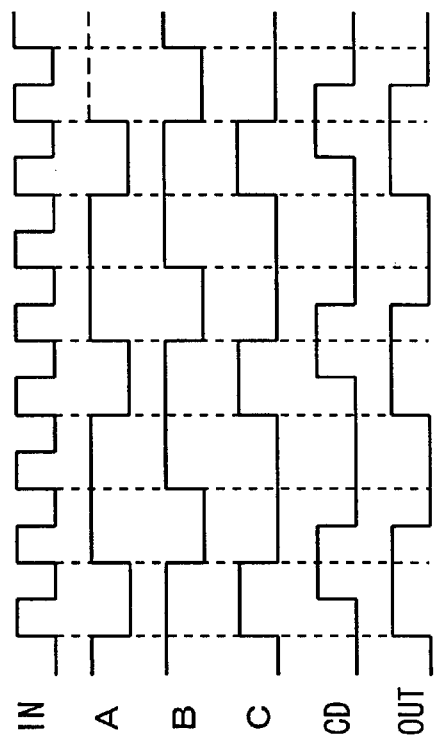
F I G. 7A
F I G. 7B

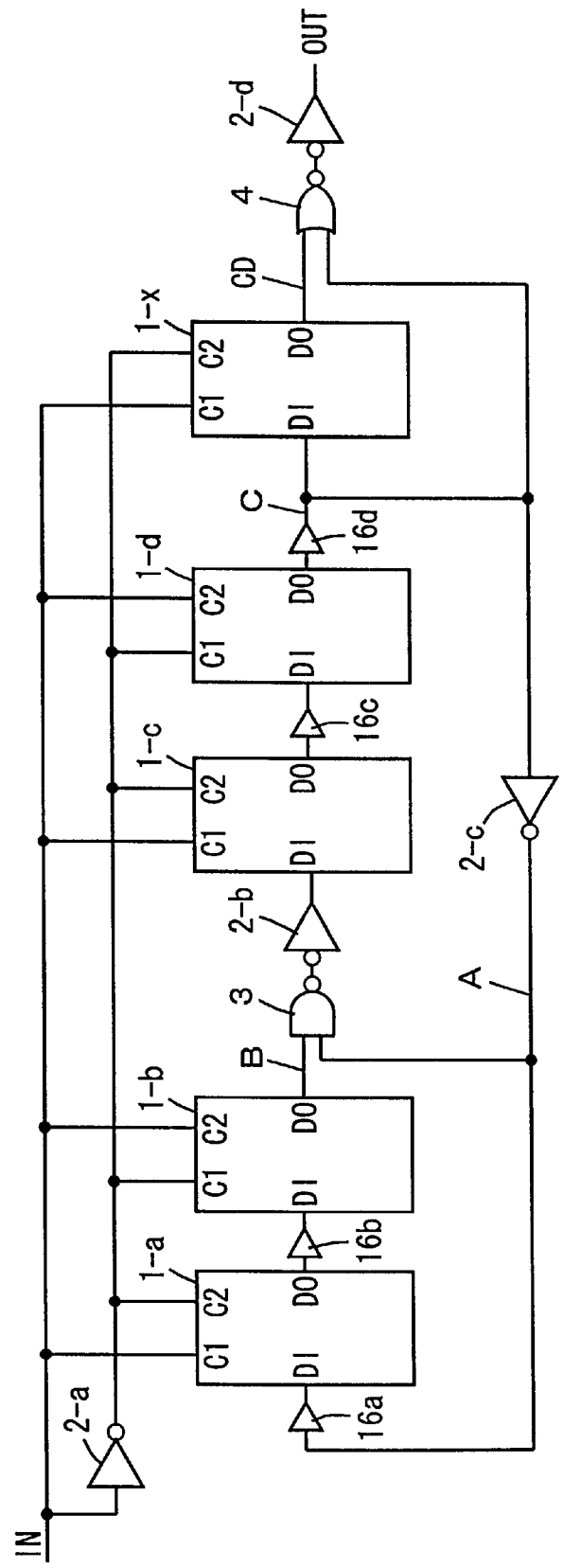
F I G. 9

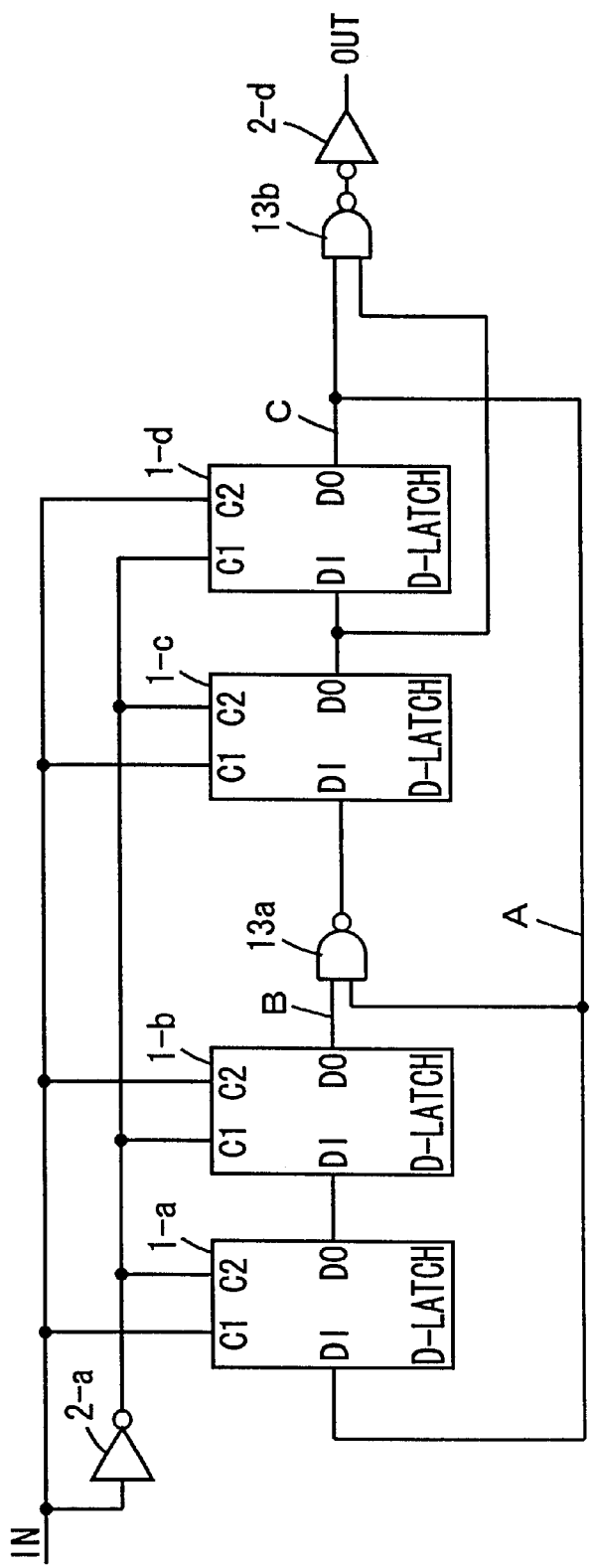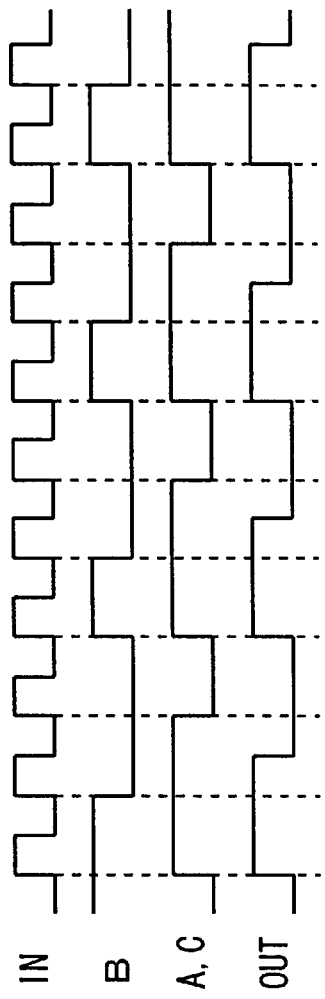
FIG. 11A
FIG. 11B

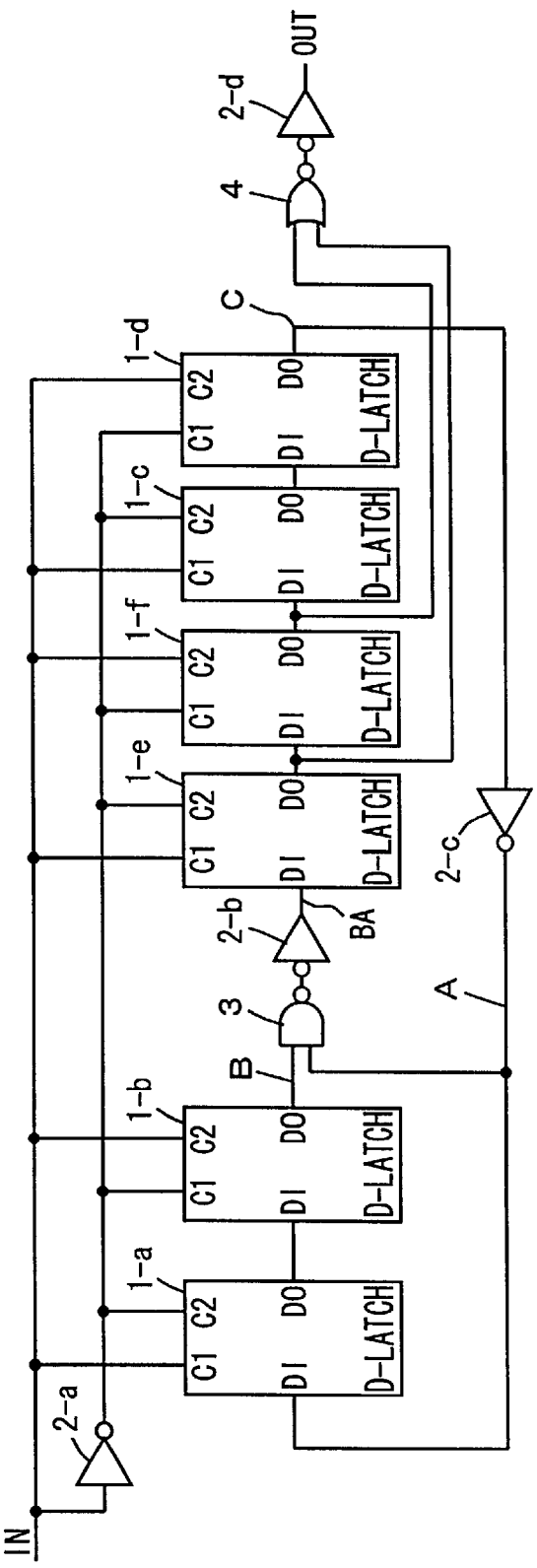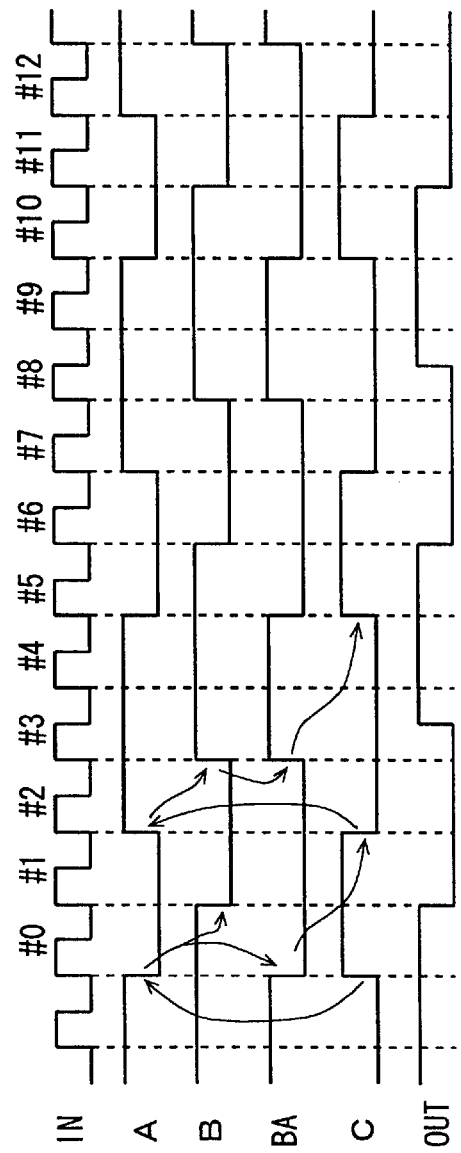
FIG. 15A
FIG. 15B

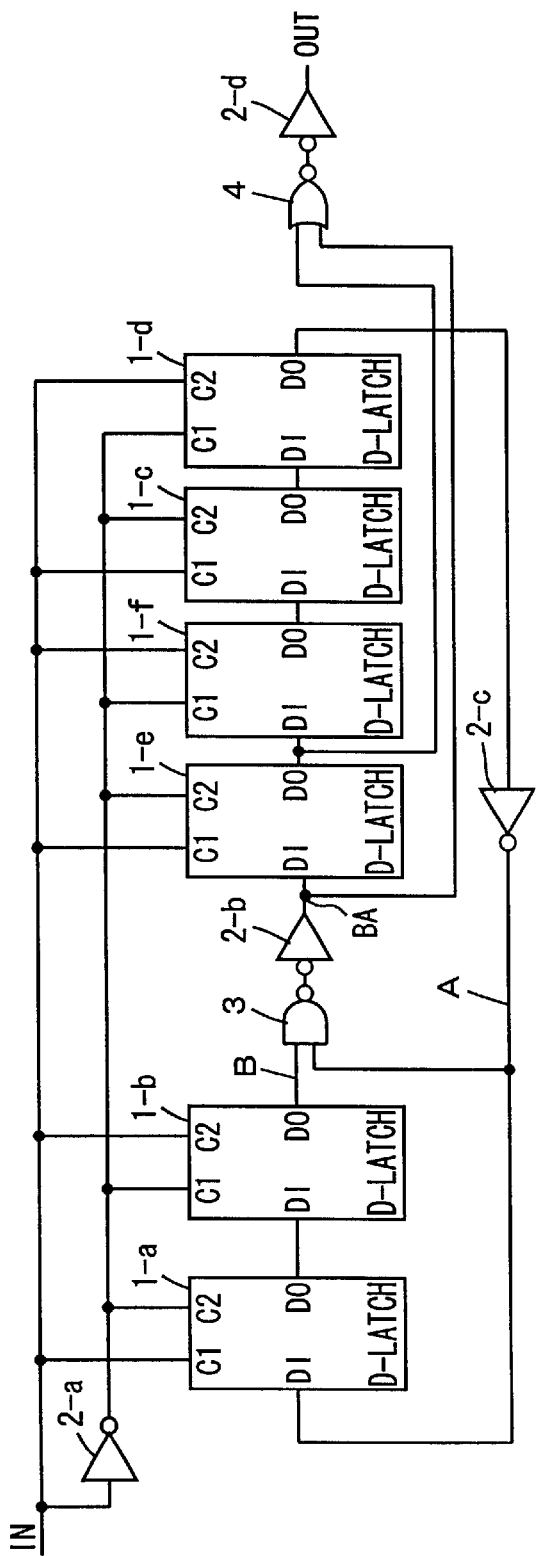
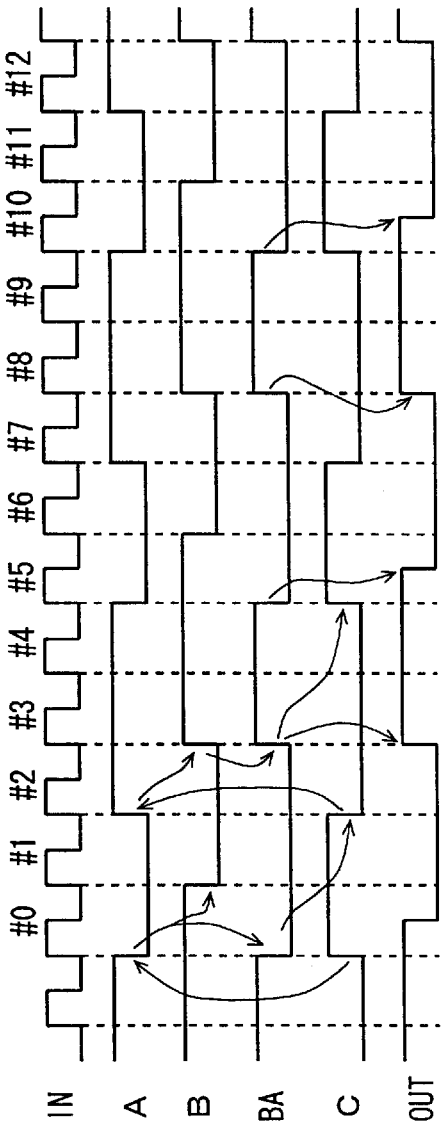
FIG. 16A
FIG. 16B

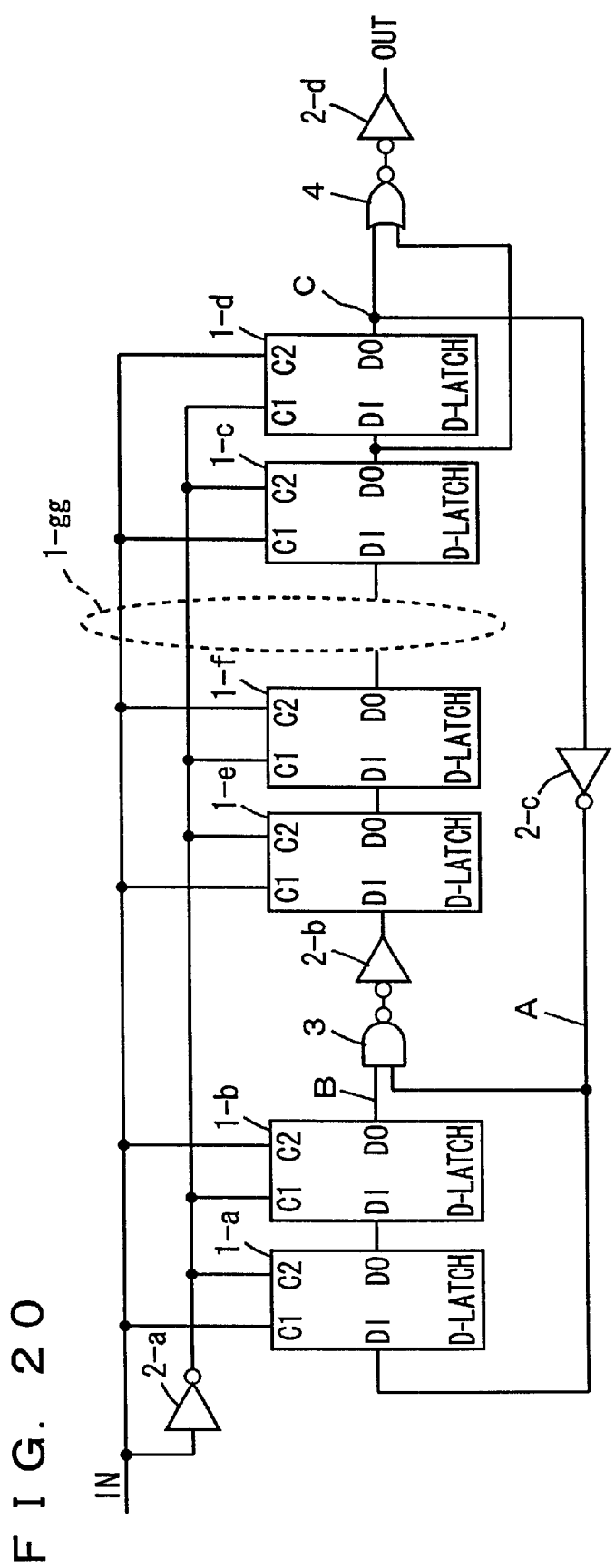
F I G. 20

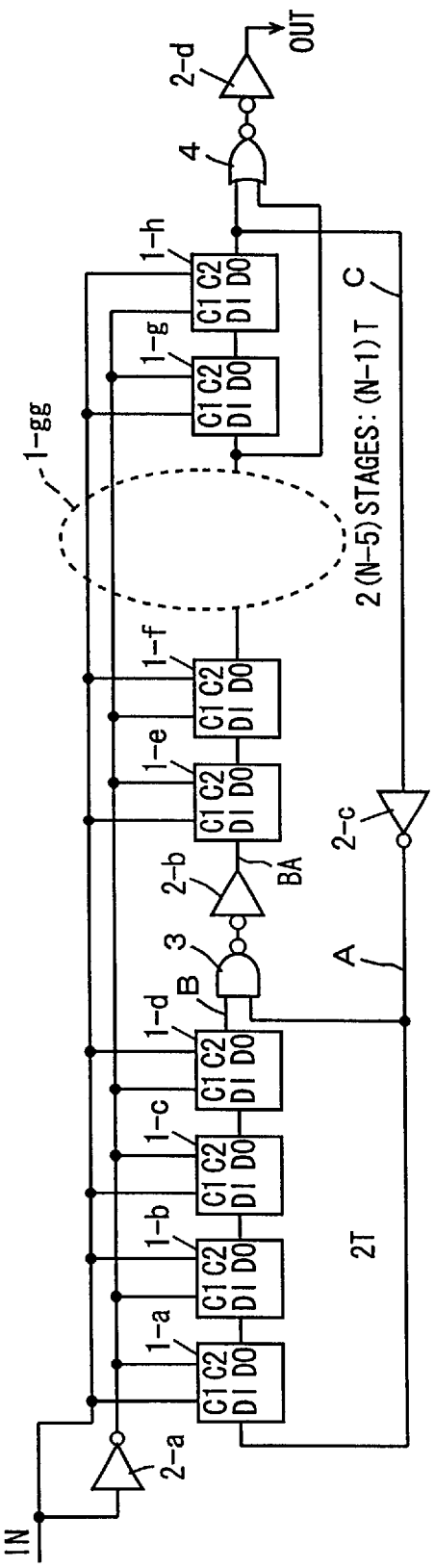
F I G. 28A
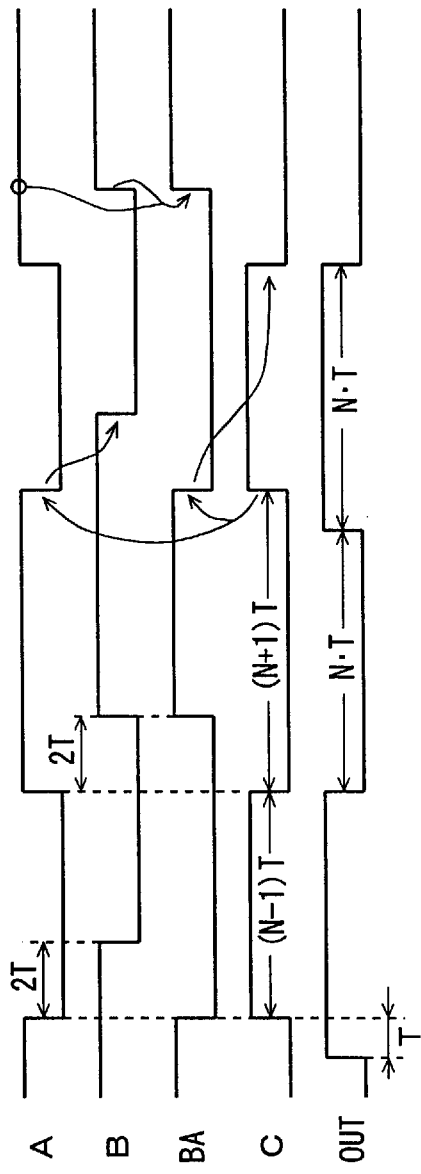
F I G. 28B

FREQUENCY-DIVIDING CIRCUIT CAPABLE OF GENERATING FREQUENCY-DIVIDED SIGNAL HAVING DUTY RATIO OF 50%

BACKGROUND OF THE INVENTION

1. Field of the Invention

The present invention relates to a circuit for frequency-dividing a supplied signal, and more particularly, it relates to a frequency-dividing circuit capable of readily generating a frequency-divided signal having a desired frequency-dividing ratio with a small occupying area.

2. Description of the Prior Art

FIG. 36 schematically illustrates the structure of a conventional 1/3 frequency-dividing circuit. Referring to FIG. 36, the conventional 1/3 frequency-dividing circuit includes two stages of cascaded JK flipflops FF1 and FF2. JK flip-flop FF1 receives a clock signal CLK at a clock input CP, a signal from an output/Q2 of JK flip-flop FF2 at an input J, and a fixed value "1" at an input K. JK flip-flop FF2 receives the clock signal CLK at a clock input CP, a signal from an output Q2 of JK flip-flop FF1 at an input J and a fixed value "1" at an input K. JK flipflops FF1 and FF2 receive a reset signal RST at reset inputs R. Operations of the 1/3 frequency-dividing circuit shown in FIG. 36 are now described with reference to a timing chart shown in FIG. 37.

First, the reset signal RST is activated to initialize output signals Q1 and Q2 of JK flipflops FF1 and FF2 to a low level. JK flipflops FF1 and FF2 are such down edge flipflops that the states of the outputs Q1 and Q2 thereof are decided on the falling edge of the clock signal CLK. When the clock signal CLK falls in a cycle #1, the output signal Q1 of JK flip-flop FF1 is inverted in state and rises to a high level since the signal/Q2 supplied to the input J is high. The output signal Q2 of JK flip-flop FF2 remains low since the signal Q1 supplied to the input J on the falling edge of the clock signal CLK is low.

When the clock signal CLK falls in a cycle #2, the output signal Q1 of JK flip-flop FF1 is inverted in state and goes low since the signal/Q2 supplied to the input J is high. On the other hand, the output signal Q2 of JK flip-flop FF2 is inverted in state and goes high since the signal Q1 is high on the falling edge of the clock signal CLK, and the signal/Q2 responsively goes low.

When the clock signal CLK falls to a low level in a clock cycle #3, the output signal Q1 of JK flip-flop FF1 remains low since the signal/Q2 supplied to the input J is low. On the other hand, the output signal Q2 of JK flip-flop FF2 falls to a low level since the signal Q1 is low. The signal /Q2 responsively goes high.

When the clock signal CLK falls in a clock cycle #4, the output signal Q1 of the JK flip-flop FF1 is inverted in state and rises to the high level from the low level since the signal/Q2 supplied to the input J is high. On the other hand, the output signal Q2 of JK flip-flop FF2 remains low since the signal Q1 is low on the falling edge of the clock signal CLK. Thereafter these operations are repeated in clock cycles #5 to #9.

In the 1/3 frequency-dividing circuit shown in FIG. 36, the signals Q1 and Q2 remain high for one cycle period of the clock signal CLK in three cycles of the clock signal CLK. Thus, these signals Q1 and Q2 each have a cycle period three times as large as that of the clock signal CLK and correspond to signals obtained by frequency-dividing the clock signal CLK by 3.

A frequency-dividing circuit is widely employed for frequency-dividing a basic clock signal and driving a circuit in various cycles. Such a frequency-dividing circuit is employed in a serial-parallel conversion circuit converting serial data to parallel data, for example. The frequency-dividing circuit may supply a basic clock signal and a frequency-divided signal to internal circuits operating at low and high speeds respectively for driving the circuits synchronization with the clock signal.

Such frequency-divided clock signal preferably has a duty ratio of 50% providing equal high-level and low-level periods, in order to drive an internal circuit at a high speed. In the 1/3 frequency-dividing circuit shown in FIG. 36, however, the duty ratio of the frequency-divided signals Q1 and Q2 is about 33%. Further, each of JK flipflops FF1 and FF2 generally has the structure of a master flip-flop and a slave flip-flop, and includes cross-connected logic circuits. Thus, JK flip-flop disadvantageously has a large number of components (transistors) and a large occupying area. In order to attain the duty ratio of 50%, a counter may be employed as shown in FIG. 38A.

FIG. 38A illustrates an exemplary structure of a frequency-dividing circuit utilizing a counter. Referring to FIG. 38A, the frequency-dividing circuit includes an N-ary counter 900 counting a clock signal CLK and a T flip-flop 902 inverting the logic state of its output signal DVC in accordance with a count-up instruction signal φUP from the N-ary counter 900. When counting N clock signals CLK, the N-ary counter 900 drives the count-up instruction signal φUP to an active state. As shown in FIG. 38B, the logic state of the signal DVC from T flip-flop 902 is inverted each time N clock signals CLK are supplied. Thus, the signal DVC from T flip-flop 902 corresponds to a signal obtained by frequency-dividing the clock signal CLK with a frequency-division ratio of 1/2N. Further, each of high- and low-level periods corresponds to N cycles of the clock signal CLK, and the duty ratio of the output signal DVC can be substantially set to 50%.

Wit the N-ary counter shown in FIG. 38A, however, it is difficult to correctly set the duty ratio to 50% due to deviation of the timing for generating the count-up instruction signal φUP or the like. Further, the N-ary counter formed by a D flip-flop and the like has a large number of components and the occupying area thereof cannot be reduced. When utilizing such an N-ary counter, further, the frequency-division ratio is 1/2N and a frequency-dividing circuit dividing a signal with a frequency-division ratio of 1/(2N+1) cannot be implemented.

When extending the frequency-dividing circuit employing a synchronous counter shown in FIG. 36 to reduce the frequency division ratio thereof (lengthening the cycle period of the frequency-divided signal), a logic gate must be inserted between JK flipflops depending on the frequency-division ratio. Thus, it is difficult to extend the frequency-dividing circuit to implement a frequency-dividing circuit having a desired frequency-division ratio.

SUMMARY OF THE INVENTION

An object of the present invention is to provide a frequency-dividing circuit having excellent versatility with a small occupying area.

Another object of the present invention is to provide a frequency-dividing circuit capable of correctly and readily generating a frequency-divided signal having a duty ratio of 50%.

Still another object of the present invention is to provide a frequency-dividing circuit readily generating a frequency-divided signal having a desired frequency division ratio.

A further object of the present invention is to provide a frequency-dividing circuit readily extendable to a different frequency division ratio.

A frequency-dividing circuit according to a first aspect of the present invention includes a first delay stage operating in synchronization with a clock signal having a cycle T for delaying a supplied signal by K cycles K·T of the clock signal and outputting the delayed signal, a second delay stage operating in synchronization with the clock signal for delaying a supplied signal by M cycles M·T of the clock signal and outputting the delayed signal, a feedback circuit for feeding back the output signal of the second delay stage to an input of the first delay stage and a logic circuit receiving the output signal of the first delay stage and a feedback signal of the feedback circuit for performing prescribed logical processing on the received signals and supplying the logically processed signals to the second delay stage. K represents an integer, and M represents a natural number. In the logic circuit, the logical level of a signal output when both of the received signals are at a first logical level is different from that of a signal output otherwise. The frequency division ratio is expressed as 1/(2M+K).

A frequency-dividing circuit according to a second aspect of the present invention includes a delay stage operating in synchronization with a clock signal having a cycle T for delaying a supplied signal by N cycles of the clock signal and outputting the delayed signal and a feedback circuit inverting the output signal of the delay stage and transmitting the inverted signal to an input of the delay stage. N represents a natural number.

The delay stages operating in synchronization with the clock signal are arranged while the logic circuit is simply interposed between the first and second delay stages. The logic circuit can alternately invert the logic state of the output signal from the second delay stage in M+K cycles and M cycles, and can responsively generate a signal having a cycle 2(M+(K/2))T. A single stage of the logic circuit is simply interposed between the delay stages, and the circuit can be readily extended to change the frequency division ratio. Further, a circuit readily implementing frequency-division for increasing a cycle to odd or even times the clock cycle can be obtained by setting the value K to 1 or 2.

When inverting the output signal of the delay stage and transmitting the inverted signal to the input of the delay stage, a frequency-divided signal having a cycle of twice the delay time of the delay stage can be readily generated with no requirement for logical processing.

When generating a frequency-divided signal having a cycle of 2(M+(K/2))T, the frequency-divided signal can be correctly set high or low during a period (M+K)/2 by logically processing signals out of phase by K/2 cycles, and a frequency-divided signal having a duty ratio of 50% can be readily generated.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7A illustrates the structure of a frequency-dividing circuit according to a first embodiment of the present invention, and FIG. 7B is a timing chart representing operations of the frequency-dividing circuit shown in FIG. 7A;

FIG. 9 schematically illustrates the structure of a second modification of the frequency-dividing circuit according to the first embodiment of the present invention;

FIG. 11A illustrates a modification of the frequency-dividing circuit according to the second embodiment of the present invention, and FIG. 11B is a timing chart representing operations of the frequency-dividing circuit shown in FIG. 11A;

FIG. 15A illustrates the structure of a third modification of the frequency-dividing circuit according to the third embodiment of the present invention, and FIG. 15B is a timing chart representing operations of the frequency-dividing circuit shown in FIG. 15A;

FIG. 16A illustrates the structure of a fourth modification of the frequency-dividing circuit according to the third embodiment of the present invention, and FIG. 16B is a signal waveform diagram representing operations of the frequency-dividing circuit shown in FIG. 16A;

FIG. 20 schematically illustrates the structure of a first modification of the frequency-dividing circuit according to the fourth embodiment of the present invention;

FIG. 28A illustrates the structure of a frequency-dividing circuit according to an eighth embodiment of the present invention, and FIG. 28B is a signal waveform diagram representing operations of the frequency-dividing circuit shown in FIG. 28A;

DESCRIPTION OF THE PREFERRED EMBODIMENTS

[Basic Structure]

Figure 1:
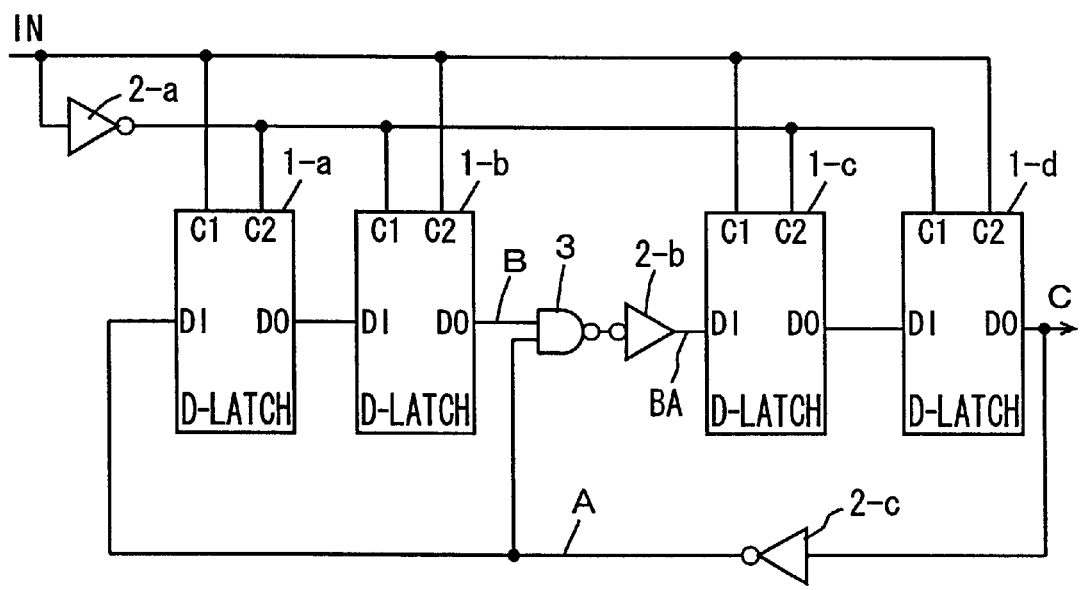
FIG. 1 schematically illustrates the basic structure of a frequency-dividing circuit according to the present invention.

FIG. 1 illustrates the basic structure of a frequency-dividing circuit being the starting point of the present invention. FIG. 1 shows the structure of a 1/3 frequency-dividing circuit. In the following description, the frequency-division ratio is expressed in the ratio Fout/Fin of the frequency Fout of the frequency-divided signal to the frequency Fin of the input signal. Therefore, a frequency-division ratio of 1/3 indicates that the frequency of the frequency-divided signal is 1/3 times the frequency of the input signal.

Referring to FIG. 1, the 1/3 frequency-dividing circuit includes D-latches 1-*a* to 1-*d* each transferring and latching a supplied signal in accordance with an input signal (clock signal) IN, an invertor 2-*c* inverting an output signal of D-latch 1-*c*, a NAND circuit 3 receiving output signals of the D-latch 1-*b* and the invertor 2-*c*, and an invertor 2-*b* inverting an output signal of NAND circuit 3 and supplying the inverted signal to an input DI of D-latch 1-*c*. The output signal of the invertor 2-*c* is also supplied to an input DI of D-latch 1-*a*. An output DO of D-latch 1-*a* is connected to an input DI of D-latch 1-*b*. An output DO of D-latch 1-*c* is connected to an input DI of D-latch 1-*d*.

The input signal IN is a one-phase clock signal having a cycle T, and an invertor 2-*a* generates an inverted input signal. Each of D-latches 1-*a* to 1-*d* receives complementary two phase input signals at dock inputs C1 and C2, for transferring and latching the signal supplied to the input DI. D-latches 1-*a* and 1-*b* latch and transfer the signals complementarily to each other, and D-latches 1-*c* and 1-*d* latch and transfer the signals complementarily to each other. D-latches 1-*b* and 1-*d* enter through-states when the input signal IN is high.

Each of D-latches 1-*a* to 1-*d*, the internal structure of which is described later, enters a latch state of fixing the state of the output signal regardless of the state of the supplied signal when the signal supplied to the clock input C1 is high, and enters the through-state of transferring the supplied signal when the signal supplied to the clock input C1 is low. Thus, two stages of the D-latches delay the input signal IN by one cycle. A single stage of the D-latch delays the input signal IN by half a cycle. Operations of the frequency-dividing circuit shown in FIG. 1 are now described with reference to a timing chart shown in FIG. 2.

Figure 2:
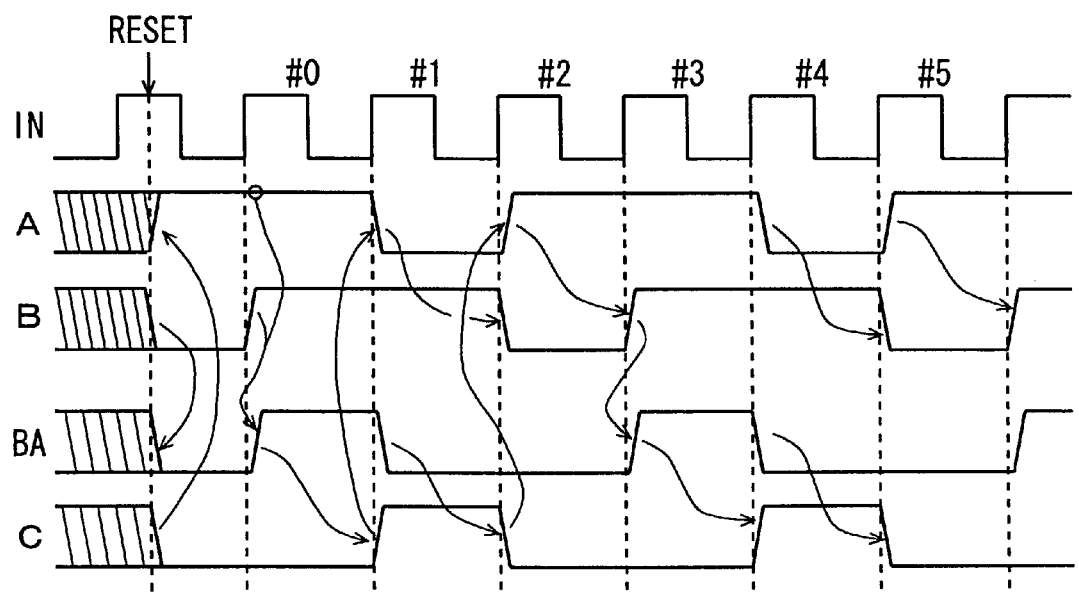
FIG. 2 is a timing chart representing operations of the frequency-dividing circuit shown in FIG. 1.

Assume that D-latches 1-*a* to 1-*d* are reset in a cycle preceding a clock cycle #0, as shown in FIG. 2. In this state, all signals on nodes B, BA and C are set low, while a signal on a node A is set high. D-latch 1-*a* enters the through-state when the input signal IN is low, while D-latch 1-*b* enters the through-state when the input signal IN is high. When input signal IN rises to a high level in the clock cycle #0, the output signal on the node B from D-latch 1-*b* rises to a high level. D-latch 1-*c* latches the low-level signal on the node BA, and the signal on the node C remains low regardless of the high level of the input signal IN.

When the input signal IN falls to a low level, D-latch 1-*a* takes in the high-level signal on the node A and transmits the signal to D-latch 1-*b*. D-latch 1-*b* remains in the latch state, and the signal on the node B remains high. When the signal on node B rises to the high level in the clock cycle #0, the signal output from the invertor 2-*b* onto the node BA rises to a high level. In response to the fall of the input signal IN in the clock cycle #0, the D-latch 1-*c* takes in the high-level signal on the node BA and transmits the signal to the D-latch 1-*d*. D-latch 1-*d* still remains in the latch state, and the signal on the node C remains low.

When the input signal IN rises to the high level in a clock cycle #1, D-latch 1-*d* enters the through-state to transmit the high-level signal latched by D-latch 1-*c* onto node C. The signal transmitted from invertor 2-*c* onto node A responsively falls to a low level, and the signal on node BA falls to a low level. D-latch 1-*b* transmits the high-level signal transmitted from D-latch 1-*a*, and hence the signal on the node B remains high.

When the input signal IN falls to a low level in the clock cycle #1, D-latches 1-*a* and 1-*c* enter the through-states and the output signals thereof go low. On the other hand, D-latches 1-*b* and 1-*d* remain in the latch states and the output signals thereof remain unchanged.

When the input signal IN rises to the high level in a clock cycle #2, D-latch 1-*d* enters the through-state, the low-level signal latched by D-latch 1-*c* is transmitted onto node C, and the signal on node A responsively goes high. D-latch 1-*b* transmits the low-level signal latched by D-latch 1-*a* onto node B. Thus, the signal on node B falls to a low level although the signal on node A rises to the high level, and hence the signal on node BA remains low.

In other words, D-latches 1-*a* and 1-*b* delay the signal on node A by one clock cycle period of the input signal IN and transmit the delayed signal to node B, while D-latches 1-*c* and 1-*d* delay the signal on node BA by one clock cycle period of the input signal IN and transmit the delayed signal to node C. That is, signal change on the node A is transmitted to node B with a delay of one clock cycle period, and signal change on node BA is transmitted onto node C with a delay of one clock cycle period of the input signal IN. The signal on node BA goes high when both of the signals on nodes A and B are high. When the signal on node C goes high, the signal on node A goes low. Thus, the signal on node BA goes high for the delay time of D-latches 1-*c* and 1-*d*, i.e., one clock cycle period of the input signal IN. Therefore, the signal on node C also goes high for one clock cycle period of the input signal IN every third clock cycle of the input signal IN. In other words, the node C outputs a signal obtained by dividing the input signal IN in a frequency division ratio of 1/3.

When the frequency-dividing circuit shown in FIG. 1 is employed, a logic circuit (AND circuit) for changing the state of the frequency-divided signal is simply inserted between D-latches 1-*b* and 1-*c*. Further, the frequency-divided signal from node C changes in synchronization with the input signal IN. Thus, a frequency-divided signal synchronous with the input signal IN can be provided.

[First Structure of D-Latch]

Figure 3A:
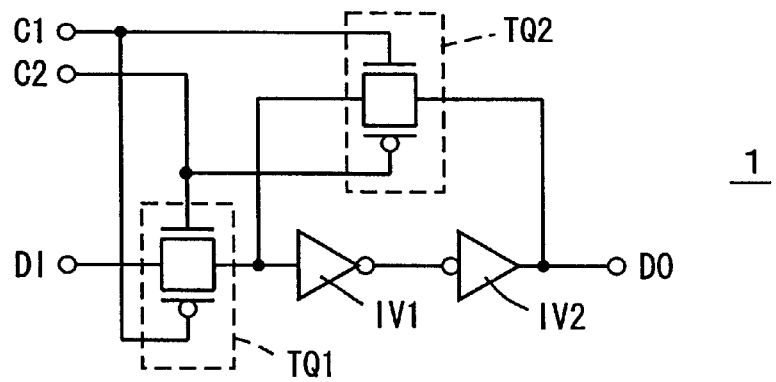
FIGS. 3A to 3C illustrate structures of a D-latch shown in FIG. 1.

FIG. 3A illustrates a structure of a D-latch 1 employed in the present invention. Referring to FIG. 3A, the D-latch 1 includes a CMOS transmission gate TQ1 coupled to clock inputs C1 and C2 and rendered conductive for passing a signal on an input DI when a signal in the clock input C1 is low, two stages of cascaded invertors IV1 and IV2 transmitting the signal transmitted from the CMOS transmission gate TQ1 to an output DO, and a CMOS transmission gate TQ2 coupled to the clock input nodes C1 and C2 and rendered conductive for coupling the output DO to an input of the invertor IV1 when the signal on the clock input node C1 is high.

In the D-latch 1 shown in FIG. 3A, CMOS transmission gates TQ1 and TQ2 are complementarily rendered conductive/non-conductive. When CMOS transmission gate TQ1 is conductive, CMOS transmission gate TQ2 is non-conductive and the signal supplied to the input DI is transmitted to the output DO through the invertors IV1 and IV2. No latching is performed in this state. When CMOS transmission gate TQ1 is nonconductive, on the other hand, CMOS transmission gate TQ2 is rendered conductive and the output signal of the invertor IV2 is fed back to the input of the invertor IV1 to form an invertor latch circuit. In other words, D-latch 1 enters a through-state when the signal on the clock input C1 is low, while D-latch 1 enters a latch state when the signal on the clock input C1 is high.

D-latch 1 shown in FIG. 3A employs eight transistors (each of the invertors IV1 and IV2 employs two transistors). Therefore, the number of components can be remarkably reduced as compared with the conventional structure employing flipflops.

Each of CMOS transmission gates TQ1 and TQ2 may be replaced with a transfer gate formed by a single MOS transistor.

[Second Structure of D-Latch]

Figure 3B:
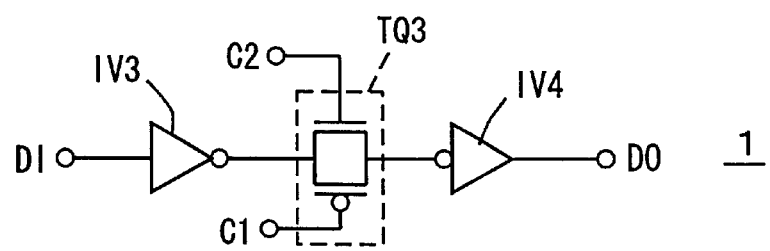

FIG. 3B illustrates another structure of D-latch 1 employed in the present invention. Referring to FIG. 3B, D-latch 1 includes an invertor IV3 inverting a signal on an input DI, a CMOS transmission gate TQ3 coupled to clock inputs C1 and C2 and rendered conductive for passing an output signal of the invertor IV3 when a signal on the clock input C1 is low, and an invertor IV4 inverting the signal transmitted from CMOS transmission gate TQ3 and transmitting the inverted signal to an output DO.

In the D-latch 1 shown in FIG. 3B, invertor IV3 regularly inverts the signal supplied to the input DI. When CMOS transmission gate TQ3 is conductive, the invertors IV3 and IV4 are cascaded to operate as a buffer for transmitting the signal supplied to the input DI to the output DO. When CMOS transmission gate TQ3 is non-conductive, invertors IV3 and IV4 are disconnected. The invertor IV4 inverts the signal on its input, brought into a floating state by the CMOS transmission gate TQ3, and continuously transmits the inverted signal to the output DO.

The dynamic D-latch shown in FIG. 3B employs six transistors, and the number of components can be remarkably reduced. Also in the D-latch shown in FIG. 3B, CMOS transmission gate TQ3 may be replaced with a transfer gate formed by a single MOS transistor.

[Third Structure of D-Latch]

Figure 3C:
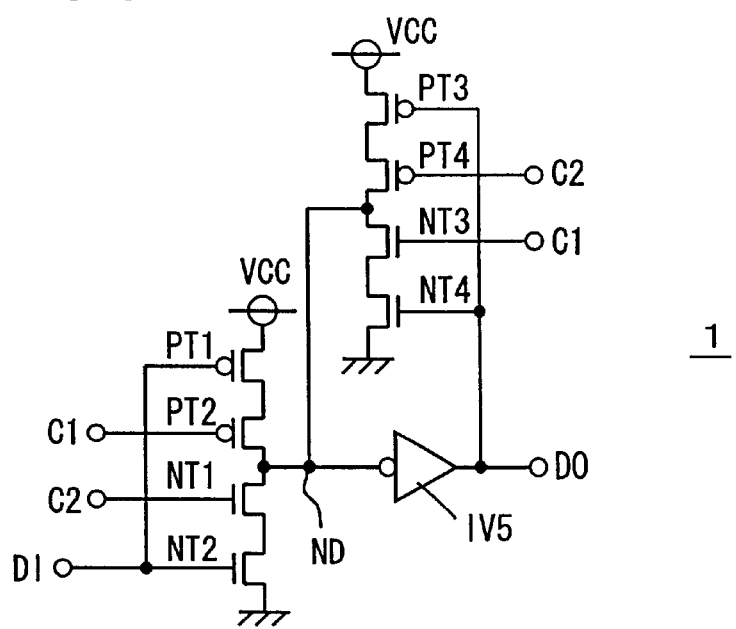

FIG. 3C illustrates still another structure of D-latch 1 employed in the present invention. Referring to FIG. 3C, D-latch 1 includes MOS transistors PT1, PT2, NT1 and NT2 serially connected between a power supply node and a ground node, an invertor IV5 inverting a signal on a node ND and transmitting the inverted signal to an output DO, and MOS transistors PT3, PT4, NT3 and NT4 serially connected between a power supply node and a ground node.

Gates of p-channel MOS transistor PT1 and n-channel MOS transistor NT2 are connected to an input DI. A gate of p-channel MOS transistor PT2 is connected to a clock input C1, and a gate of the n-channel MOS transistor NT1 is coupled to a clock input C2. Gates of p-channel MOS transistor PT3 and n-channel MOS transistor NT4 are connected to the output DO. A gate of p-channel MOS transistor PT4 is connected to the clock input C2, and a gate of n-channel MOS transistor NT3 is connected to the clock input C1. MOS transistors PT1, PT2, NT1 and NT2 form a tri-state invertor, and MOS transistors PT3, PT4, NT3 and NT4 form another tri-state invertor. Drains of MOS transistors PT4 and NT3 are connected to a node ND.

When a signal supplied to the dock input C1 is low, MOS transistors PT2 and NT1 are rendered conductive so that a signal on the input DI is inverted and transmitted to the node ND. MOS transistors PT4 and NT3 are non-conductive at this time, and hence the tri-state invertor formed by MOS transistors PT1, PT2, NT1 and NT2 drive the node ND.

When the signal on the clock input C1 goes high, MOS transistors PT2 and NT1 are rendered non-conductive to disconnect the node ND from the input DI. MOS transistors PT4 and NT3 are rendered conductive so that the signal on the output DO is inverted and transmitted to node ND. In this state, MOS transistors PT3, PT4, NT3 and NT4 and the invertor IV5 form an invertor latch, to latch the signal on the node ND.

The structure shown in FIG. 3C employs 10 transistors, and the number of components is smaller than that of a clock synchronous flip-flop.

In the frequency-dividing circuit shown in FIG. 1, the signal on the node C is expressed as follows:

$$C=[A*B](-1)=[ZC*Z(C(-1))](-1) \quad (A-1)$$

where in X(−n),

X represents the node A, B or C, (−n) indicates that the value of the node X precedent by n cycles is to be operated, (−1) indicates that a signal precedent by one cycle is to be operated, and (−0.5) indicates that a signal precedent by half a cycle is to be operated;

* represents AND operation, and

Z represents logical inversion.

The equation (A-1) indicates that a signal obtained by ANDing the signals on nodes A and B is transmitted to node C with a delay of one cycle. The signal on node A is obtained by inverting the signal on node C, and the signal on node B is obtained by delaying the signal on node A by one cycle. Hence, the above equation (A-1) is obtained.

[First Modification]

Figure 4A:
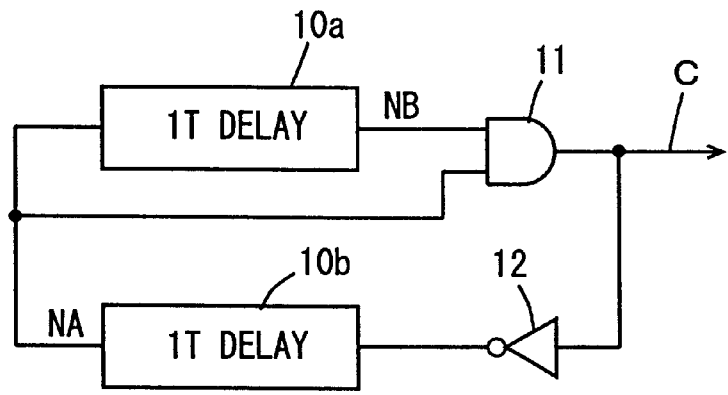
FIG. 4A illustrates a first modification of the frequency-dividing circuit shown in FIG. 1, FIG. 4B schematically illustrates the structure of a 1T delay circuit shown in FIG. 4A.

FIG. 4A illustrates a first modification of the frequency-dividing circuit shown in FIG. 1. Referring to FIG. 4A, the frequency-dividing circuit includes 1T delay circuits 10a and 10b each delaying a supplied signal by a cycle T of an input signal IN, an AND circuit 11 receiving output signals from 1T delay circuits 10a and 10b and an invertor circuit 12 inverting an output signal of AND circuit 11 and supplying the inverted signal to 1T delay circuit 10b. The output signal of 1T delay circuit 10b is also supplied to an input of 1T delay circuit 10a. AND circuit 11 outputs a frequency-divided signal.

Figure 4B:
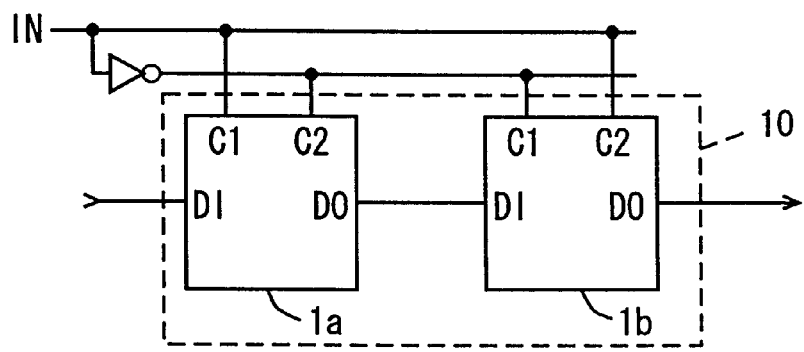
FIG. 4C is a timing chart representing operations of the frequency-dividing circuit shown in FIG. 4A.
Figure 4C:
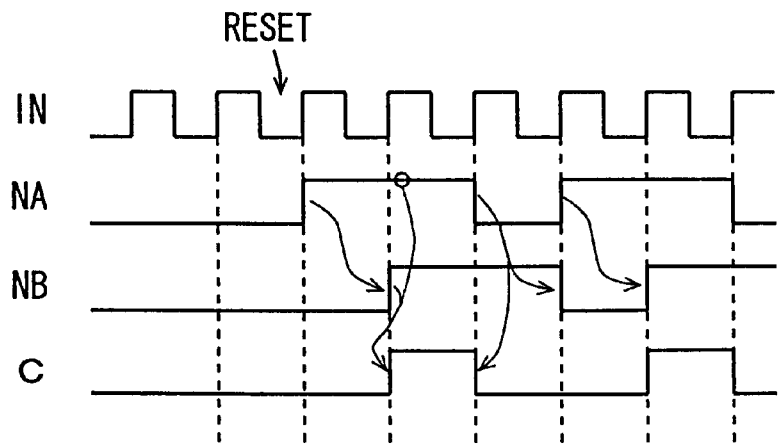

FIG. 4B schematically illustrates the structure of each of 1T delay circuits 10a and 10b shown in FIG. 4A. Referring to FIG. 4B, 1T delay circuit 10 includes a D-latch la taking in and latching a supplied signal in synchronization with fall and rise of an input signal IN respectively, and a D-latch 1b taking in and latching a supplied signal in synchronization with rise and fall of the input signal IN. 1T delay circuit 10 includes two cascaded D-latches, for delaying a supplied signal by one cycle of the input signal IN through a transfer operation and outputs the delayed signal. Operations of the frequency-dividing circuit shown in FIG. 4A are now described with reference to a timing chart shown in FIG. 4C.

In a reset state, output signals from nodes NA and NB are low and a signal on node C is also low. Therefore, the output signal of invertor 12 goes high. When one clock cycle period elapses, the output signal of invertor 12 is transmitted to node NA through the 1T delay circuit 10b, and the signal on node NA rises to a high level. At this time, the signal on node NB is still low and hence the output signal of node C remains low.

When another one cycle elapses, the signal transmitted from 1T delay circuit 10a to node NB goes high and the signal transmitted from AND circuit 11 to node C rises to a high level. The output signal of invertor 12 changes to a low level in response to the rise of the signal on the node C.

When still another one dock cycle elapses, the output signal of 1T delay circuit 10b goes low, and the signal transmitted from AND circuit 11 to node C responsively goes low while the output signal of the invertor 12 goes high. In a next cycle, the output signal of 1T delay circuit 10a goes low while the output signal of 1T delay circuit 10b goes high due to the output signal of invertor 12. Thereafter these operations are repeated.

Also in the structure shown in FIG. 4A, the signal from node C changes in a cycle corresponding to three cycles of the input signal IN, and a signal frequency-divided by 3 can be obtained.

The frequency-dividing circuit shown in FIG. 4A is equivalent to a structure taking in the frequency-divided signal from node BA in the frequency-dividing circuit shown in FIG. 1. Therefore, the signal on node C satisfies the following equation:

$$C=ZC(-1)*ZC(-2)$$

The circuit shown in FIG. 4A is equivalent to the frequency-dividing circuit shown in FIG. 1. While the frequency-dividing circuit shown in FIG. 1 delays the AND signal of the signals on nodes A and B by one cycle of the input signal, this is equivalent to an operation of ANDing a signal A(−1) on node A precedent by one cycle and a signal B(−1) on node B precedent by one cycle. Hence, the following equation is obtained:

$$C=A(-1)*B(-1)=ZC(-1)*ZC(-2) \quad (A-2)$$

[Second Modification]

Figure 5A:
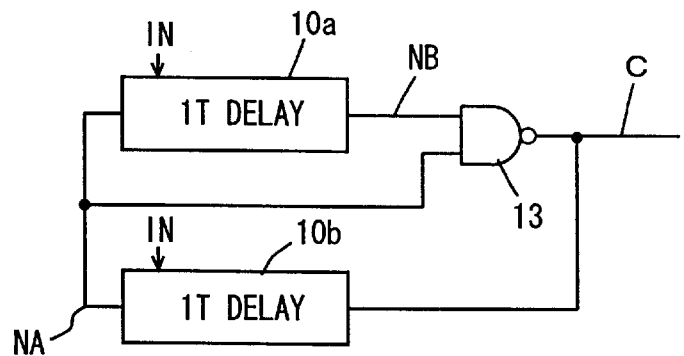
FIG. 5A illustrates a second modification of the frequency-dividing circuit shown in FIG. 1.

FIG. 5A illustrates a second modification of the frequency-dividing circuit shown in FIG. 1. Referring to FIG. 5A, the frequency-dividing circuit includes a NAND circuit 13 NANDing output signals of 1T delay circuits 10a and 10b. NAND circuit 13 outputs a frequency-divided signal to a node C. The output signal of the NAND circuit 13 is supplied to an input of the 1T delay circuit 10b. Operations of the frequency-dividing circuit shown in FIG. 5A are now described with reference to FIG. 5B.

In an initial state (reset state), signals on nodes NA and NB are low, and a signal on node C is high. When an input signal IN rises to a high level, the output signal of 1T delay circuit 10b rises to a high level in accordance with the signal on node C (the high-level signal on node C is taken in when the input signal IN is low). The signal on node NB remains low although the voltage of node NA rises to a high level, and hence the signal on node C remains high.

When the input signal IN rises to the high level next, the signal on node NA is transmitted to node NB, the signal on node NB goes high, and the signal on the node C responsively falls to a low level through NAND circuit 13. At this time, 1T delay circuit 10b is in the latch state on the rising edge of the input signal IN, and hence the signal on the node NA remains high.

When the input signal IN rises to the high level next, the low-level signal on node C is transmitted to node NA, and the voltage at node C rises to a high level through NAND circuit 13. At this time, the low-level signal of node NA is not yet transmitted to node NB, which in turn remains high.

When the input signal IN rises to the high level next, the low-level signal on node NA is transmitted to node NB, the voltage of which goes low. On the other hand, node NA returns to the high level since node C is high in the precedent cycle.

In the frequency-dividing circuit shown in FIG. 5A, the frequency-divided signal from the node C is low for one cycle period and is high for two cycle periods. In other words, this signal is an inverted signal of the frequency-divided signal shown in FIG. 1 or FIGS. 4A to 4C. Also in the structure shown in FIG. 5A, the frequency-divided signal output from node C has a cycle corresponding to three cycles of the input signal IN. The relation of the frequency-divided signal in the frequency-dividing circuit shown in FIG. 5A is expressed as follows:

$$C=Z[C(-1)*C(-2)] \quad (A-3)$$

[Third Modification]

Figure 6A:
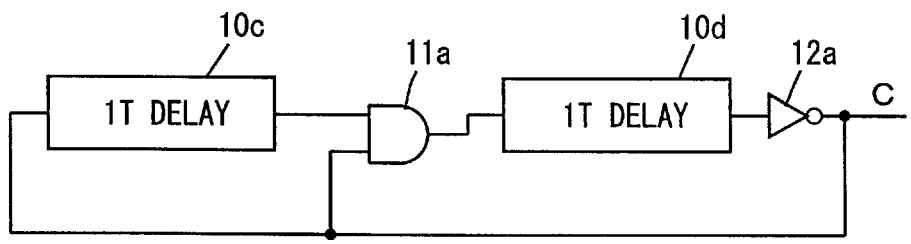
FIGS. 6A and 6B illustrate further modifications of the frequency-dividing circuit shown in FIG. 1 respectively.

FIG. 6A illustrates a third modification of the frequency-dividing circuit. Referring to FIG. 6A, the frequency-dividing circuit includes a 1T delay circuit 10c delaying a signal on a node C by one cycle period of an input signal, an AND circuit 11a ANDing the signal on node C and an output signal of a 1T delay circuit 10d, the 1T delay circuit 10d delaying an output signal of AND circuit 11a by one cycle period, and an invertor 12a inverting an output signal of 1T delay circuit 10c and transmitting the inverted signal to node C.

The frequency-dividing circuit shown in FIG. 6A is different from that shown in FIG. 1 only in the position of the invertor 12a. When the frequency-dividing circuit shown in FIG. 6A is employed, therefore, a frequency-divided signal having a waveform similar to that shown in FIG. 5B can be obtained. The signal on node C of the frequency-dividing circuit shown in FIG. 6A satisfies the following relation:

$$C=Z[\{C*C(-1)\}(-1)] \quad (A-4)$$

[Fourth Modification]

Figure 6B:
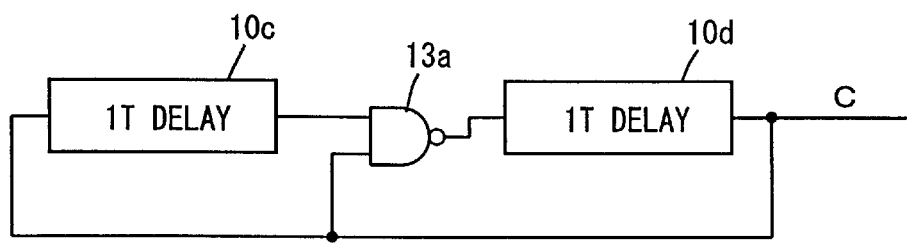

FIG. 6B illustrates a fourth modification of the frequency-dividing circuit shown in FIG. 1. The frequency-dividing circuit shown in FIG. 6B is equivalent to a structure obtained by moving the invertor 12a to an input part of 1T delay circuit 10d in the frequency-dividing circuit shown in FIG. 6A. Also in the frequency-dividing circuit shown in FIG. 6B, a node C outputs a signal frequency-divided by a frequency division ratio of 1/3. The signal appearing on node C of the frequency-dividing circuit shown in FIG. 6B is expressed as follows:

$$C=Z[C*C(-1)](-1) \quad (A-5)$$

By transforming the equation (A-3), the following equation is obtained:

$$C=Z[C(-1)*C(-2)]=ZC(-1)+ZC(-2) \quad (A-6)$$

Figure 5B:
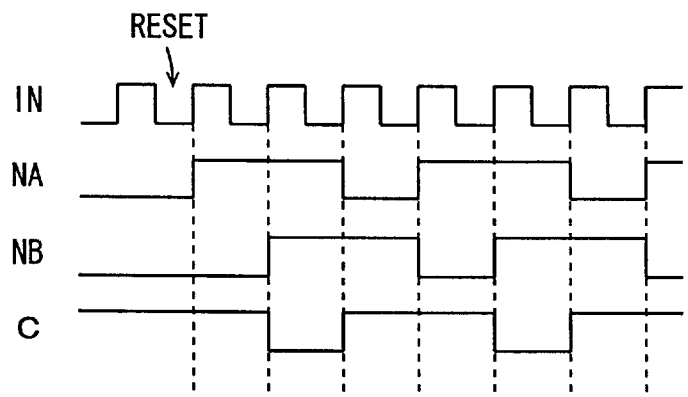
FIG. 5B is a timing chart showing operations of the frequency-dividing circuit shown in FIG. 5A.

In a structure employing an OR circuit and an invertor shown in the equation A-6, a waveform having the logic levels of the signal waveform diagram shown in FIG. 5B inverted is obtained. Also in this case, therefore, a signal is obtained by frequency dividing an input signal IN by a frequency division ratio of 1/3.

Any of the aforementioned structures may be employed. A frequency-dividing circuit having a frequency division ratio of 1/3 can be readily implemented with two 1T delay circuits by simply modifying the structure of an interposed logic circuit.

In the basic structure, the frequency-dividing circuit ANDs signals out of phase by one cycle period and further delays the ANDed signal by one cycle to generate a frequency-divided signal.

A frequency-dividing circuit having an arbitrary frequency division ratio can be readily implemented by utilizing the aforementioned basic structure.

[First Embodiment]

FIG. 7A illustrates the structure of a frequency-dividing circuit according to a first embodiment of the present invention. The frequency-dividing circuit shown in FIG. 7A is different in structure from that shown in FIG. 1 in the following points: The frequency-dividing circuit shown in FIG. 7A further includes a D-latch 1-x delaying a signal on a node C by half a cycle of an input signal IN and transmitting the delayed signal to a node CD, a NOR circuit 4 receiving the output signals of D-latch 1-x and the node C, and an invertor 2-d inverting an output signal of NOR circuit 4 and outputting a frequency-divided signal OUT. D-latch 1-x enters a throughstate when the input signal IN is low, and enters a latch state when the input signal IN is high. In other words, D-latch 1-x transmits a high-level signal on node C to node CD with a delay of half a cycle of the input signal IN. Operations of the frequency-dividing circuit shown in FIG. 7A are now described with reference to a timing chart shown in FIG. 7B.

Signal change on nodes A, B and C is identical to that in the frequency-dividing circuit shown in FIG. 1, and a signal obtained by dividing the input signal IN in a frequency division ratio of 1/3 appears. A signal at a high level for one cycle period of the input signal IN and at a low level for two cycle periods is transmitted to node C. A signal rising to a high level with a delay of half a cycle to the signal on node C is transmitted to node CD. The combination of NOR circuit 4 and invertor 2-d operates as an OR circuit. Therefore, a signal at a high level while both of the signals on nodes C and CD are high is output as an output signal OUT. This output signal OUT maintains high for first 1.5 cycle periods of the input signal IN and is low for second 1.5 cycle periods. This output signal OUT has a cycle of three times that of the input signal IN. Therefore, a 1/3 frequency-divided signal having a duty ratio of 50% can be obtained. By employing the signal having the duty ratio of 50%, an internal circuit can be efficiently driven at a high speed in accordance with the frequency-divided signal. The output signal OUT satisfies the following relation for the signal on the node C:

$$OUT=C+C(-1.5) \quad (B-1)$$

In the frequency-dividing circuit shown in FIG. 7A, the output signal OUT is delayed with respect to the input signal IN by a delay time in D-latch 1-x, NOR circuit 4 and invertor 2-d, and therefore the output delay of the frequency-divided signal with respect to the input signal IN can be sufficiently reduced.

[First Modification]

Figure 8A:
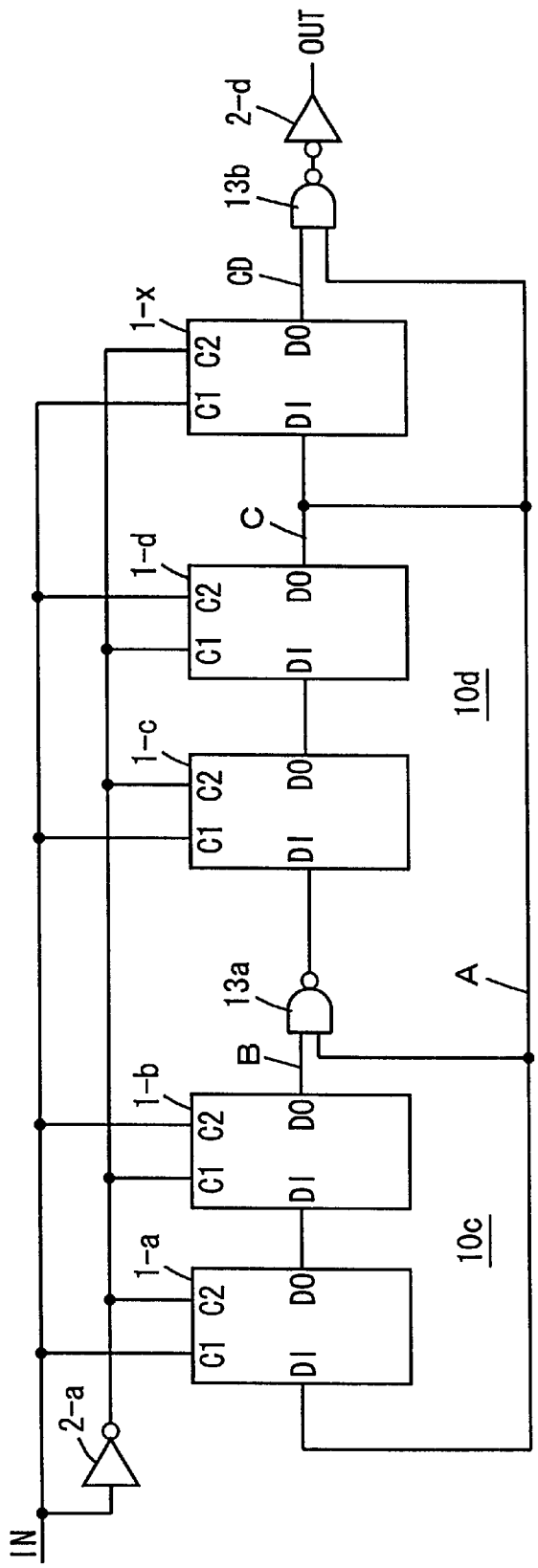
FIG. 8A illustrates the structure of a first modification of the frequency-dividing circuit according to the first embodiment of the present invention.
Figure 8B:
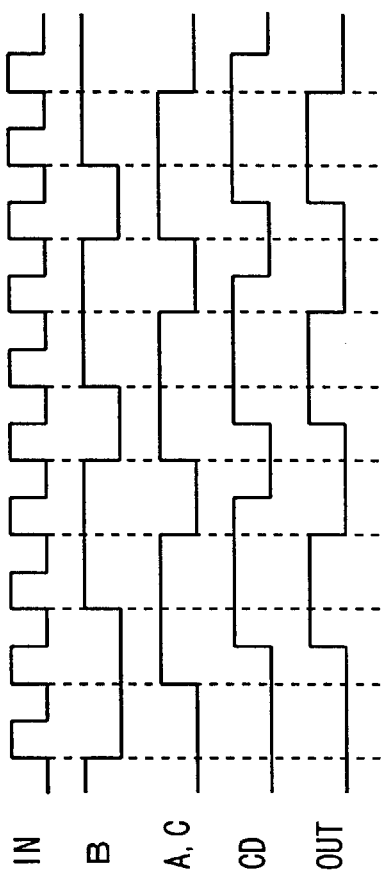
FIG. 8B is a timing chart representing operations of the frequency-dividing circuit shown in FIG. 8A.

FIG. 8A illustrates the structure of a first modification of the frequency-dividing circuit according to the first embodiment of the present invention. The frequency-dividing circuit shown in FIG. 8A is different in structure from that shown in FIG. 6B in the following points: The frequency-dividing circuit further includes a D-latch 1-x for delaying a signal on a node C by half a cycle of an input signal IN, a NAND circuit 13b receiving an output signal of D-latch 1-x and the signal of node C, and an invertor 2-*d* receiving an output signal of NAND circuit 13*b*. D-latches 1-*a* and 1-*b* correspond to 1T delay circuit 10*c* shown in FIG. 6B, and D-latches 1-*c* and 1-*d* correspond to 1T delay circuit 10*d* shown in FIG. 6B. Operations of the frequency-dividing circuit shown in FIG. 8A are now described with reference to a timing chart shown in FIG. 8B.

When a signal on a node B changes to a low level, an output signal of a NAND circuit 13*a* goes low. The output signal of NAND circuit 13*a* is delayed by one cycle and transmitted to node C. The signal on node C is delayed by half a cycle of the input signal IN and transmitted to a node CD. The nodes C and A exhibit the same signal change. The signal on node B changes with a delay of one cycle of the input signal with respect to the signal on node A. When the voltage of node B changes to a low level and the output signal of NAND circuit 13*a* goes high, the signals on nodes A and C go high after a lapse of one cycle. After a lapse of another one cycle, the voltage of the node B rises to a high level. The output signal of NAND circuit 13*a* responsively goes low, and the voltages of nodes A and C change to low levels after a lapse of one clock cycle.

Therefore, the signals on nodes A and C maintain high for two cycle periods of the input signal IN, and maintain low for one cycle period. NAND circuit 13*b* and invertor 2-*d* form an AND circuit. Therefore, the output signal OUT maintains high while both of the signals on nodes C and CD are high. The signal on node CD goes high with a delay of half a cycle to the signal on node C, and falls to a low level with a delay of half a cycle. Therefore, the output signal OUT is high for 1.5 cycle periods of the input signal IN and is low for 1.5 cycle periods. In other words, the duty ratio of the output signal OUT is 50%.

In the frequency-dividing circuit shown in FIG. 8A, the output signal OUT goes high in response to fall of the input signal IN and retards to the input signal IN by a phase difference of half a cycle. However, the output signal OUT can be changed in synchronization with rise of the input signal IN by inverting the polarity of the input signal IN for D-latches 1-*a* to 1-*d* and 1-*x* (exchanging clock input nodes). The output signal OUT can also be changed in synchronization with rise of the input signal IN by removing invertor 2-*d* and outputting the output signal of NAND circuit 13*b*.

A structure employing a single-stage D-latch and an OR circuit for duty control can be utilized when the frequency-divided signal is high for one cycle period of the input signal, while a combination of D-latch 1-*x* and the AND circuit is utilized when the frequency-divided signal is high for two cycle periods of the input signal IN. Thus, a 1/3 frequency-divided signal having a duty ratio of 50% can be obtained.

The structure of this frequency-dividing circuit is also applicable to the aforementioned circuits shown in FIGS. 4A and 5A.

Also in the structure shown in FIG. 8A, an output stage is formed by a single-stage D-latch, NAND circuit 13*a* and invertor 2-*d*, and the delay for the input signal IN can be sufficiently reduced.

[Second Modification]

FIG. 9 schematically illustrates the structure of a second modification of the frequency-dividing circuit according to the first embodiment of the present invention. Referring to FIG. 9, buffer circuits are inserted between D-latches. A buffer circuit 16*a* receiving an output signal of an invertor 2*c* is arranged at an input of a D-latch 1-*a*, and a buffer circuit 16*b* is arranged between the D-latch 1-*a* and a D-latch 1*b*. A buffer circuit 16*c* is arranged between D-latches 1-*c* and 1-*d*, and a buffer circuit 16*d* is arranged at an output part of the D-latch 1-*d*. The remaining structure is identical to that shown in FIG. 7A, and corresponding parts are denoted by the same reference numerals.

D-latches 1-*a* to 1-*d* and 1-*x* transfer and latch supplied signals in accordance with an input signal IN. When change of the input signal IN causes a racing with the signals supplied to inputs DI of D-latches 1-*a* to 1*d* and 1-*x*, the signals cannot be correctly taken in and latched and correct frequency division cannot be performed. The buffer circuits 16*a* to 16*d* are provided for adjusting the time periods for transferring the signals between the D-latches and preventing the input signal IN from racing with the signals supplied to the inputs DI of the D-latches. Even if the input signal IN is a high-speed clock signal, a frequency-divided signal having a frequency division ratio of 1/3 can be correctly generated.

According to the first embodiment of the present invention, as hereinabove described, the frequency-dividing circuit is formed by D-latches, whereby the number of components of the frequency-dividing circuit is reduced and a frequency-dividing circuit having a small occupying area can be implemented. Further, a frequency-divided signal having a duty ratio of 50% can be correctly generated by employing a D-latch and an OR circuit or an AND circuit for an output stage.

[Second Embodiment]

Figure 10A:
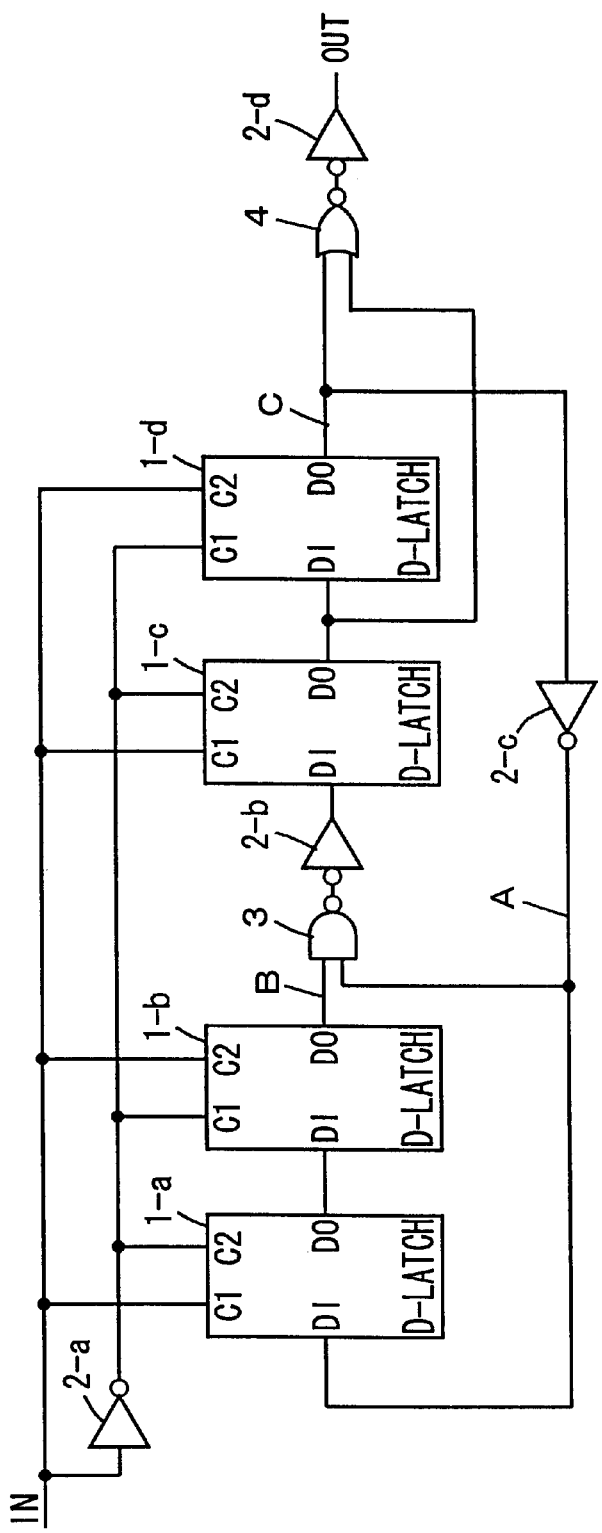
FIG. 10A illustrates the structure of a frequency-dividing circuit according to a second embodiment of the present invention.

FIG. 10A illustrates the structure of a frequency-dividing circuit according to a second embodiment of the present invention. The frequency-dividing circuit shown in FIG. 10A is different from that shown in FIG. 1 in the following point: The frequency-dividing circuit includes a NOR circuit 4 receiving output signals from D-latches 1-*c* and 1-*d* and an invertor 2-*d* inverting an output signal of NOR circuit 4 and generating a frequency-divided signal OUT.

D-latch 1-*d* enters a through-state when an input signal IN goes high, while the D-latch 1-*c* enters a through-state when the input signal IN goes low.

Figure 10B:
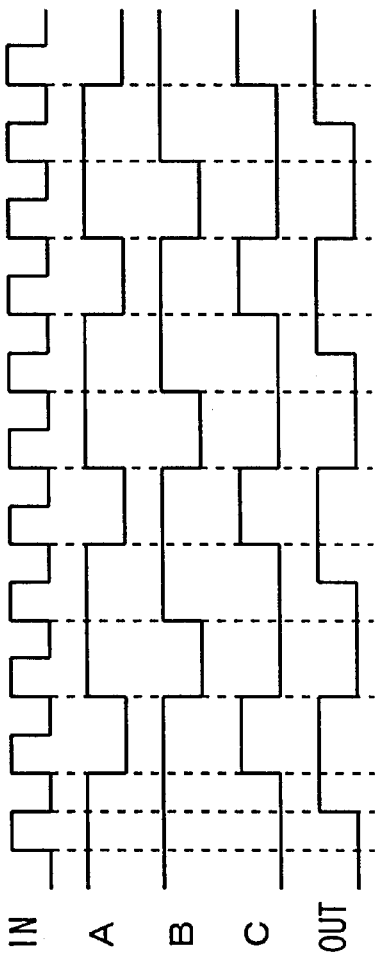
FIG. 10B is a timing chart representing operations of the frequency-dividing circuit shown in FIG. 10A.

As shown in a signal waveform diagram of FIG. 10B, when a signal on a node C rises to a high level in response to rise of the input signal IN the output signal of the D-latch 1-*c* goes high precedently to the output signal from the node C by half a cycle. By ORing the output signals of D-latches 1-*c* and 1-*d* by NOR circuit 4 and invertor 2-*d*, the output signal OUT goes high precedently to the signal on node C by half a cycle of the input signal IN, and goes low when the signal on node C goes low. In other words, the output signal OUT is high for 1.5 cycle periods of the input signal IN and is low for 1.5 cycle periods.

According to the structure shown in FIG. 10A, a 1/3 frequency-divided signal having a duty ratio of 50% can be generated without providing an additional D-latch in the frequency-dividing circuit. Also in the structure shown in FIG. 10A, the polarity of the input signal IN supplied to clock inputs C1 and C2 of the D-latches 1-*a* to 1-*d* may be inverted in order to set the frequency-divided signal OUT high in response to rise of the input signal IN.

[Modification]

FIG. 11A illustrates the structure of a modification of the frequency-dividing circuit according to the second embodiment of the present invention. The structure shown in FIG. 11A is different from that shown in FIG. 8A in the following points: The frequency-dividing circuit does not include D-latch 1-*x*. NAND circuit 13*b* receives output signals from D-latches 1-*c* and 1-*d*.

In the structure of the frequency-dividing circuit shown in FIG. 11A, signals on nodes A and C maintain high for two cycle periods in accordance with rise of an input signal IN and maintain low for one cycle in response to rise of the input signal IN again, as shown in a timing chart of FIG. 11B. A signal on a node B retards to the signal on node A by one cycle period. An output signal of D-latch 1-c has a lead in phase on the signal on the node C by half a cycle of the input signal IN. By ANDing the output signals of D-latches 1-c and 1-d by NAND circuit 13b and an invertor 2-d, an output signal OUT maintains high for 1.5 cycle periods in response to rise of the input signal IN and maintains low for 1.5 cycle periods in response to fall of the input signal IN. Thus, the output signal OUT is a signal having a duty ratio of 50% obtained by frequency-dividing the input signal IN in a frequency division ratio of 1/3.

The frequency-dividing circuit shown in FIG. 11A requires no additional D-latch for controlling the duty ratio. The frequency-dividing circuit simply requires a logic circuit of the NAND circuit and the invertor, and the circuit structure is simplified. The frequency-divided signal is delayed by the delay times in NAND circuit 13b and invertor 2-d and D-latches 1-c and 1-d (the D-latches enter through-states to change the output signal), and the delay time of the frequency-divided signal with respect to the input signal IN can be sufficiently reduced.

The frequency-divided signal OUT in the second embodiment can be expressed as follows:

$$\text{OUT}=C+C(0.5) \tag{B-2}$$

$$\text{OUT}=C*C(0.5) \tag{B-3}$$

The equation B-2 stands for the case of employing an OR circuit as the logic circuit, and the equation B-3 stands for the case of employing an AND circuit as the logic circuit.

Also in the second embodiment, buffers may be inserted between the D-latches as shown in FIG. 9, for preventing racing.

According to the second embodiment of the present invention, as hereinabove described, the frequency-divided signal is generated by ORing/ANDing the signals, which are out of phase from each other by half a cycle, from the D-latches generating the frequency-divided signal, whereby a frequency-divided signal having a duty ratio of 50% can be correctly generated.

Also in the second embodiment, the structure generating the frequency-divided signal on node C may be prepared from any of the circuits shown in FIGS. 1 to 9.

[Third Embodiment]

Figure 12A:
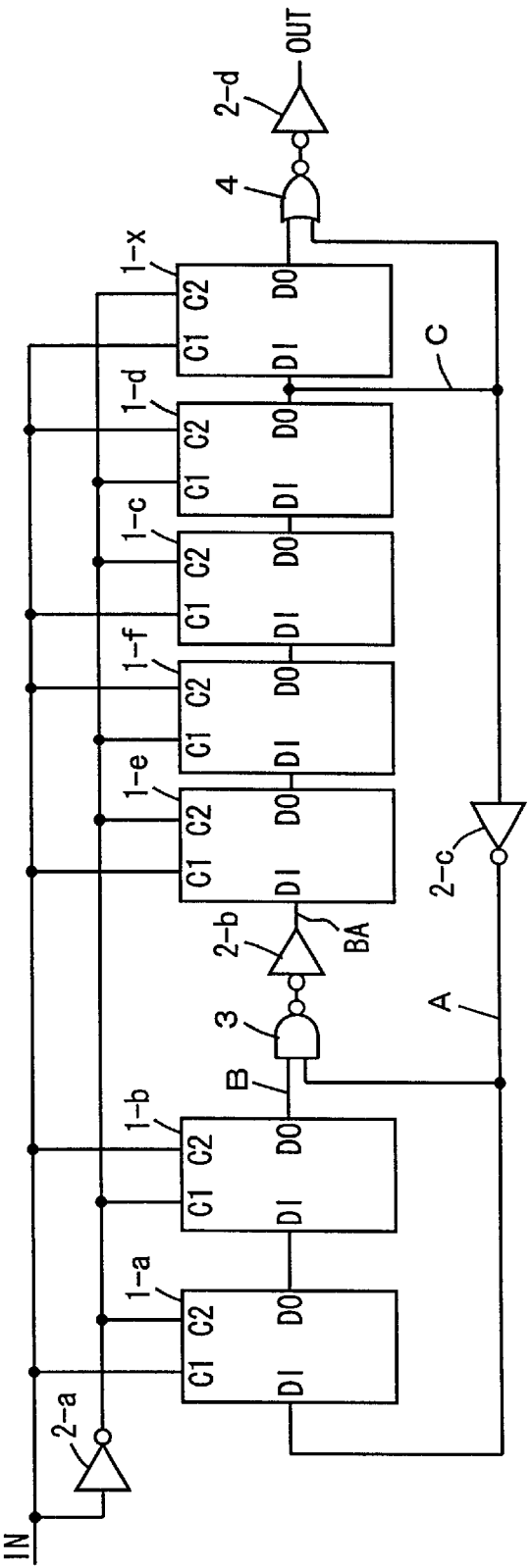
FIG. 12A illustrates the structure of a frequency-dividing circuit according to a third embodiment of the present invention.

FIG. 12A schematically illustrates the structure of a frequency-dividing circuit according to a third embodiment of the present invention. Referring to FIG. 12A, two stages of D-latches 1-e and 1f are inserted between an invertor 2-b and a D-latch 1-c, in addition to a structure similar to that shown in FIG. 9. The remaining structure is identical to that shown in FIG. 9, and corresponding parts are denoted by the same reference numerals while detailed description thereof is not repeated.

Figure 12B:
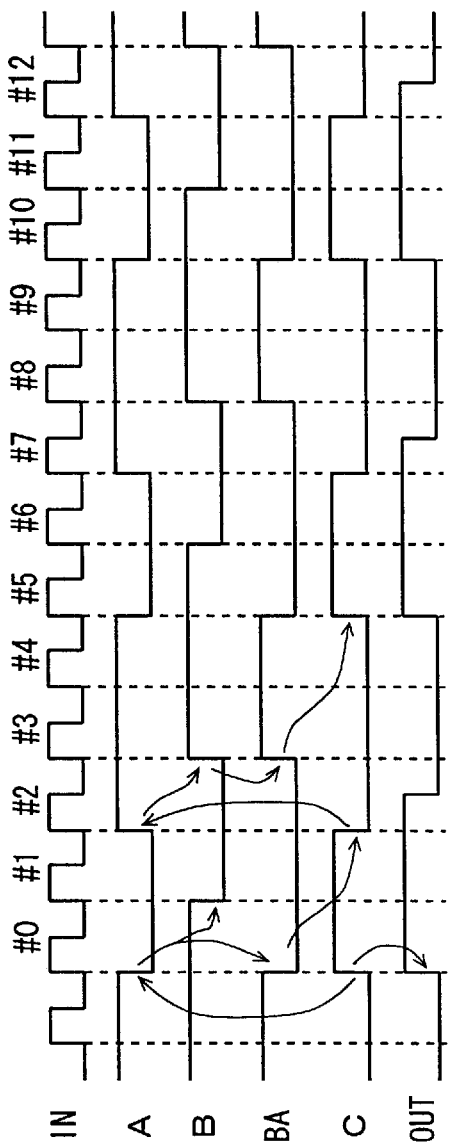
FIG. 12B is a timing chart representing operations of the frequency-dividing circuit shown in FIG. 12A.

In the frequency-dividing circuit shown in FIG. 12A, four stages of D-latches 1e, 1f, 1-c and 1-d are connected between nodes BA and C. Therefore, a signal on node BA is transmitted to node C after a lapse of two cycles of an input signal IN. Operations of the frequency-dividing circuit shown in FIG. 12A are now described with reference to a timing chart shown in FIG. 12B.

Assume that both of signals on nodes A and B are high. In this state, the signal on node C is low.

When the signal on node C rises to a high level in a cycle #0, the signal on node A falls to a low level and the signal on node BA responsively falls to a low level. The low-level signal on the node A is transmitted to node C after a lapse of two cycles. Therefore, the signal on node C maintains high during the cycle #0 and a cycle #1. On the other hand, the signal on the node A is transmitted to node B with a delay of one cycle. Therefore, the signal on node B falls to a low level in the cycle #1. NAND circuit 3 and an invertor 2-b form an AND circuit, and the signal on node BA is low while either one of the signals on the nodes A and B is low. Therefore, the signal on node BA is low during the cycle #0 and a cycle #2. The signal on node BA is transmitted to node C with a delay of two cycles, and hence the signal on node C is low during the cycle #2 and a cycle #4 if the signal on node BA remains low during the cycles #0 and #2. When the signal on node C falls to a low level in the cycle #2, the signal on node A goes high and the signal on node B goes high in a cycle #3 after a lapse of one cycle.

In the frequency-dividing circuit shown in FIG. 12A, therefore, a signal kept high continuously for two cycles and then kept low continuously for three cycles appears on node C. In other words, a signal changing every five cycles of the input signal IN is transmitted to node C. That is, a signal obtained by frequency-dividing the input signal IN at a frequency division ratio of 1/5 is transmitted to node C.

NOR circuit 4 and invertor 2-d form an OR circuit. NOR circuit 4 receives output signals of D-latches 1-d and 1-x. Therefore, an output signal OUT goes low after a lapse of half a cycle after the signal on node C falls to a low level. Thus, the frequency-divided signal OUT has a highlevel period of 2.5 cycles of the input signal IN and a low-level period of 2.5 cycle periods of the input signal IN, and a 1/5 frequency-divided signal having a duty ratio of 50% is obtained.

In other words, a 1/3 frequency-dividing circuit can be readily extended to a 1/5 frequency-dividing circuit by simply increasing the delay time between invertor 2-b and node C by one cycle of the input signal IN. The signal on node C of the frequency-dividing circuit shown in FIG. 12A is expressed as follows:

$$C=[A*B](-2)=[ZC*ZC(-1)](-2) \tag{C-1}$$

The output signal OUT is expressed in the previous equation (B-1).

[First Modification]

Figure 13A:
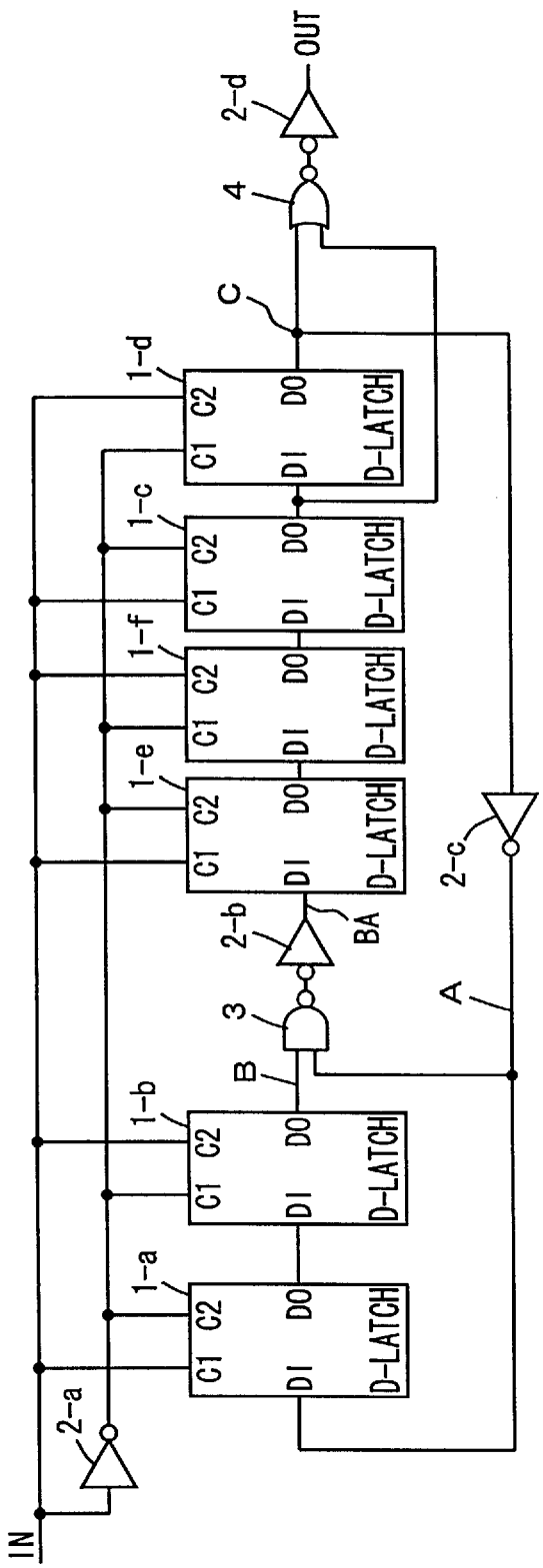
FIG. 13A illustrates the structure of a first modification of the frequency-dividing circuit according to the third embodiment of the present invention.

FIG. 13A illustrates the structure of a first modification of the frequency-dividing circuit according to the third embodiment of the present invention. In the frequency-dividing circuit shown in FIG. 13A, two stages of cascades D-latches 1-e and 1f are inserted between an invertor 2-b and a D-latch 1-c, in addition to a structure similar to that of the frequency-dividing circuit shown in FIG. 10A. The remaining structure is identical to that shown in FIG. 10A, and corresponding parts are denoted by the same reference numerals while detailed description thereof is not repeated.

Figure 13B:
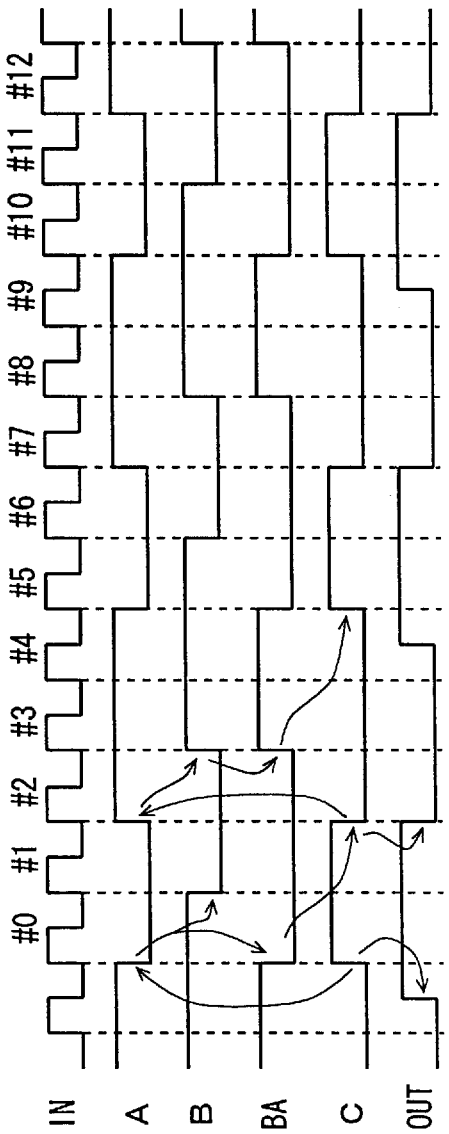
FIG. 13B is a timing chart representing operations of the frequency-dividing circuit shown in FIG. 13A.

In the frequency-dividing circuit shown in FIG. 13A, a NOR circuit 4 receives a signal on a node C and a signal having a lead in phase on the signal on node C by half a cycle, i.e., an output signal of D-latch 1-c, dissimilarly to the frequency-dividing circuit shown in FIG. 12A. As shown in a timing chart of FIG. 13B, the signal on node C is frequency-divided at a frequency division ratio of 1/5 to be high for two cycle periods and to be low for three cycle periods, and an output signal OUT precedes in phase the signal on the node by half a cycle of an input signal IN. Therefore, the output signal OUT has a high-level period of 2.5 cycles and a low-level period of 2.5 cycles, with a duty ratio of 50%.

The output signal OUT can be expressed in the above equation (B-2).

[Second Modification]

Figure 14A:
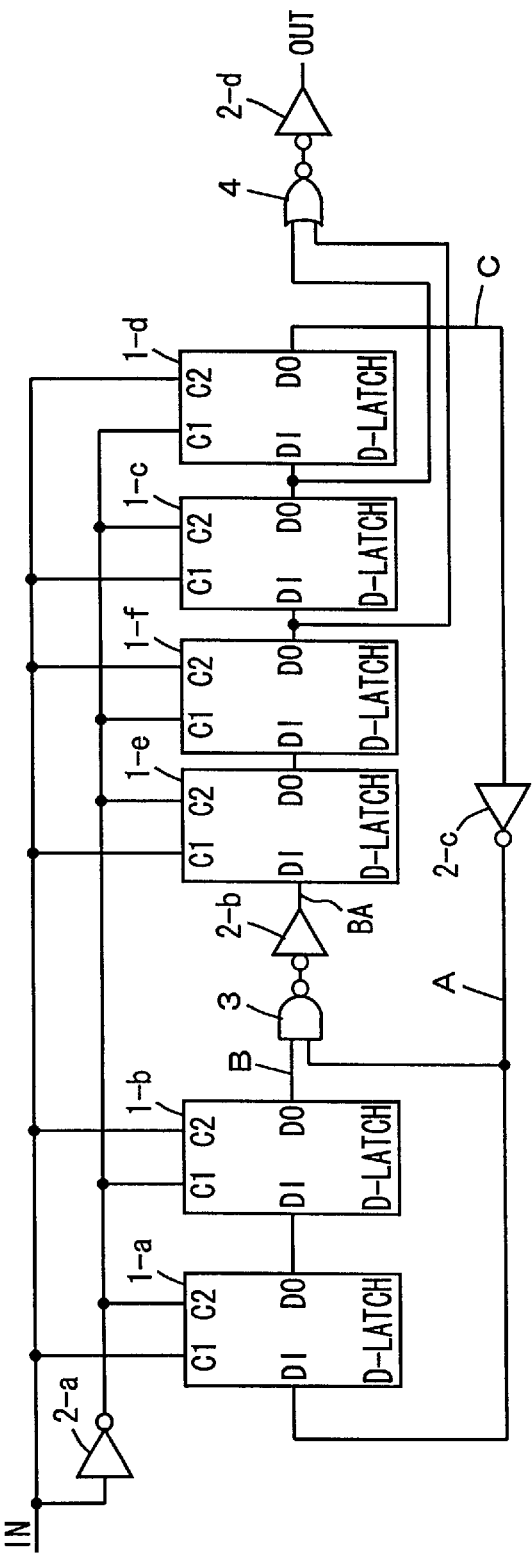
FIG. 14A illustrates the structure of a second modification of the frequency-dividing circuit according to the third embodiment of the present invention.

FIG. 14A schematically illustrates the structure of a second modification of the frequency-dividing circuit according to the third embodiment of the present invention. The frequency-dividing circuit shown in FIG. 14A is different from that shown in FIG. 13A in the following point: A NOR circuit 4 receives output signals from D-latches 1f and 1-c. The remaining structure is identical to that shown in FIG. 13A, and corresponding parts are denoted by the same reference numerals while a detailed description thereof is not repeated.

Figure 14B:
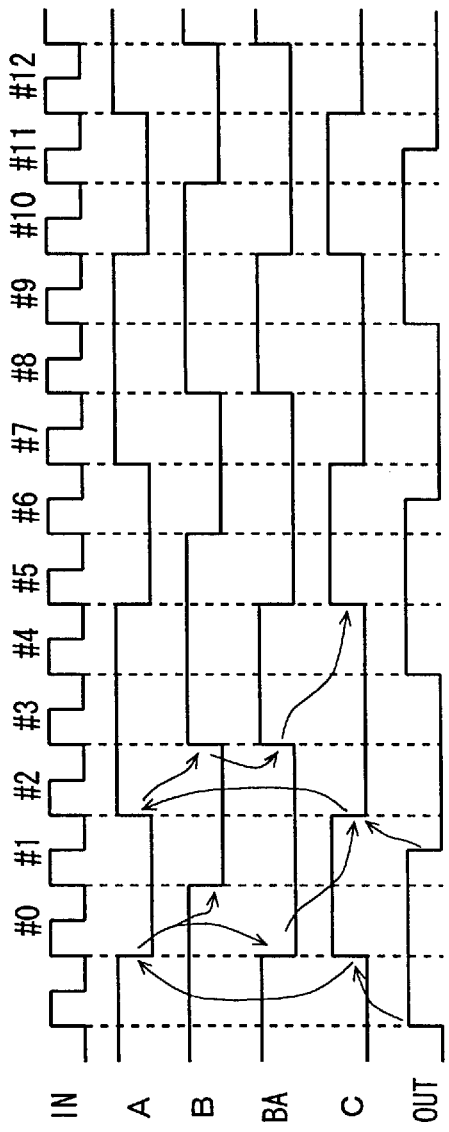
FIG. 14B is a timing chart representing operations of the frequency-dividing circuit shown in FIG. 14A.

The output signal of D-latch 1f has a lead in phase on a signal on a node C by a phase difference of half a cycle of an input signal IN. On the other hand, the output signal of the D-latch 1-c precedes in phase the signal on the node C by a phase difference of half a cycle. As shown in FIG. 14B, therefore, an output signal OUT rises to a high level precedently to the signal on node C by one cycle, and falls to a low level precedently to the signal on node C by half a cycle. In other words, the output signal OUT is high for 2.5 cycle periods of the input signal IN, and is low for 2.5 cycle periods. Thus, a 1/5 frequency-divided signal having a duty ratio of 50% is obtained.

In this case, the output signal OUT is expressed as follows:

$$OUT=C(0.5)+C(1)=C+C(0.5)$$

This is because the phase relation with respect to the input signal IN returns when the signal phase lead is one cycle of the input signal IN.

[Third Modification]

FIG. 15A illustrates the structure of a third modification of the frequency-dividing circuit according to the third embodiment of the present invention. In the structure shown in FIG. 15A, a NOR circuit 4 receives output signals from D-latches 1e and 1f. The remaining structure is identical to that shown in FIG. 13A or 14A.

In the frequency-dividing circuit shown in FIG. 15A, the output signal of D-latch 1-e leads a signal on a node C by a phase difference of 1.5 cycles, as shown in FIG. 15B. On the other hand, the output signal of D-latch 1f precedes in phase the signal on the node C by a phase difference of one cycle period of an input signal IN. Therefore, an output signal OUT rises to a high level precedently to the signal on the node C by 1.5 cycles and falls to a low level precedently to the signal on the node C by one cycle period. Thus, the output signal OUT is a 1/5 frequency-divided signal having a high-level period of 2.5 cycles, a low-level period of 2.5 cycles and a duty ratio of 50%. In this case, the output signal OUT is expressed as follows:

$$OUT=C(1)+C(1.5)=C+C(0.5)$$

[Fourth Modification]

FIG. 16A illustrates the structure of a fourth modification of the frequency-dividing circuit according to the third embodiment of the present invention. In the structure shown in FIG. 16A, a NOR circuit 4 receives output signals of an invertor 2-b and a D-latch 1-e. The remaining structure is identical to those shown in FIGS. 13A, 14A and 15A.

In the frequency-dividing circuit shown in FIG. 16A, an output signal OUT rises to a high level when a signal on a node BA goes high, as shown in FIG. 16B. The output signal OUT falls to a low level after a lapse of half a cycle of an input signal IN after the signal on node BA falls to a low level. The signal on node BA is high for two cycle periods of the input signal IN. Therefore, the output signal OUT has a high-level period of 2.5 cycles, a low-level period of 2.5 cycles and a duty ratio 50%. In this case, the output signal OUT is expressed as follows:

$$OUT=C(1.5)+C(2)=C+C(0.5)$$

In each of the 1/5 frequency-dividing circuits shown in FIGS. 13A to 16A, the NOR circuit receives a set of signals out of phase by half a cycle in the four stages of cascaded D-latches 1-c to 1f, whereby the high-level period of the output signal OUT can be increased by half a cycle of the input signal IN. By selecting a proper combination of D-latches, both of a signal having a frequency division ratio of 1/5 synchronous with rise of the input signal and a signal having a frequency division ratio of 1/5 synchronous with fall of the input signal IN can be obtained.

[Fifth Modification]

Figure 17A:
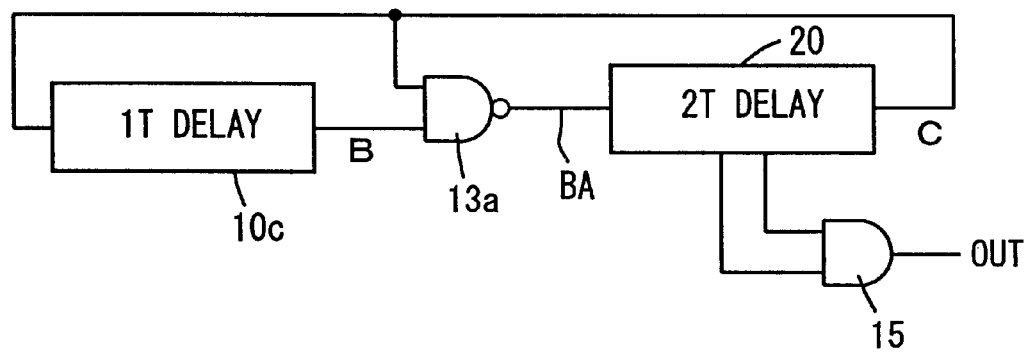
FIG. 17A illustrates the structure of a fifth modification of the frequency-dividing circuit according to the third embodiment of the present invention.
Figure 17B:
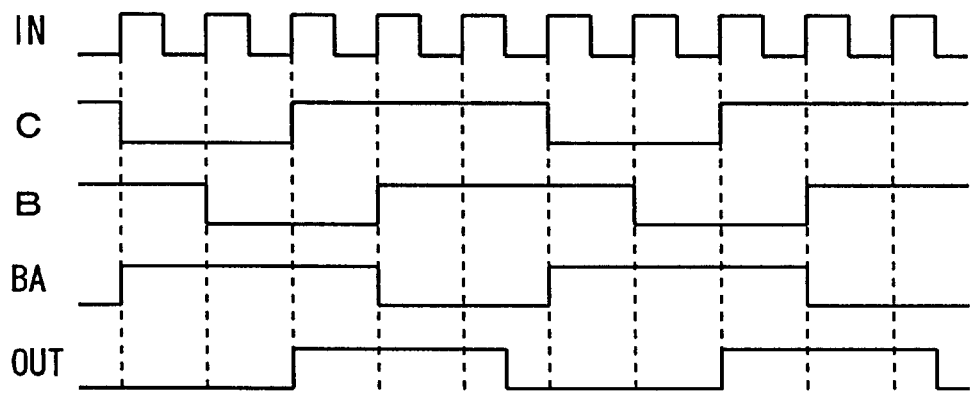
FIG. 17B is a signal waveform diagram representing operations of the frequency-dividing circuit shown in FIG. 17A.

FIG. 17A schematically illustrates the structure of a fifth modification of the frequency-dividing circuit according to the third embodiment of the present invention. The frequency-dividing circuit shown in FIG. 17A includes an AND circuit 15 receiving signals out of phase by half a cycle from a 2T delay circuit 20, dissimilarly to that shown in FIG. 6B. In the 1/5 frequency-dividing circuit shown in FIG. 17A, a signal on a node C is low for two cycle periods and is high for three cycle periods, as shown in an operation waveform diagram of FIG. 17B. The signal on node C is transmitted to a node B with a delay of one cycle of an input signal IN (not shown in FIG. 17A). Therefore, a signal on a node BA is high for three cycle periods and is low for two cycle periods (since a NAND circuit 13a receives the signals from nodes B and C). The signal on node BA is transmitted to node C with a delay of two cycle periods of the input signal IN. 2T delay circuit 20 includes four stages of cascaded D-latches therein. In 2T delay circuit 20, signals on an input and an output of each D-latch are out of phase from each other by half a cycle. By AND circuit 15 receiving the signals on the input and the output of each D-latch, an output signal OUT having a high-level period of 2.5 cycles, a low-level period of 2.5 cycles and a duty ratio of 50% can be provided.

[Sixth Modification]

Figure 18:
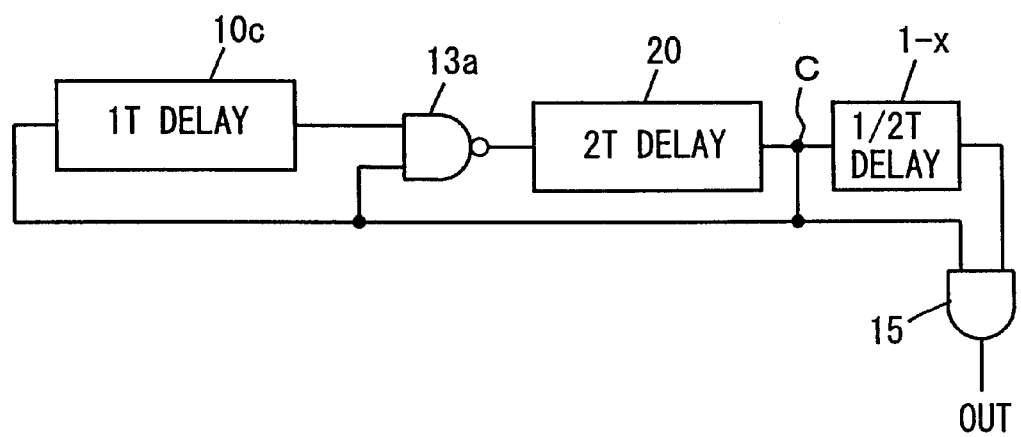
FIG. 18 schematically illustrates the structure of a sixth modification of the frequency-dividing circuit according to the third embodiment of the present invention.

FIG. 18 illustrates the structure of a sixth modification of the frequency-dividing circuit according to the third embodiment of the present invention. In the frequency-dividing circuit shown in FIG. 18, a 2T delay circuit 20 is provided on its output part with a ½T delay circuit (D-latch) 1-x delaying a signal on a node C by half a cycle of an input signal. An AND circuit 15 receives the signal on node C and an output signal of ½T delay circuit (D-latch) 1-x. The remaining structure is identical to that shown in FIG. 17A.

The frequency-dividing circuit shown in FIG. 18 also obtains an output signal OUT having the high-level period of the signal on node C reduced by half a cycle. This output signal is expressed as a signal obtained by delaying the phase of the output signal OUT by half a cycle in a waveform diagram shown in FIG. 17B. Therefore, the frequency-dividing circuit shown in FIG. 18 can also be extended to a 1/5 frequency-dividing circuit having a duty ratio of 50%.

The 1/5 frequency-dividing circuit is not restricted to the above structures but various modifications are employable. The frequency-divided signals can be provided in the following equations:

$$C=A(-2)*B(-2)=ZC(-2)*ZC(-3) \quad (C-2)$$

$$C=Z[C(-2)*C(-3)] \quad (C-3)$$

$$C=Z[\{C*C(-1)\}(-2)] \quad (C-4)$$

$$C=Z[C*C(-1)](-2) \quad (C-5)$$

In the case of the equations (C-3) to (C-5), the AND circuit receives signals out of phase from each other by half a cycle, in order to provide a frequency-divided signal having a duty ratio of 50%. In the case of the equation (C-2), an OR circuit is utilized for generating a signal having a duty ratio of 50%.

According to the third embodiment of the present invention, as hereinabove described, a 1/5 frequency-dividing circuit having a small occupying area can be provided by cascading D-latches and inserting a single stage logic circuit between the cascaded D-latches. Further, a 1/5 frequency-divided signal having a duty ratio of 50% can be provided by ORing/ANDing signals out of phase by half a cycle.

When obtaining the signal having a duty ratio of 50%, the delay of the frequency-divided signal with respect to change of the input signal IN can be sufficiently reduced only to a delay of a single stage D-latch and that of a logic circuit (the AND circuit or an OR circuit (NOR circuit+invertor).

Buffer circuits may be inserted between the D-latches, in order to prevent the signals from racing.

[Fourth Embodiment]

Figure 19A:
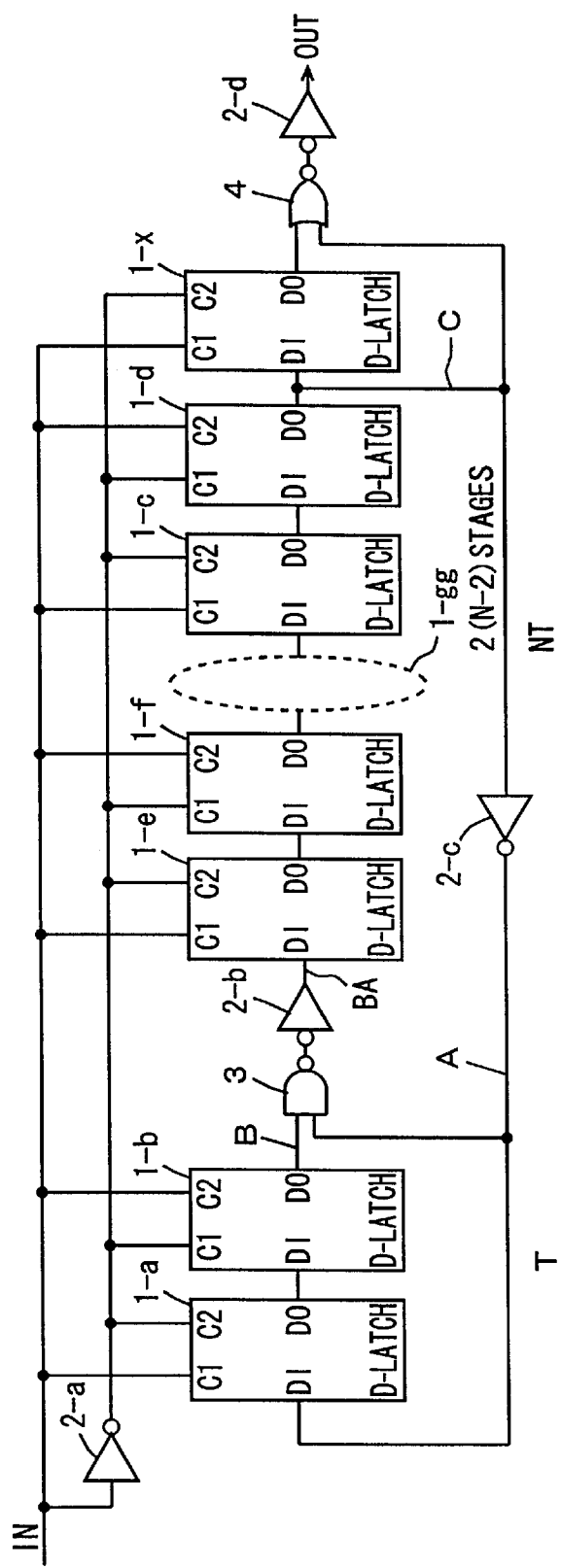
FIG. 19A illustrates the structure of a frequency-dividing circuit according to a fourth embodiment of the present invention.
Figure 19B:
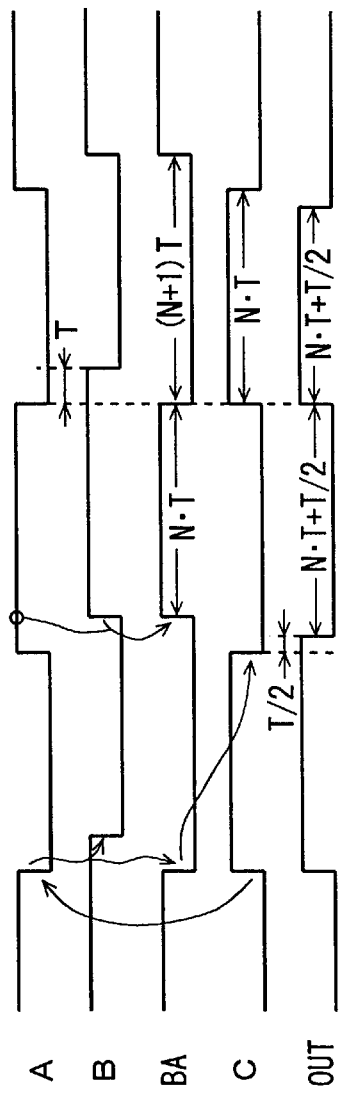
FIG. 19B is a signal waveform diagram representing operations of the frequency-dividing circuit shown in FIG. 19A.

FIG. 19A illustrates the structure of a frequency-dividing circuit according to a fourth embodiment of the present invention. In the frequency-dividing circuit shown in FIG. 19A, a group 1-$gg$ of 2(N−2) stages of D-latches are inserted between D-latches 1$f$ and 1-$c$. The remaining structure is identical to that shown in FIG. 12A, and corresponding parts are denoted by the same reference numerals while a detailed description thereof is not repeated. This D-latch group 1-$gg$ provides a delay time of (N−2)T. Therefore, a delay time between an output of an invertor 2-$b$ and a node C is N·T. Operations of the frequency-dividing circuit shown in FIG. 19A are now described with reference to a signal waveform diagram shown in FIG. 19B.

When the voltage on node C rises to a high level, the voltage on a node A falls to a low level and that on a node BA also responsively falls to a low level. The signal on node A is transmitted to a node B with a delay of one cycle. The low-level signal on node BA is transmitted to node C after a lapse of N cycles. Therefore, the signal on node C is kept high for N cycle periods N·T. The signal on node BA goes low when one of the signals on nodes A and B is low. Therefore, the signal on node BA is kept low for (N +1) cycle periods (N+1)T. The signal on node BA is transmitted to node C with a delay of N cycles, and hence the signal on node C has a high-level period of N cycles, (N·T) and a low-level period of N+1 cycles (N+1)T. Therefore, the signal on node C has a cycle of N·T+(N+1)T=(2N+1)T, and a signal obtained by frequency-dividing an input signal IN in a frequency division ratio of 1/(2N+1) appears on the node C.

An OR circuit formed by a NOR circuit 4 and an invertor 2-$d$ ORs the signal on the node C and a signal of a D-latch 1-$x$. Therefore, an output signal OUT has a high-level period longer by half a cycle T/2, and a lowlevel period shorter than that of the signal on node C by half a cycle. Thus, the output signal OUT obtained by frequency-dividing the input signal IN by the frequency division ratio of 1/(2N+1) has a duty ratio of 50%.

The signal on the node C is expressed as follows:

$$C=[A*B](-N)=[ZC*Z(C-1)](-N) \quad (D-1)$$

As shown in FIG. 19A, each D-latch has a small number of components and hence a 1/(2N+1) frequency-dividing circuit can be provided with a small number of components. Further, the number of the D-latches is simply increased, the D-latches are simply be regularly repetitively arranged, and the same pattern can simply be regularly repeated, whereby the layout efficiency is improved. Further, the delay of the frequency-divided signal OUT with respect to the input signal IN corresponds to the delay times of D-latch 1-$x$ and the OR gate (the NOR gate 4 and the invertor 2-$d$), and can be sufficiently reduced.

Also in the structure shown in FIG. 19A, buffers may be inserted between the D-latches, in order to prevent input signals in the D-latches from racing with the input signal IN.

[First Modification]

FIG. 20 illustrates the structure of a first modification of the frequency-dividing circuit according to the fourth embodiment of the present invention. In the structure shown in FIG. 20, output signals of D-latches 1-$c$ and 1-$d$ are supplied to a NOR circuit 4. D-latch 1-$x$ for duty control is not provided. The remaining structure is identical to that shown in FIG. 19A, and corresponding parts are denoted by the same reference numerals while a detailed description thereof is not repeated.

Also in the structure shown in FIG. 20, a 1/(2N+1) frequency-divided signal having a duty ratio of 50% can be provided. This is because signal change on a node C is identical to that shown in FIG. 19A.

An output signal OUT is expressed in the equation (B-2).

Also in the structure shown in FIG. 20, buffers for preventing racing may be inserted between D-latches.

[Second Modification]

Figure 21:
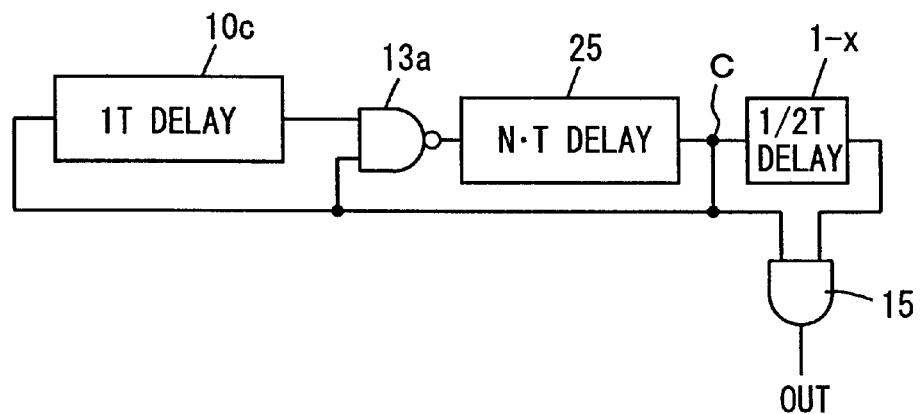
FIG. 21 schematically illustrates the structure of a second modification of the frequency-dividing circuit according to the fourth embodiment of the present invention.

FIG. 21 schematically illustrates the structure of a second modification of the frequency-dividing circuit according to the fourth embodiment of the present invention. In the structure shown in FIG. 21, a NAND circuit 13$a$ is arranged between a 1T delay circuit 10$c$ and an N·T delay circuit 25 formed by 2N stages of D-latches. The frequency-dividing circuit further includes a ½·T delay circuit 1-$x$ delaying an output signal of the N·T delay circuit 25 by half a cycle of an input signal IN (not shown in FIG. 21) and an AND circuit 15 receiving output signals of the N·T delay circuit 25 and the ½·T delay circuit (D-latch) 1-$x$.

The frequency-dividing circuit shown in FIG. 21 is obtained by extending the 1/4 frequency-dividing circuit shown in FIG. 6B. Therefore, a signal being high for (N+1) cycle periods and low for N cycle periods appears on a node C. A 1/(2N+1) frequency-divided signal OUT having high-level and low-level periods of (N+1/2) cycles and a duty ratio 50% is provided by reducing the high-level period of the signal on the node C by half a cycle by the AND circuit 15.

[Third Modification]

Figure 22:
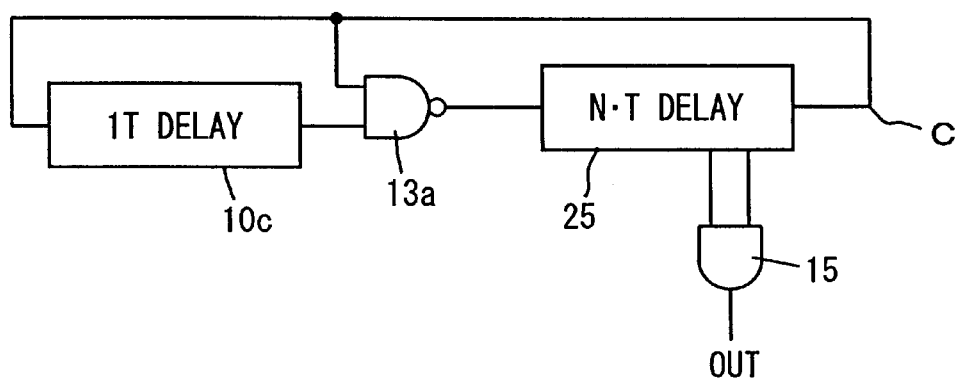
FIG. 22 schematically illustrates the structure of a third modification of the frequency-dividing circuit according to the fourth embodiment of the present invention.

FIG. 22 schematically illustrates the structure of a third modification of the frequency-dividing circuit according to the fourth embodiment of the present invention. In the structure shown in FIG. 22, an AND circuit 15 receives signals out of phase from each other by half a cycle, which are generated in an N·T delay circuit 25. The remaining structure is identical to that shown in FIG. 21. Also the structure shown in FIG. 22 provides a 1/(2N+1) frequency-divided signal OUT having a duty ratio of 50%.

When an input signal IN is frequency-divided by the division ratio of 1/(2N+1), the signal on node C is expressed as follows:

$$C=A(-N)*B(-N)=Z(C(-N))*Z(C(-N-1)) \quad (D-2)$$

$$C=Z[C(-N)*C(-N-1)] \quad (D-3)$$

$$C=Z[\{C*C(-1)\}(-N)] \quad (D-4)$$

$$C=Z[C*C(-1)](-N) \quad (D-5)$$

The output signal OUT is expressed in either one of the above equations (B-1) and (B-2).

The frequency-divided signal may be taken out not from node C; but from a node BA, i.e., an input of the N·T delay circuit or a node A.

According to the fourth embodiment of the present invention, as hereinabove described, the D-latches are simply regularly repetitively arranged, the signals out of phase by one cycle are ANDed/NANDed and the result of the logical operation is delayed by N cycles and fed back to the logic circuit again, whereby a signal frequency-divided by the division ratio of 1 (2N+1) can be readily provided by simply adding a D-latch, and a frequency-dividing circuit having excellent layout efficiency can be provided. Further, a frequency-divided signal having a duty ratio of 50% can be readily generated by ORing/ANDing the signals out of phase by half a cycle.

[Fifth Embodiment]

Figure 23:
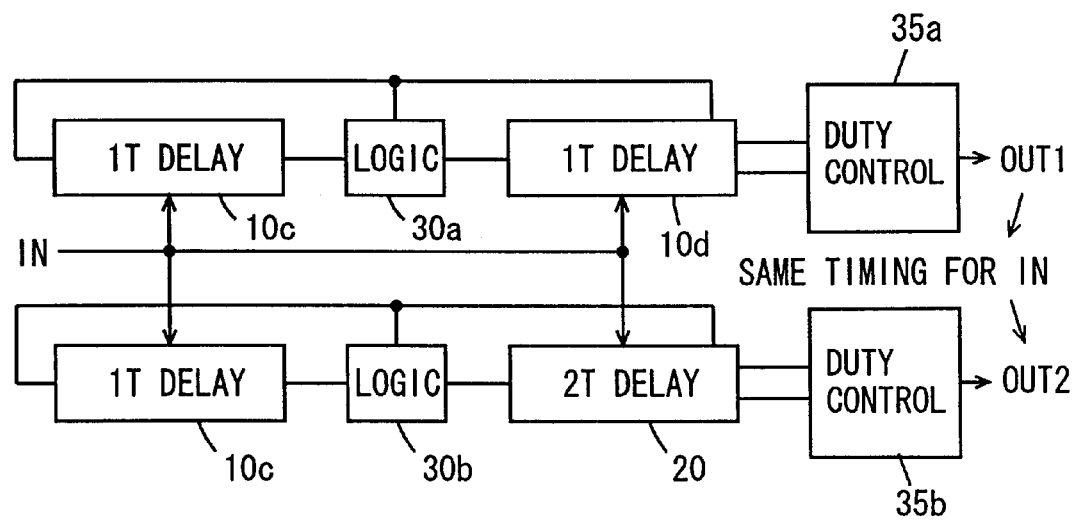
FIG. 23 schematically illustrates the structure of a frequency-dividing circuit according to a fifth embodiment of the present invention.

FIG. 23 illustrates the structure of a frequency-dividing circuit according to a fifth embodiment of the present invention. Referring to FIG. 23, the frequency-dividing circuit generates a 1/3 frequency-divided signal OUT1 and a 1/5 frequency-divided signal OUT2 with respect to an input signal IN. A 1/3 frequency-dividing circuit includes 1T delay circuits 10c and 10d, a logic circuit 30a logically processing output signals of 1T delay circuits 10c and 10d for supplying to 1T delay circuit 10d, and a duty control circuit 35a generating a signal having a duty ratio of 50% through signals out of phase from each other by half a cycle among those generated by 1T delay circuit 10d. The logic circuit 30a corresponds to the NAND circuit 13a or the AND circuit (the combination of the NOR gate 4 and the invertor 2-d). The duty control circuit 35a generates signals out of phase by half a cycle from those generated by 1T delay circuit 10d and ORs/ANDs these signals, thereby generating the 1/3 frequency-divided signal OUT1.

A 1/5 frequency-dividing circuit includes a 1T delay circuit 10e delaying an output signal of a 2T delay circuit 20, a logic circuit 30b logically processing output signals of 1T delay circuit 10e and 2T delay circuit 20, and a duty control circuit 35b generating (taking in) signals out of phase by half a cycle from the output signal of 2T delay circuit 20 and ORing/ANDing these signals for generating the frequency-divided signal OUT2.

The logic circuit 30b is identical in structure to logic circuit 30a, and the duty control circuit 35b is identical in structure to duty control circuit 35a. When the 1/3 frequency-divided signal OUT1 and the 1/5 frequency-divided signal OUT2 are generated from the input signal IN, the frequency-divided signals OUT1 and OUT2 are delayed by the same time with respect to the input signal IN. Therefore, the frequency-divided signals OUT1 and OUT2 cause no skew with respect to the input signal IN. Thus, internal circuits operating in accordance with the frequency-divided signals OUT1 and OUT2 can start operations at the same timing (with no timing skew) with respect to the input signal IN at a high speed (clock skew need not be taken into consideration and the timing margin can be reduced).

According to the fifth embodiment of the present invention, as hereinabove described, frequency-dividing circuits generating signals in different frequency division ratios have output parts of the same structure for outputting the frequency-divided signals, whereby a plurality of frequency-divided signals can be generated with no timing skew for the input signal, and correct internal clock signals (operation timing defining signals) can be generated.

Referring to FIG. 23, the frequency division ratios for the plurality of frequency-divided signals are not restricted to 1/3 and 1/5, but may be properly set depending on applications.

[Sixth Embodiment]

Figure 24:
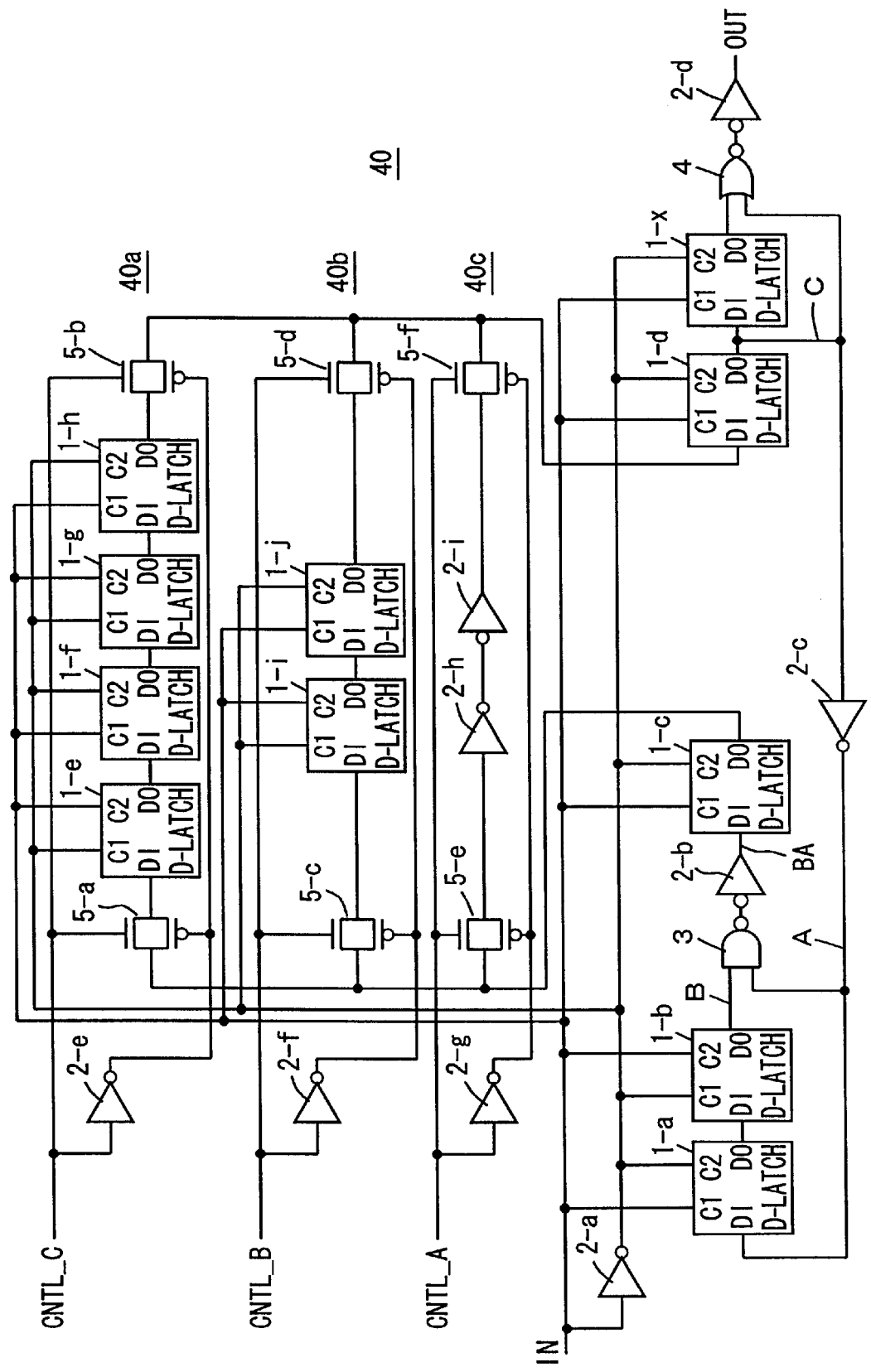
FIG. 24 schematically illustrates the structure of a frequency-dividing circuit according to a sixth embodiment of the present invention.

FIG. 24 illustrates the structure of a frequency-dividing circuit according to a sixth embodiment of the present invention. Referring to FIG. 24, a variable delay circuit 40 having a variable delay time is inserted between D-latches 1-c and 1-d. The remaining structure is identical to that shown in FIG. 7A, and corresponding parts are denoted by the same reference numerals while detailed description thereof is not repeated.

The variable delay circuit 40 includes a 2T delay circuit 40a having a delay time of 2T cycles, a 1T delay circuit 40b having a delay time of 1T cycle, and a buffer circuit 40c having a delay time of zero cycle. 2T delay circuit 40a includes a CMOS transmission gate 5-a rendered conductive in response to a selection signal CNTL-C and an inverted selection signal from an invertor 2-e, four stages of cascaded D-latches 1-e to 1-h transferring an output signal of CMOS transmission gate 5-a in accordance with an input signal IN, and a CMOS transmission gate 5-b rendered conductive in accordance with selection signal CNTL-C and the inverted signal thereof for transmitting an output signal of D-latch 1-h to a D-latch 1-d. The four stages of D-latches 1-e to 1-h provide a delay of two cycles.

1T delay circuit 40b includes a CMOS transmission gate 5-c rendered conductive in accordance with a selection signal CNTL-B and an inverted selection signal from an invertor 2-f for transmitting an output signal of a D-latch 1-c, two stages of cascaded D-latches 1-i and 1-j transmitting the signal supplied from CMOS transmission gate 5-c in accordance with input signal IN, and a CMOS transmission gate 5-d rendered conductive in accordance with selection signal CNTL-B and the inverted signal thereof for transmitting an output signal of D-latch 1-j to D-latch 1-d. The two stages of cascaded D-latches 1-i and 1-j provide a delay by one cycle of the input signal IN.

The buffer circuit 40c includes a CMOS transmission gate 5-e rendered conductive in accordance with a selection signal CNTL-A and an inverted selection signal from an invertor 2-g for transmitting the output signal of D-latch 1-c, two stages of cascaded invertors 2-h and 2-i transmitting an output signal of CMOS transmission gate 5-e, and a CMOS transmission gate 5-f rendered conductive in accordance with selection signal CNTL-A and the inverted signal thereof for transmitting an output signal of invertor 2-i to D-latch 1-d. The two stages of cascaded invertors 2-h and 2-i simply buffer the signal supplied from D-latch 1-c through CMOS transmission gate 5-e and transmit the buffered signal to D-latch 1-d through the CMOS transmission gate 5-f. Therefore, the buffer circuit 40c merely has a function of preventing racing, and the delay time thereof is zero.

One of the selection signals CNTL-A to CNTL-C is set in an active state of a high level. When 2T delay circuit 40a is inserted between D-latches 1-c and 1-d, the delay time between nodes BA and C is three cycle periods 3T of the input signal IN. In this case, therefore, a frequency-dividing circuit having a frequency division ratio of 1/7 is implemented.

When 1T delay circuit 40b is selected and inserted between D-latches 1-c and 1-d, the delay time between nodes BA and C is two cycle periods, 2T, of the input signal IN. In this case, therefore, a frequency-dividing circuit having a frequency division ratio of 1/5 is implemented.

When the buffer circuit 40c is selected, the delay time between nodes BA and C is one cycle period, 1T, of the input signal IN. In this case, a frequency-dividing circuit having a frequency division ratio of 1/3 is implemented similarly to the first embodiment.

In this variable delay circuit, therefore, a frequency-dividing circuit having a desired frequency division ratio can be implemented by arranging delay circuits providing delay times of an integral multiple of the cycle, T, of the input signal IN in parallel and selecting one of the delay circuits in accordance with a selection signal.

While the frequency-dividing circuit shown in FIG. 24 can also provide a signal having a duty ratio of 50%, various structures described with reference to the first to fifth embodiments can be utilized for generating the signal having the duty ratio of 50%. Further, NAND circuit 3 and invertors 2-b and 2-c may be replaced with a single NAND circuit. In this case, the duty ratio is controlled by an AND circuit.

According to the sixth embodiment of the present invention, as hereinabove described, a delay stage determining the frequency division ratio of the frequency-divided signal is formed by a variable delay stage, whereby a frequency-divided signal having an arbitrary frequency division ratio can be readily generated. Further, D-latches are simply serially connected to form delay circuits and one of output signals of a plurality of delay circuits having different delay times is selected by a selection signal, whereby a frequency-dividing circuit generating a frequency-divided signal having a desired frequency division ratio can be readily implemented in a simple circuit structure.

Also in the structure shown in FIG. 24, buffers may be arranged between the D-latches for preventing propagated signals from racing with the input signal IN.

Further, only the delay time of the delay stage determining the frequency division ratio is rendered variable and the remaining circuit parts are sharable. Thus, a variable frequency-dividing circuit can be implemented by the minimum number of components.

[Seventh Embodiment]

Figure 25A:
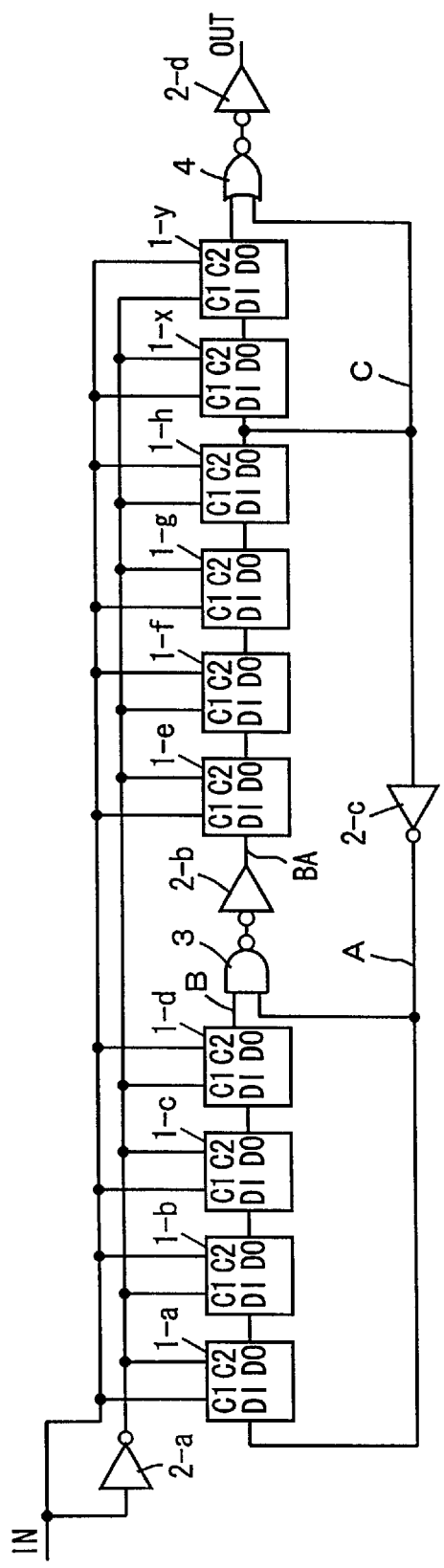
FIG. 25A illustrates the structure of a frequency-dividing circuit according to a seventh embodiment of the present invention.

FIG. 25A illustrates the structure of a frequency-dividing circuit according to a seventh embodiment of the present invention. In the frequency-dividing circuit shown in FIG. 25A, four stages of D-latches 1-a to 1-d are arranged between nodes A and B, and four stages of D-latches 1-e to 1-h are arranged between nodes BA and C.

Figure 25B:
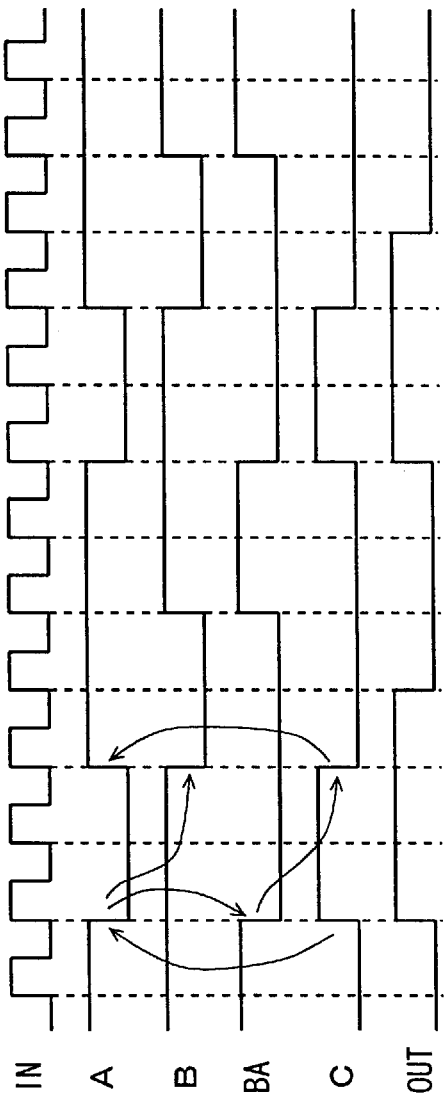
FIG. 25B is a timing chart representing operations of the frequency-dividing circuit shown in FIG. 25A.

This frequency-dividing circuit further includes two stages of D-latches 1-x and 1-y transferring a signal on node C in accordance with an input signal IN, a NOR circuit 4 receiving an output signal of D-latch 1-y and the signal on node C, and an invertor 2-d inverting an output signal of NOR circuit 4 and generating a frequency-divided signal OUT. The signal on node C is transmitted to an input of D-latch 1a through an invertor 2-c. Similarly to the aforementioned embodiments, a NAND circuit 3 receiving signals on nodes B and A and an invertor 2-b inverting an output signal of NAND circuit 3 and transmitting the inverted signal to D-latch 1-e are provided between nodes B and BA. Operations of the frequency-dividing circuit shown in FIG. 25A are now described with reference to a timing chart shown in FIG. 25B.

When the signal on node C rises to a high level, the signal on node A falls to a low level. The signal on node A is transmitted to node B with a delay of two cycles. The signal on node BA falls to a low level in response to the fall of the signal on node A. The signal on node BA is delayed by two cycles by D-latches 1-e to 1-h and transmitted to node C. Therefore, the signal on node C is high for two cycle periods 2·T of the input signal IN. In other words, the signal on node A is low for two cycle periods. The signal on node B falls to a low level with a delay of two cycles relating to the signal on node A. Therefore, the signal on node BA is low while one of the signals on nodes A and B is low, i.e., for four cycle periods. The signal on node BA is transmitted to node C with a delay of two cycles. Therefore, the signal on node C has a high-level period of two cycles and a low-level period of four cycles. In other words, the signal on node C changes in a cycle of six times that of the input signal IN. Thus, a signal having a frequency division ratio of 1/6 can be obtained. The D-latches 1-x and 1-y delay the signal on the node C by one cycle. NOR circuit 4 and invertor 2d OR the signal delayed by one cycle and the signal on node C. Therefore, an output signal OUT is high for three cycles after the signal on node C rises to a high level and then is low for subsequent three cycles. Thus, a frequency-divided signal having a duty ratio of 50% and a frequency division ratio of 1/6 can be obtained.

The signal on node C satisfies the following relation:

$$C=[A*B](-2)=[ZC*Z(C(-2))](-2) \tag{E-1}$$

The output signal OUT is expressed as follows:

$$OUT=C+C(-1) \tag{F-1}$$

The frequency-dividing circuit shown in FIG. 25A can generate a frequency-divided signal having a cycle of even times the cycle of the input signal IN. Also in this case, the number of stages of the D-latches is simply adjusted and a frequency-dividing circuit having a desired frequency division ratio can be implemented in a simple circuit structure.

[First Modification]

Figure 26A:
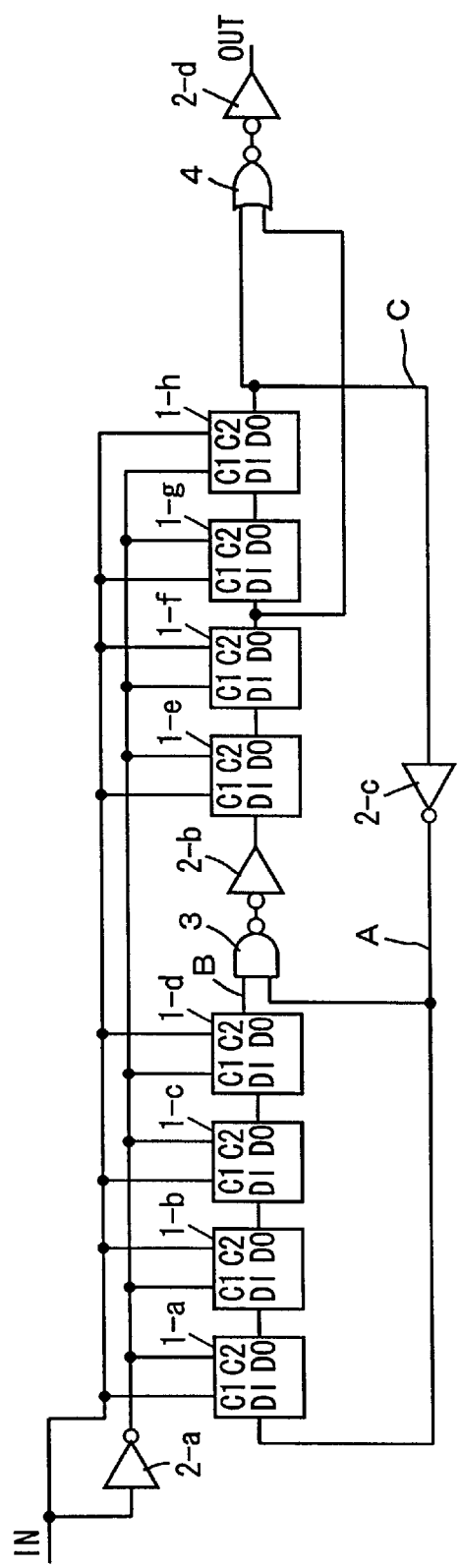
FIG. 26A schematically illustrates the structure of a first modification of the frequency-dividing circuit according to the seventh embodiment of the present invention.

FIG. 26A illustrates the structure of a first modification of the frequency-dividing circuit according to the seventh embodiment of the present invention. Referring to FIG. 26A, a NOR circuit 4 receives output signals from D-latches 1f and 1-h. No D-latches 1-x and 1-y are not provided. The remaining structure is identical to that shown in FIG. 25A, and corresponding parts are denoted by the same reference numerals while a detailed description thereof is not repeated.

Figure 26B:
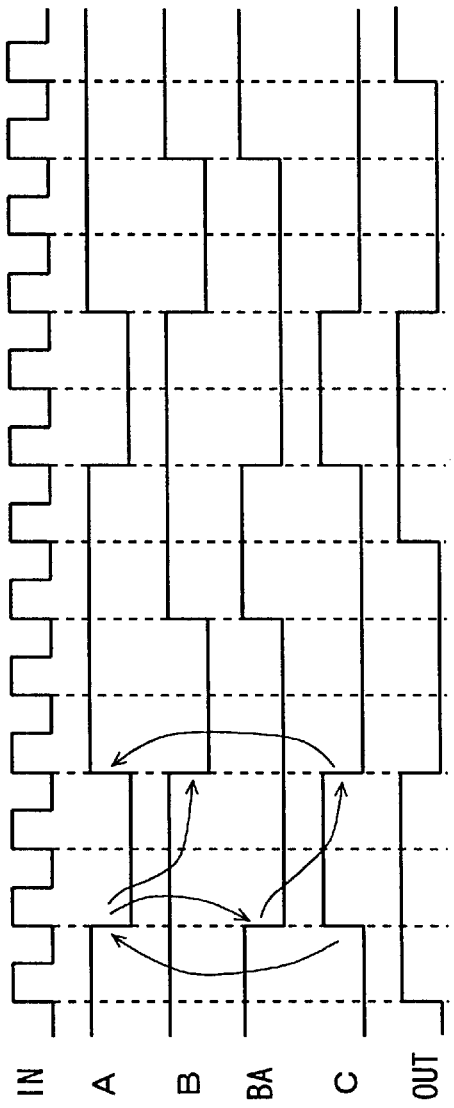
FIG. 26B is a timing chart representing operations of the frequency-dividing circuit shown in FIG. 26A.

In the structure shown in FIG. 26A, NOR circuit 4 receives a signal on a node C and a signal having a lead on the signal on the node C by a phase difference of one cycle. As shown in a timing chart of FIG. 26B, therefore, an output signal OUT from an invertor 2-d rises precedently to the signal on node C by one cycle, and falls to a low level in synchronization with fall of the signal on node C. Also in this case, the output signal OUT has a high-level period of three cycles and a low-level period of three cycles and a duty ratio of 50%.

In the structure shown in FIG. 26A, the NOR circuit 4 may be supplied with output signals of an invertor 2-b and D-latch 1f. A signal having a duty ratio of 50% can be obtained by ORing signals out of phase by one cycle of the input signal IN.

The relation between the output signal OUT and the signal on node C in the structure shown in FIG. 26A is expressed as follows:

$$OUT=C+C(1)$$

[Second Modification]

Figure 27A:
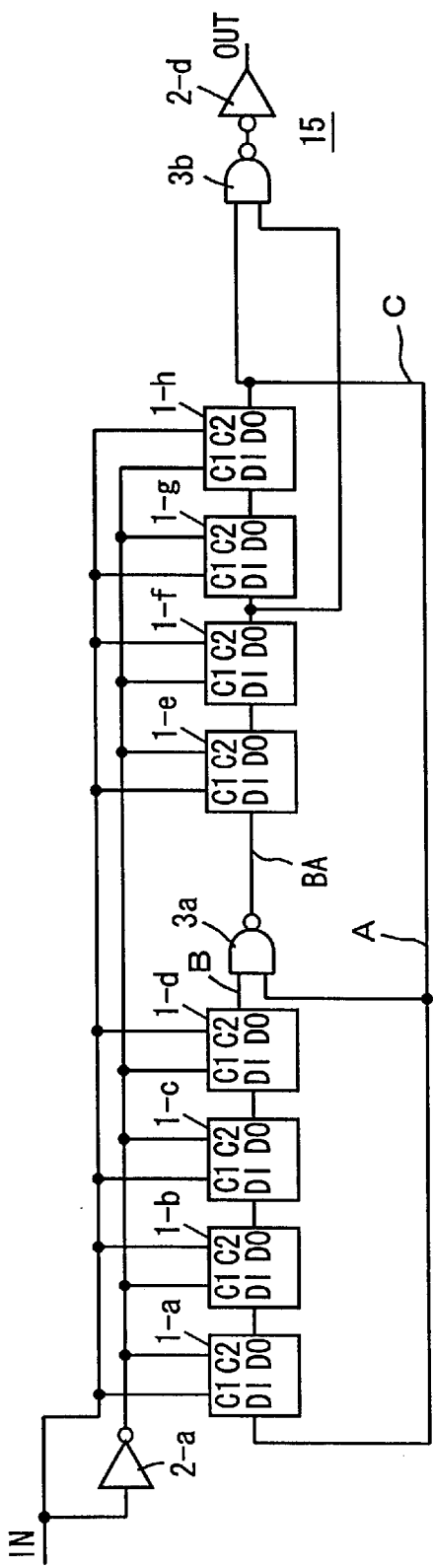
FIG. 27A schematically illustrates the structure of a second modification of the frequency-dividing circuit according to the seventh embodiment of the present invention.

FIG. 27A illustrates the structure of a second modification of the frequency-dividing circuit according to the seventh embodiment of the present invention. The frequency-dividing circuit shown in FIG. 27A is different from that shown in FIG. 26A in the following points: The invertors 2-b and 2-c are removed and NOR circuit 4 is replaced with a NAND circuit 3b. Signals on nodes A and B are supplied to a NAND circuit 3a, and the NANDed signal thereof is supplied to a D-latch 1-e. NAND circuit 3b and an invertor 2-d correspond to AND circuit 15.

Figure 27B:
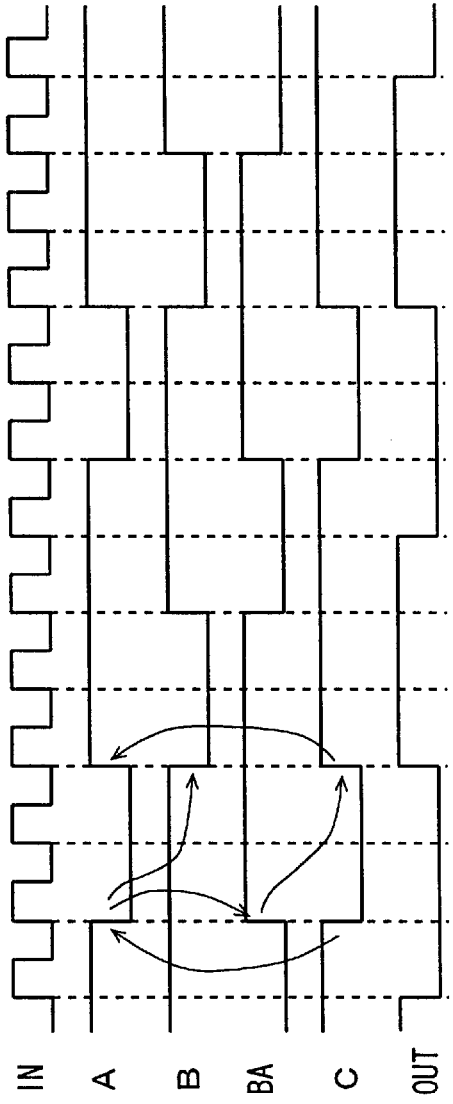
FIG. 27B is a signal waveform diagram representing operations of the frequency-dividing circuit shown in FIG. 27A.

In the frequency-dividing circuit shown in FIG. 27A, node A and a node C are supplied with the same signal as shown in an operation waveform diagram of FIG. 27B. When the signal on node A goes low, the output signal of NAND circuit 3a goes high. A signal on node BA is transmitted to node C with a delay of two cycles. Therefore, the signal on node C is low for two cycle periods. The signal on node A, i.e., node C is transmitted to node BA with a delay of two cycles. Therefore, the signal on node BA is high while one of the signals on nodes A and B is low. In other words, the signal on node BA is high for four cycle periods. Therefore, the signal from node C has a high-level period of four cycles and a low-level period of two cycles. In other words, node C is supplied with a frequency-divided signal of an input signal IN having a frequency division ratio of 1/6.

AND circuit 15 ANDs the signal on node C and the signal of D-latch 1f. Therefore, an output signal OUT rises to a high level in synchronization when the signal on node C rises to a high level, and remains high for three cycle periods. Thus, the output signal OUT has a duty ratio of 50%.

Also in the structure shown in FIG. 27A, NAND circuit 3b may receive the signals of node BA and from the D-latch 1f.

The signal on node C in the frequency-dividing circuit shown in FIG. 27A satisfies the following equation:

$$C=Z[C*C(-2)](-2)$$

Also in this 1/6 frequency-dividing circuit, the structure of another logic circuit can be utilized as the logic circuit 3a.

Also in the seventh embodiment, buffer circuits may be inserted between the D-latches for preventing racing.

According to the seventh embodiment of the present invention, as hereinabove described, the D-latches are cascaded and a logic circuit is provided between the D-latches for inverting the outputs every prescribed cycle, whereby a frequency-divided signal having a frequency division ratio of 1/6 can be obtained. Also in this case, a signal having a duty ratio of 50% can be obtained by ORing/ANDing signals out of phase by one clock cycle for duty control. Also upon controlling the duty ratio, the frequency-divided signal is delayed with respect to the input signal by the gate delay time of a single stage of D-latch and the OR/AND circuit, and a frequency-divided signal having an extremely small delay with respect to the input signal IN can be provided.

[Eighth Embodiment]

FIG. 28A illustrates the structure of a frequency-dividing circuit according to an eighth embodiment of the present invention. In the frequency-dividing circuit shown in FIG. 28A, a delay circuit group 1-gg including 2(N−5) stages of cascaded D-latches is arranged between D-latches 1f and 1-g. The remaining structure is identical to that shown in FIG. 26A, and corresponding parts are denoted by the same reference numerals.

In the structure shown in FIG. 28A, 2(N−1) stages of D-latches are cascaded between nodes BA and C. Therefore, a signal on node BA is transmitted to node C after a lapse of (N−1) cycles. A signal on node A is transmitted to node B by D-latches 1-a to 1-d after a lapse of two cycle periods 2T. When the signal on node A falls to a low level, the signal on node BA remains low for (N−1) cycles+2 cycles, i.e., (N+1)T, as shown in FIG. 28B. The signal on node BA is transmitted to node C after a lapse of (N−1) cycles. When the signal on node C rises to a high level and the signal on node BA responsively goes low, the signal on node C falls to a low level after a lapse of (N−1) cycles. Thus, the signal on node C has a highlevel period of (N−1)T and a low-level period of (N+1)T. The signal on node C has a cycle of 2N·T, which is 2N times the cycle of the input signal IN. Thus, a signal having a frequency division ratio of 1/2N is generated from node C.

NOR circuit 4 and invertor 2-d control the duty ratio of the signal on node C. The signal on node C and a signal preceding this signal on node C by a phase difference of one cycle are ORed for increasing the high-level period of the signal on node C by one cycle. Therefore, an output signal OUT from invertor 2-d has a high-level period of N·T, a low-level period of N·T and a duty ratio of 50%.

Thus, a frequency-dividing circuit having a desired frequency division ratio can be readily formed by simply increasing the number of D-latches in a unit of a delay of one cycle, as shown in FIG. 28A. The signal on node C is expressed as follows:

$$C=[A*B](-N+1)=[ZC*Z(C(-2))](-N+1) \qquad \text{G-1}$$

The output signal OUT is expressed in the equation (F-1).

[First Modification]

Figure 29:
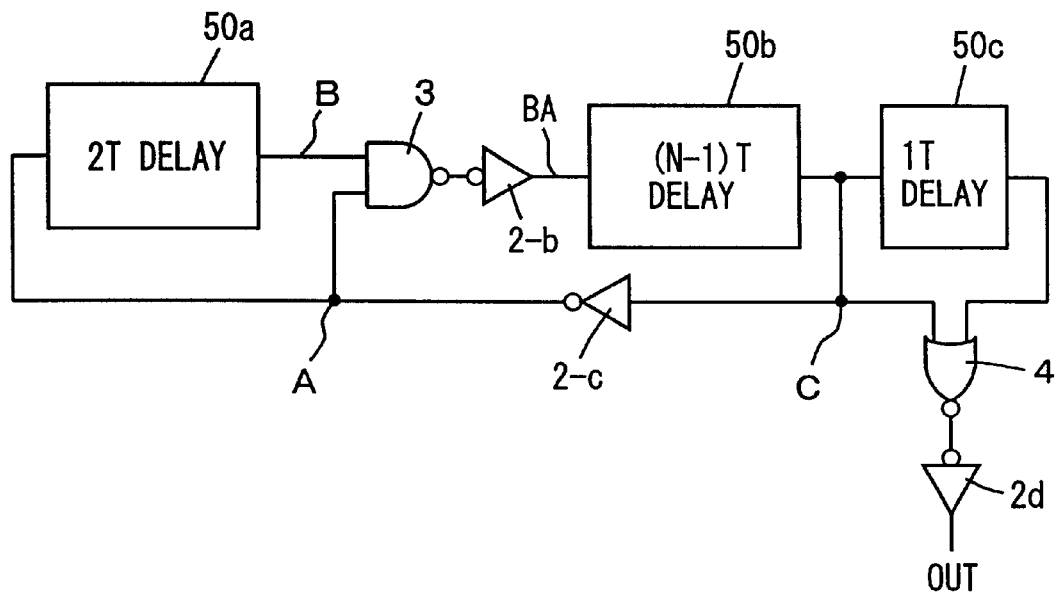
FIG. 29 schematically illustrates the structure of a first modification of the frequency-dividing circuit according to the eighth embodiment of the present invention.

FIG. 29 illustrates the structure of a first modification of the frequency-dividing circuit according to the eighth embodiment of the present invention. Referring to FIG. 29, an (N−1)T delay circuit 50b corresponding to the delay circuit formed by D-latches 1-e, 1f, 1-g and 1-h and the D-latch group 1-gg is provided on its output part with a 1T delay circuit 50c delaying a signal on node C by one cycle of an input signal IN (not shown in FIG. 29). NOR circuit 4 receives the signal on node C and an output signal of 1T delay circuit 50c.

A 2T delay circuit 50a corresponds to D-latches 1-a to 1-d shown in FIG. 28A. The frequency-dividing circuit shown in FIG. 29 can provide a frequency-divided signal having a frequency division ratio of 1/2N. Further, a frequency-divided signal having a duty ratio of 50% can be obtained by the NOR circuit 4 and an invertor 2-d.

[Second Modification]

Figure 30:
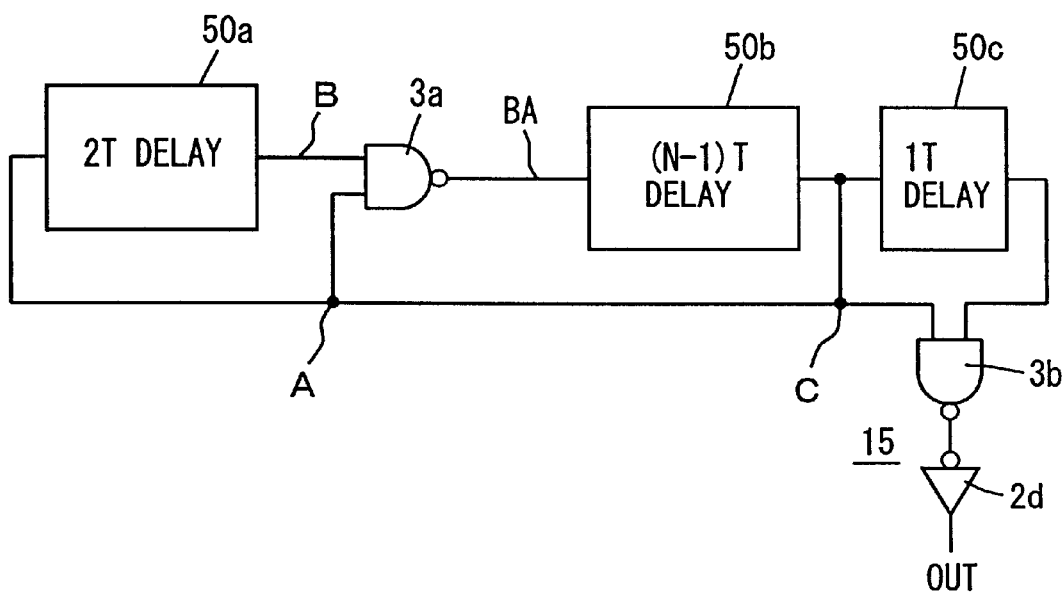
FIG. 30 schematically illustrates the structure of a second modification of the frequency-dividing circuit according to the eighth embodiment of the present invention.

FIG. 30 illustrates the structure of a second modification of the frequency-dividing circuit according to the eighth embodiment of the present invention. The frequency-dividing circuit shown in FIG. 30 is equivalent to that obtained by removing the invertors 2-b and 2-c and replacing NOR circuit 4 with a NAND circuit 3b in the structure shown in FIG. 29. A NAND circuit 3a receives signals on nodes A and B.

Also in the frequency-dividing circuit shown in FIG. 30, a signal on node BA rises to a high level when the signal on node A falls to a low level. The signal on node BA is transmitted to node C after a lapse of (N−1) cycles. Therefore, the signals on nodes A and C have low-level periods of (N−1)T. The signal on node A is transmitted to node BA with a delay of two cycles. Therefore, the signal on node BA is high for (N−1)+2=(N+1) cycle periods. In other words, the node C outputs a signal being low for (N−1)T cycle periods and high for (N+1) cycle periods. Also in this case, a frequency-divided signal is obtained by frequency-dividing an input signal IN by a frequency division ratio of 1/2N.

Similarly to the signal waveform diagram shown in FIG. 28B, a frequency-divided signal having high- and low-level periods of N·T, a duty ratio of 50% and a frequency division ratio of 1/2N can be obtained by ANDing the input signal and the output signal of the 1T delay circuit 50c by NAND circuit 3b and invertor 2-d.

According to the eighth embodiment of the present invention, as hereinabove described, a frequency-dividing circuit having an arbitrary frequency division ratio can be obtained by simply increasing the number of D-latches in a unit of 1T. In this frequency-dividing circuit, further, the D-latches are simply repetitively arranged to provide regular circuit arrangement, whereby efficient layout can be obtained. Similarly to the aforementioned embodiments, the frequency-divided signal is delayed with respect to the input signal IN by the delay time of the 1T delay circuit 50c and the OR/AND circuit.

Also in this 1/2N frequency-dividing circuit, buffer circuits may be inserted between the D-latches for preventing racing.

[Ninth Embodiment]

Figure 31:
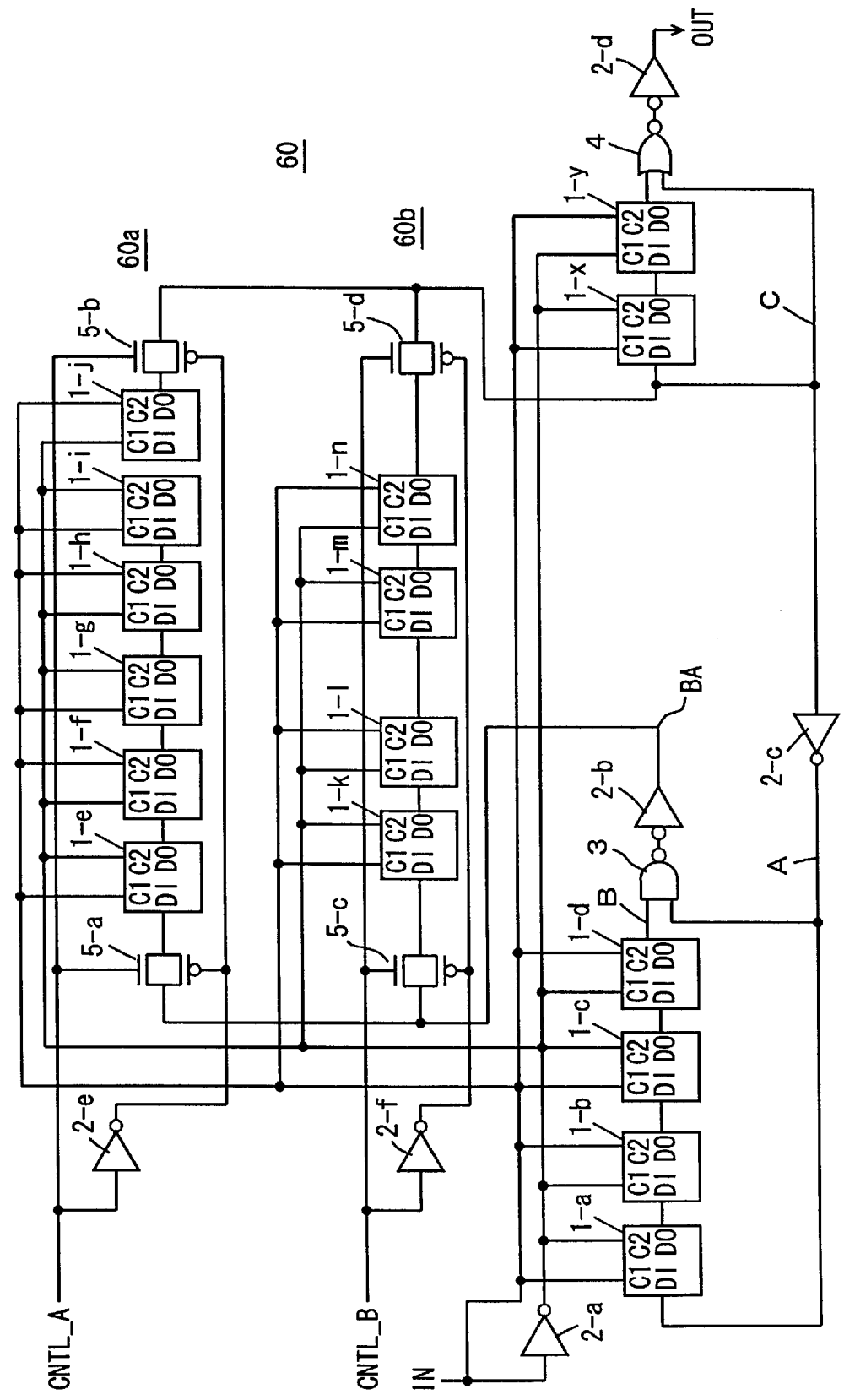
FIG. 31 schematically illustrates the structure of a frequency-dividing circuit according to a ninth embodiment of the present invention.

FIG. 31 illustrates the structure of a frequency-dividing circuit according to a ninth embodiment of the present invention. In the frequency-dividing circuit shown in FIG. 31, a variable delay circuit 60 is arranged between an invertor 2-b and a D-latch 1-x. The remaining structure is identical to that shown in FIG. 25A. The variable delay circuit 60 includes a delay circuit 60a providing a delay of 3T and a 2T delay circuit 60b providing a delay of 2T. The delay circuit 60a includes a CMOS transmission gate 5-a rendered conductive in accordance with a selection signal CNTL-A and an inverted selection signal from an invertor 2-e, of cascaded D-latches 1-e to 1-j of six stages transmitting an output signal of CMOS transmission gate 5-a in accordance with an input signal IN, and a CMOS transmission gate 5-b rendered conductive in accordance with the selection signal CNTL-A and the inverted signal thereof for transmitting an output signal of D-latch 1-j to a node C. 2T delay circuit 60b includes a CMOS transmission gate 5-c rendered conductive in accordance with a selection signal CNTL-B and an inverted signal thereof supplied through an invertor 2-f for passing an output signal of the invertor 2-b, cascaded D-latches 1-k to 1-n of four stages transmitting the signal supplied from CMOS transmission gate 5-c in accordance with the input signal IN and a CMOS transmission gate 5-d rendered conductive in accordance with selection signal CNTL-B and the inverted signal thereof for transmitting an output signal of D-latch 1-n to node C.

In the structure shown in FIG. 31, one of selection signals CNTL-A and CNTL-B is set high while the other signal is set low. In other words, one of 3T delay circuit 60a and 2T delay circuit 60b is inserted between a node BA and the node C. When the selection signal CNTL-A is high, CMOS transmission gates 5-a and 5-b are rendered conductive and CMOS transmission gates 5-c and 5-d are rendered non-conductive. Therefore, 3T delay circuit is inserted between nodes BA and C. Thus, a frequency-divided signal having a frequency division ratio of 1/8 is generated in this case.

When the selection signal CNTL-B is high, 2T delay circuit 60b is inserted between nodes BA and C. In this case, a frequency-divided signal having a frequency division ratio of 1/6 is provided on node C. When an M·T delay circuit between nodes BA and C, a frequency-divided signal having a frequency division ratio of 1/2(M+1) is obtained. Therefore, a frequency-divided signal having a desired frequency division ratio can be readily obtained by simply changing the delay time between nodes BA and C.

Also in the structure shown in FIG. 31, buffers may be inserted between the D-latches for preventing racing.

Further, invertors 2-b and 2-c may be removed and NOR circuit 4 may be replaced with a NAND circuit.

[Tenth Embodiment]

Figure 32:
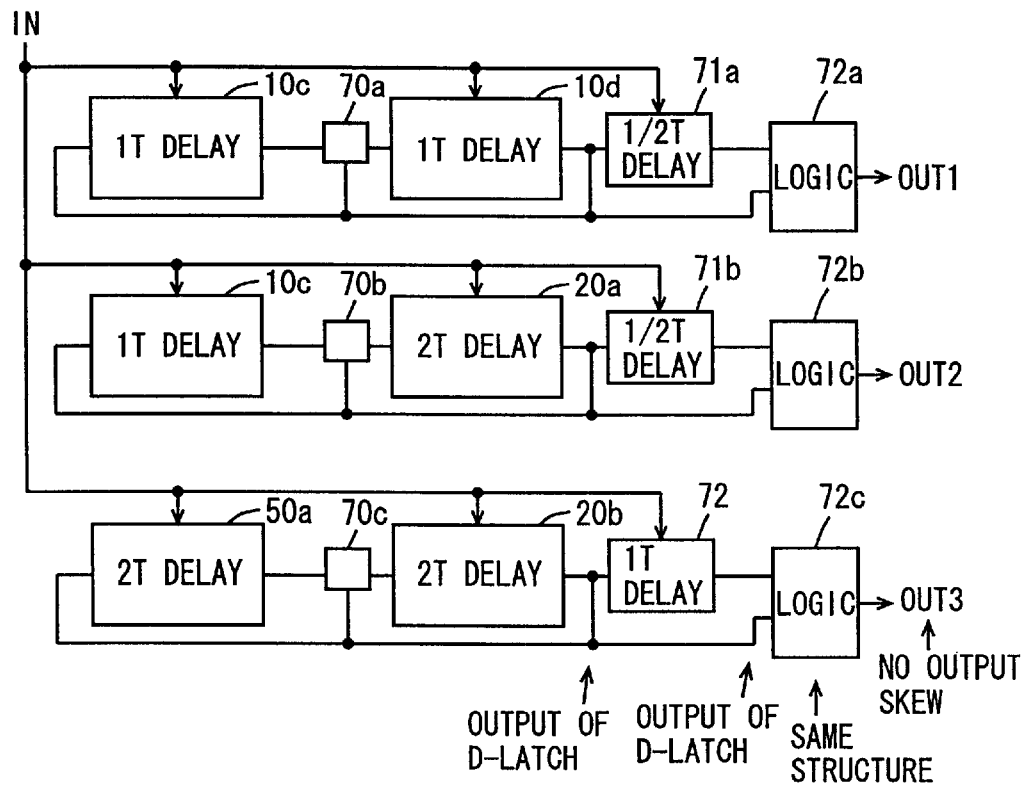
FIG. 32 schematically illustrates the structure of a frequency-dividing circuit according to a tenth embodiment of the present invention.

FIG. 32 illustrates the structure of a frequency-dividing circuit according to a tenth embodiment of the present invention. FIG. 32 shows a 1/3 frequency-dividing circuit, a 1/5 frequency-dividing circuit and a 1/6 frequency-dividing circuit. The 1/3 frequency-dividing circuit includes a 1T delay circuit 10c, a logic circuit 70a, a 1T delay circuit 10d, a T/2 delay circuit 71a and a logic circuit 72a. 1T delay circuits 10c and 10d and T/2 delay circuit 71a are formed by D-latches, similarly to the aforementioned embodiments. The logic circuit 72a is an OR circuit or an AND circuit (depends on the structure of the logic circuit 70a). 1/5 frequency-dividing circuit similarly includes a 1T delay circuit 10e, a logic circuit 70b, a 2T delay circuit 20a, a T/2 delay circuit 71b and a logic circuit 72b.

1/6 frequency-dividing circuit includes a 2T delay circuit 50a, a logic circuit 70c, a 2T delay circuit 20b, a T delay circuit 72 and a logic circuit 72c. 2T delay circuits 20a, 20b and 50a and T delay circuit 72 are also formed by cascaded D-latches.

These frequency-dividing circuits perform transfer operations in accordance with an input signal IN. The logic circuits 72a, 72b and 72c are identical in circuit structure to each other, and are AND circuits or OR circuits. T/2 delay circuits 71a and 71b and T delay circuit 72 are merely different in number of stages of D-latches from each other. Each of the logic circuits 72a, 72b and 72c receives output signals of two D-latches. Operations of the D-latches are synchronous with each other through the input signal IN and the logic circuits 72a to 72c are identical in structure to each other, and hence frequency-divided signals OUT1, OUT2 and OUT3 change at the same timing with respect to the input signal IN. In other words, there is no skew among the frequency-divided signals OUT1, OUT2 and OUT3. Therefore, internal circuits can be correctly driven in synchronization with the input signal IN even with frequency-divided signals having different frequency division ratios, to implement correct internal operations.

[Eleventh Embodiment]

Figure 33A:
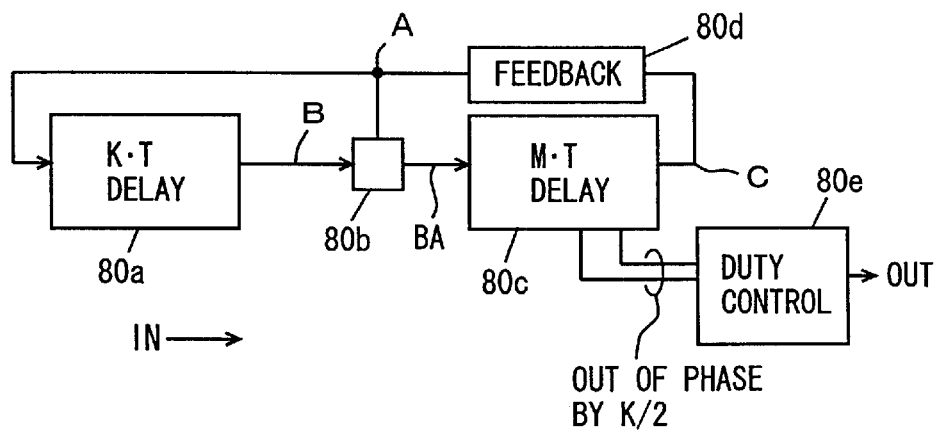
FIG. 33A schematically illustrates the structure of a frequency-dividing circuit according to an eleventh embodiment of the present invention.

FIG. 33A schematically illustrates the structure of a frequency-dividing circuit according to an eleventh embodiment of the present invention. Referring to FIG. 33A, the frequency-dividing circuit according to the eleventh embodiment of the present invention includes a K·T delay circuit 80a operating in synchronization with an input signal IN for delaying a signal on a node A by K·T and transmitting the delayed signal to a node B, a logic circuit 80b performing prescribed logical processing on the signal on node A and a signal on a node B and outputting the processed signal to a node BA, an M·T delay circuit 80c operating in synchronization with the input signal IN for delaying the signal on node BA by M·T and transmitting the delayed signal to a node C, and a feedback part 80d feeding back the signal on node C to node A. When both of the signals on nodes A and B are at a first logical level, the logic circuit 80b outputs a signal having a logical level different from that a logical level in otherwise case. The feedback part 80d includes an invertor or is simply formed by an interconnection line, as shown in the first to tenth embodiments.

The frequency-dividing circuit further includes a duty control circuit 80e coupled to M·T delay circuit 80c for extracting signals out of phase by (K/2)T from M·T delay circuit 80c, performing prescribed logical processing on the extracted signals and outputting a signal having a duty ratio of 50%. T represents one cycle of the input signal IN, and K and M represent natural numbers, while M≧K. As described in the first to tenth embodiments, K is equal to 1 or 2. Operations of the frequency-dividing circuit shown in FIG. 33A are now described with reference to a signal waveform diagram of FIG. 33B.

Figure 33B:
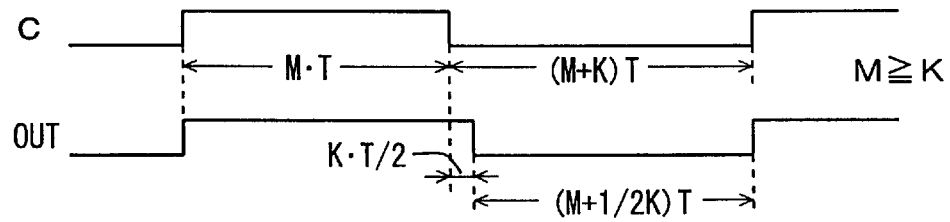
FIG. 33B is a signal waveform diagram representing operations of the frequency-dividing circuit shown in FIG. 33A.

Referring to FIG. 33B, the logic circuit 80b performs AND operation and duty control circuit 80e generates an output signal OUT from the signal on node C and the signal out of phase by K/2 cycles.

Assume that the logic circuit 80b is an AND circuit. When the signal on node C rises to a high level, the signal on node A falls to a low level, and the signal on node BA responsively falls to a low level. The signal on node BA is transmitted to node C after a lapse of M·T cycles. Thus, the signal on node C is high for M·T cycle periods. The signal on node A is transmitted to node B through K·T delay circuit 80a. Even if the signal on node A rises to a high level, therefore, the signal on node B remains low for K·T cycle periods, and hence the signal on node BA also remains low for (M+K) cycle periods. In other words, the signal on node C is high for M cycle periods and is low for (M+K) cycle periods. Thus, the signal on node C has a cycle of (2M+K)T. In other words, a signal obtained by dividing the input signal IN by a frequency division ratio of 1/(2M+K) appears on node C.

The duty control circuit 80e extracts signals out of phase from each other by K·T/2 from M·T delay circuit 80c. Therefore, the signal on node C has a high-level period of (M+(K/2))T and a low-level period of M+(K/2))T. Thus, a signal having a duty ratio of 50% is generated from duty control circuit 80e.

If the logic circuit 80b is formed by a NAND circuit, the logical level of the signal on node C is reverse to the logical level of the signal waveform shown in FIG. 33B. Also in this case, a signal having a duty ratio of 50% is provided by extracting signals out of phase by K·T/2 for ANDing in duty control circuit 80e.

As shown in FIG. 33A, therefore, a frequency-divided signal of a frequency division ratio having an even or odd dominator can be readily generated by switching the delay time K of the K·T delay circuit 80a between 1 and 2. If the delay time M·T of M·T delay circuit 80c is shorter than the delay time K·T of K·T delay circuit 80a, the signal on node C changes in response to signal change on node A before the signal on node B changes. In this case, therefore, a frequency-divided signal having a desired frequency division ratio cannot be obtained, as clearly understood from the following equation:

C=[ZC*Z(C(-K)](-M)

=ZC(-M)+ZC(-M-K)

In other words, it is meaningless to OR a signal precedent by M cycles and a signal further precedent to this signal. This is because the current signal on node C is not influenced even if the further precedent signal is delayed by M cycles. The signal on node BA can be continuously kept at a constant logical level for M cycle periods or (M+K) cycle periods in response to the signals on nodes A and B by setting M≧K.

In the structure shown in FIG. 33A, the structure for setting the K·T delay circuit 80a as a 1T delay circuit or a 2T delay circuit is implemented by employing a variable delay circuit as shown in FIG. 31.

According to the eleventh embodiment of the present invention, as hereinabove described, the K·T delay circuit and the M·T delay circuit are connected and the circuit for performing logical operation of the feedback signal of the M·T delay circuit and the output signal of the K·T delay circuit is provided between the delay circuits, whereby a frequency-divided signal having a frequency division ratio of 1/(2M+K) can be readily generated. Further, a signal having a duty ratio of 50% can be provided by extracting the signals out of phase by K·T/2 periods and performing OR/AND operation by the duty control circuit.

[Twelfth Embodiment]

Figure 34A:
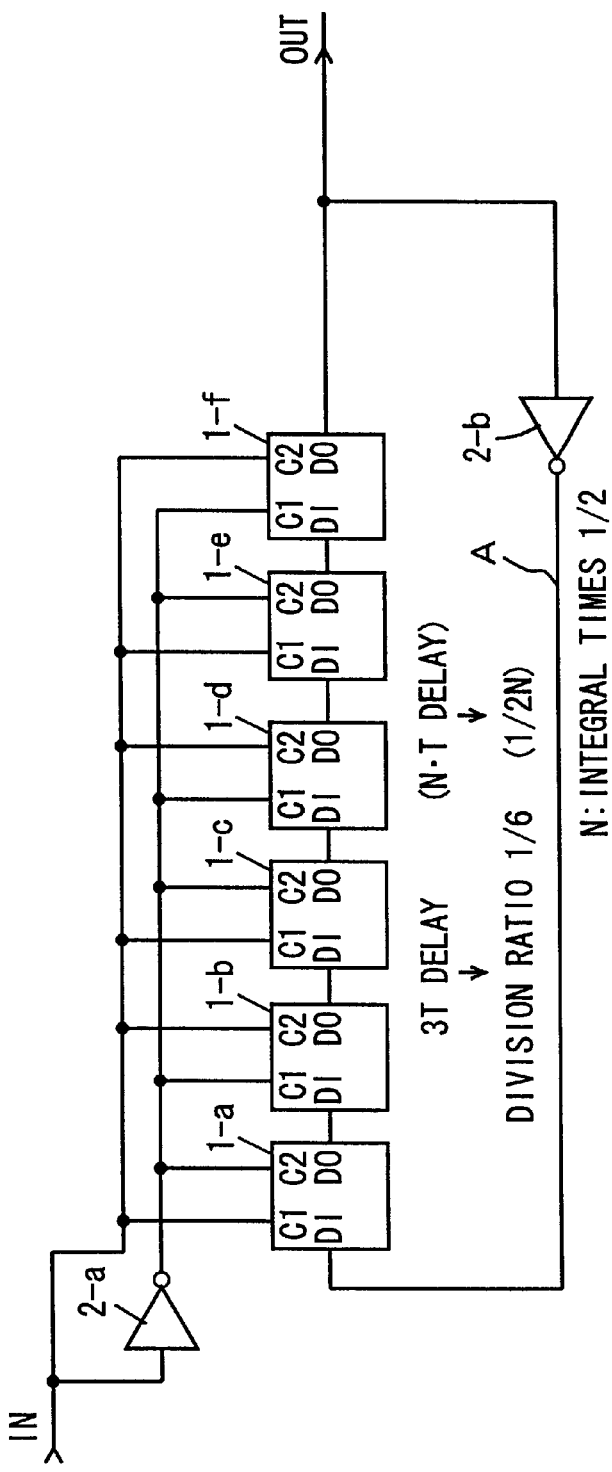
FIG. 34A illustrates the structure of a frequency-dividing circuit according to a twelfth embodiment of the present invention.
Figure 34B:
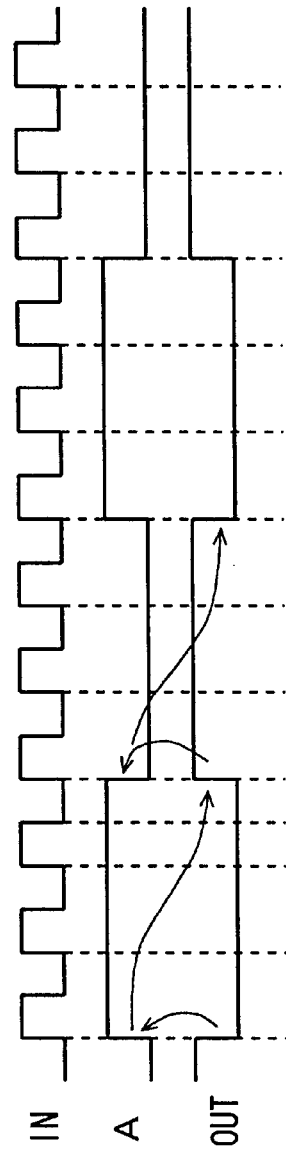
FIG. 34B is a timing chart representing operations of the frequency-dividing circuit shown in FIG. 34A.

FIG. 34A illustrates the structure of a frequency-dividing circuit according to a twelfth embodiment of the present invention. Referring to FIG. 34A, the frequency-dividing circuit includes cascaded D-latches 1-a to 1f of four stages and an invertor 2-b inverting an output signal OUT of D-latch 1f and transmitting the inverted signal to an input DI of the initial-stage D-latch 1-a through a node A. D-latches 1-a to 1f operate in synchronization with an input signal IN and sequentially transfer a supplied signal. In the frequency-dividing circuit shown in FIG. 34A, a pair of D-latches (e.g., 1-a and 1-b) operating complementarily to each other serve as a 1T delay circuit. Operations of the frequency-dividing circuit shown in FIG. 34A are now described with reference to a timing chart shown in FIG. 34B.

All output signals of D-latches 1-a to 1f are reset low. If the output signal OUT is low, the signal transmitted from invertor 2-b to node A goes high. The high-level signal on node A is transmitted through D-latches 1a to 1f. Therefore, the output signal OUT rises to a high level after a lapse of three cycles. When the output signal OUT goes high, the signal on node A falls to a low level through invertor 2-b. Then, the low-level signal on node A is transmitted again through D-latches 1-a to 1f, and the output signal OUT falls to a low level. Thus, the output signal OUT has a high-level period of three cycles of the input signal IN and a low-level period of three cycles of the input signal IN. Thus, a frequency-divided signal having a duty ratio of 50% and a frequency division ratio of 1/6 is provided.

The frequency-dividing circuit shown in FIG. 34A can be readily extended to a general frequency-dividing circuit generating a frequency-divided signal having a frequency division ratio of 1/2N. When an N·T delay circuit is employed, an output signal thereof is inverted and the inverted signal is transmitted to an input part of the N·T delay circuit so that the logical level of the output signal changes every N cycles, whereby a frequency-divided signal having a frequency division ratio of 1/2N can be generated. In this case, therefore, the frequency-divided signal satisfies the following relation:

OUT=Z(OUT(-N))

According to the twelfth embodiment of the present invention, D-latches operating in synchronization with the input signal are cascaded for inverting the output signal of the final-stage D-latch and transmitting the inverted signal to the input part of the initial-stage D-latch, whereby the logical level of the output signal can be changed every prescribed cycles and the frequency-divided signal having the frequency division ratio of 1/2N can be readily generated with a small number of components.

Also in this structure, D-latch 1f operates in accordance with input signal IN and the output signal of invertor 2-a, whereby the delay time of output signal OUT with respect to input signal IN can be sufficiently reduced.

Also in the structure shown in FIG. 34A, buffer circuits may be inserted between the D-latches for preventing the signals from racing.

The 1/2N frequency-dividing circuit shown in FIG. 34A is equivalent to a structure obtained by making K·T delay circuit 80a equivalent to a buffer with the delay time thereof zeroed in the frequency-dividing circuit shown in FIG. 33A (logic circuit 80b operates as a buffer circuit (in the case of an AND circuit) or an invertor (in the case of a NAND circuit)).

[Thirteenth Embodiment]

Figure 35:
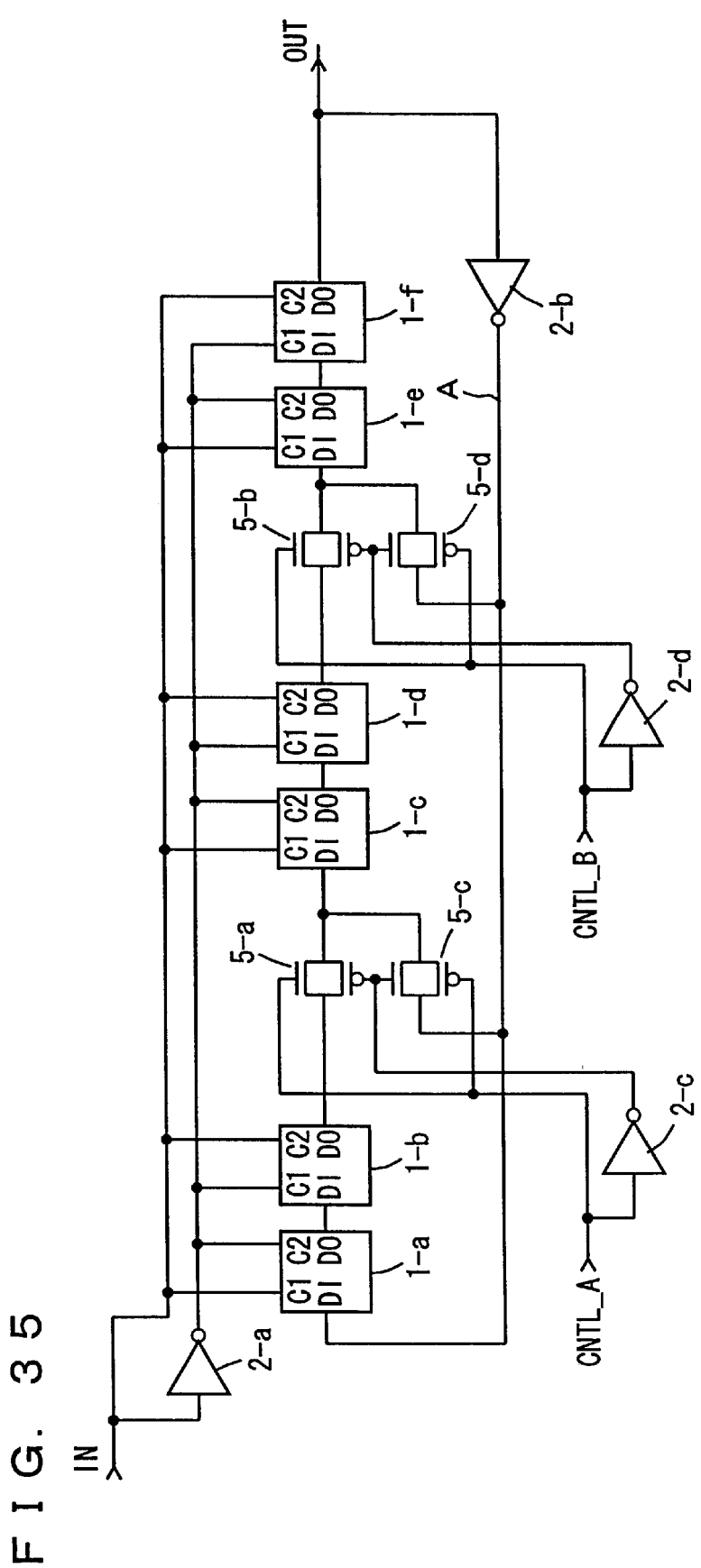
FIG. 35 schematically illustrates the structure of a frequency-dividing circuit according to a thirteenth embodiment of the present invention.
Figure 36:
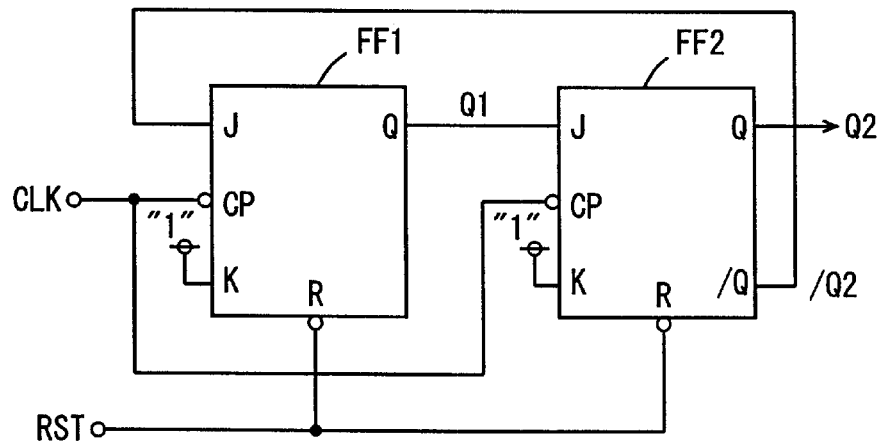
FIG. 36 schematically illustrates the structure of a conventional frequency-dividing circuit.
Figure 37:
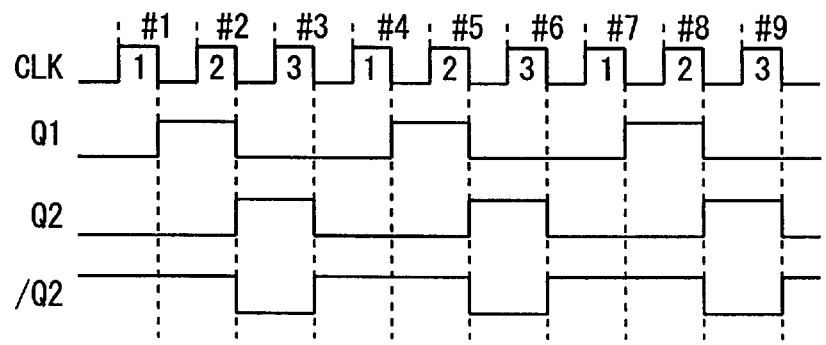
FIG. 37 is a timing chart representing operations of the frequency-dividing circuit shown in FIG. 36.
Figure 38A:
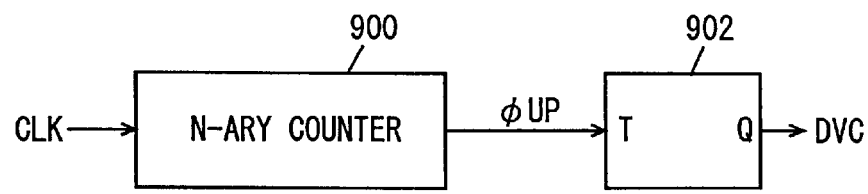
FIG. 38A illustrates another structure of the conventional frequency-dividing circuit.
Figure 38B:
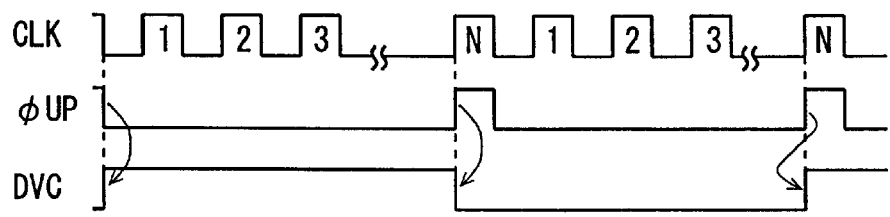
FIG. 38B is a timing chart representing operations of the frequency-dividing circuit shown in FIG. 38A.

FIG. 35 illustrates the structure of a frequency-dividing circuit according to a thirteenth embodiment of the present invention. Referring to FIG. 35, the frequency-dividing circuit includes cascaded D-latches 1-*a* and 1-*b* of two stages operating in accordance with an input signal IN and an inverted input signal from an invertor 2-*a* and transmitting a signal from an invertor 2-*b*, a CMOS transmission gate 5-*a* rendered conductive, when a selection signal CNTL-A is high, for transmitting the output signal of D-latch 1-*b*, a CMOS transmission gate 5-*c* rendered conductive, when an output signal of an invertor 2-*c* receiving the selection signal CNTL-A is high, for transmitting the output signal of the invertor 2-*b*, cascaded D-latches 1-*c* and 1-*d* of two stages receiving the output signal of CMOS transmission gate 5-*a* or 5-*c* and transmitting the received signal in accordance with the input signal IN and the inverted input signal output from invertor 2*a*, a CMOS transmission gate 5-*b* rendered conductive, when a selection signal CNTL-B is high, for transmitting the output signal of D-latch 1-*d*, a CMOS transmission gate 5-*d* rendered conductive, when an inverted signal of selection signal CNTL-B supplied through an invertor 2-*d* is high, for transmitting the output signal of the invertor 2-*b* and cascaded D-latches 1-*e* and 1*f* of two stages operating in accordance with the input signal IN and the inverted input signal output from invertor 2-*a* for transmitting the output signal of CMOS transmission gate 5-*b* or 5-*d*. An output signal OUT of D-latch 1*f* is supplied to an input of invertor 2-*b*.

When both of selection signals CNTL-A and CNTL-B are high, both of CMOS transmission gates 5-*a* and 5-*b* are rendered conductive while both of CMOS transmission gates 5-*c* and 5-*d* are rendered non-conductive. Therefore, this frequency-dividing circuit serves as a 1/6 frequency-dividing circuit generating a frequency-divided signal having a frequency division ratio of 1/6, in which the output signal OUT changes every fourth cycle by feeding back the output of cascaded D-latches of six stages.

When selection signal CNTL-A is low and the selection signal CNTLB is high, CMOS transmission gates 5-*a* and 5-*b* are rendered nonconductive and CMOS transmission gates 5-*c* and 5-*d* are rendered conductive. The output signal of invertor 2-*b* is supplied to the D-latch 1-*c* through CMOS transmission gate 5-*c*. Therefore, the frequency-dividing circuit operates as a frequency-dividing circuit formed by four stages of D-latches for generating a frequency-divided signal having a frequency division ratio of 1/4.

By setting the selection signal CNTL-B low (the selection signal CNTL-A is in a don't care state), CMOS transmission gate 5-*b* is rendered non-conductive and CMOS transmission gate 5-*d* is rendered conductive. Thus, the two stages of cascaded D-latches 1-*e* and 1*f* and the invertor 2-*b* form a feedback loop, to change the logical level of the output signal OUT every cycle. At this time, therefore, the frequency-dividing circuit generates a frequency-divided signal having a frequency division ratio of 1/2.

The number of delay stages of the delay circuit can be changed by inserting the CMOS transmission gates (or selection circuits) for switching the number of delay stages between the D-latches, thereby readily changing the frequency division ratio. Also in this variable frequency-dividing circuit, D-latch 1*f* outputs the output signal OUT. D-latch 1*f* operates in accordance with input signal IN, and hence the delay time of the output signal OUT with respect to the input signal IN remains unchanged regardless of the frequency division ratio. The structure bypassing the D-latches is also applicable to the aforementioned variable delay stage.

Also in the frequency-dividing circuit shown in FIGS. 34A and 35, buffer circuits may be inserted between the D-latches for preventing racing.

[Modifications]

In the structure implementing a variable delay circuit with CMOS transmission gates, the CMOS transmission gate may be structured by a transfer gate formed by a single MOS transistor, or tri-state buffers.

The voltage levels of the selection signals CNTL-A, CNTL-B and CNTL-C may be fixedly set by mask interconnections, or in response to the voltage levels of specific bonding pads. Further, a specific register or the like may hold data for setting the states of the control signals.

According to the present invention, as hereinabove described, the frequency-dividing circuit is formed by cascading D-latches operating in accordance with an input signal, whereby the frequency-dividing circuit can be implemented with a small number of transistors. Further, a frequency-dividing circuit having a desired frequency division ratio can be implemented by simply changing the number of stages of the D-latches.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A frequency-dividing circuit, with a frequency division ratio expressed as 1/(2M+K) with K being an integer and M being a natural number greater than or equal to K, for dividing a clock signal having a cycle period of T, comprising:

a first delay stage operating in clock synchronization with said clock signal for delaying a supplied first signal by K cycles, K·T, of said clock signal for outputting a second signal;

a second delay stage operating in synchronization with said clock signal for delaying a supplied third signal M cycles, M·T, of said clock signal for outputting a fourth signal;

a feedback means coupled between the first and second delay stages, for receiving said output fourth signal of said second delay stage and generating a feedback signal for feeding back as said first signal to an input of said first delay stage;

a logic circuit, receiving said second signal and said feedback signal of said feedback means, for performing a prescribed logical processing on said received signals for supplying said third signal to said second delay stage, wherein a logical level of said third signal output is different when:

(a) said received signals are both at a first logical level, than when (b) at least one of said received signals is at a second logical level; and duty control circuitry coupled to said second delay stage for deriving, from said fourth signal, a fifth signal out of phase with said fourth signal by (K/2) cycles, K·T/2, of said clock signal, and taking a logical OR of the derived fifth signal and said fourth signal for outputting.

2. The frequency-dividing circuit in accordance with claim 1, wherein said duty control circuitry includes a third delay stage operating in synchronization with said clock signal for delaying said fourth signal by K/2 cycles of said clock signal by a latch transfer operation for outputting said fifth signal, and a logical gate for obtaining a logical OR of said fourth and said fifth signals for outputting.

3. The frequency-dividing circuit in accordance with claim 1, wherein said second delay stage includes cascaded delay latch circuits of M stages each operating in synchronization with said clock signal for taking in, latching and outputting an applied signal and each of said delay latch circuits includes cascaded two stages of unit latch circuits taking in and latching a signal, said unit latch circuits operating complimentary to each other and in synchronization with said clock signal, and said duty control circuitry includes a logic gate for receiving signals out of phase to each other by said K·T/2 from output signals of the unit latch circuits of said second delay stage, to take a logical OR of said received out of phase signals for outputting.

4. The frequency-dividing circuit in accordance with claim 1, wherein said feedback means includes an inversion circuit for inverting said fourth signal, and said logic circuit includes a logic gate for taking a logical AND of an output signal of said inversion circuit and said second signal for supplying to said second delay stage.

5. The frequency-dividing circuit in accordance with claim 1, wherein said second delay stage includes a variable delay stage having a delay time thereof variable in a unit of one cycle of said clock signal.

6. The frequency-dividing circuit in accordance with claim 5, wherein said variable delay stage includes:

a plurality of latch-type delay circuits provided in parallel with each other and having different delay times, and a selection circuit for selecting one of said plurality of latch-type delay circuits in accordance with a selection signal.

7. The frequency-dividing circuit in accordance with claim 1, wherein each of said first and second delay stages includes a non flipflop type latch circuit and said non flipflop type latch circuit takes in, latches and outputs a supplied signal in synchronization with said clock signal.

8. The frequency-dividing circuit in accordance with claim 7, wherein said non flipflop type latch circuit comprises an inverter latch.

9. A frequency-dividing circuit, with a frequency division ratio expressed as 1/(2M+K) with K being an integer and M being a natural number greater than or equal to K, for dividing a clock signal having a cycle period of T, comprising:

a first delay stage operating in clock synchronization with said clock signal for delaying a supplied first signal by K cycles, K·T, of said clock signal for outputting a second signal;

a second delay stage operating in synchronization with said clock signal for delaying a supplied third signal M cycles, M·T, of said clock signal for outputting a fourth signal;

a feedback means coupled between the first and second delay stages, for receiving said output fourth signal of said second delay stage and generating a feedback signal for feeding back as said first signal to an input of said first delay stage;

a logic circuit, receiving said second signal and said feedback signal of said feedback means, for performing a prescribed logical processing on said received signals for supplying said third signal to said second delay stage, wherein a logical level of said third signal output is different when:

(a) said received signals are both at a first logical level, than when (b) at least one of said received signals is at a second logical level; and a duty control circuit coupled to said second delay stage for deriving a fifth signal out of phase with said fourth signal by K/2 cycles, K·T/2, of said clock signal and taking a logical AND of the derived fifth signal and said fourth signal for outputting.

10. The frequency-dividing circuit in accordance with claim 9, wherein said duty control circuit includes a third delay stage operating in synchronization with said clock signal for delaying said fourth signal by K/2 cycles, K·T/2, of said clock signal for outputting said fifth signal, and a logic gate for taking a logical AND of said fourth signal and said fifth signal for outputting.

11. The frequency-dividing circuit in accordance with claim 9, wherein said second delay stage includes cascaded delay latch circuits of M stages each operating in synchronization with said clock signal, taking in and latching a supplied signal and providing a delay time of one cycle, T, of said clock signal, and each of the delay latch circuits includes cascaded two stages of unit latch circuits complimentary taking in and latching signals in synchronization with said clock signal, and said duty control circuit includes a logic gate receiving signals out of phase to each other by K/2 cycles, K·T/2, of said clock signal from said output signals of the unit latch circuits of said second delay stage, for taking a logical AND of received signals for outputting.

12. The frequency-dividing circuit in accordance with claim 9, wherein said feedback means includes a signal line transmitting said fourth signal without inversion, and said logic circuit includes a logic gate for taking a negative logical product of said second signal and the signal transmitted by said feedback means for supplying to an input of said second delay stage.

13. The frequency-dividing circuit in accordance with claim 9, wherein said second delay stage includes a variable delay stage having a delay time thereof variable in a unit of one cycle of said clock signal.

14. The frequency-dividing circuit in accordance with claim 13, wherein said variable delay stage includes:

a plurality of latch-type delay circuits provided in parallel with each other and having different delay times, and a selection circuit for selecting one of said plurality of latch-type delay circuits in accordance with a selection signal.

15. The frequency-dividing circuit in accordance with claim 9, wherein each of said first and second delay stages includes a non flipflop type latch circuit and said non flipflop type latch circuit takes in, latches and outputs a supplied signal in synchronization with said clock signal.

16. The frequency-dividing circuit in accordance with claim 15, wherein said non flipflop type latch circuit comprises an inverter latch.

17. A frequency-dividing circuit dividing a clock signal having a cycle T, comprising:

a delay stage operating in synchronization with said clock signal for delaying a supplied signal by N cycles of said clock signal through a transfer operation of successively transferring the supplied signal through the delay stage, in response to said clock signal, for outputting; and a feedback circuit for inverting an output signal of said delay stage for transmission to an input of said delay stage; and wherein said delay stage includes delay latch circuits of N stages operating in synchronization with said clock signal for performing latching and outputting, and selection circuitry for bypassing a prescribed number of delay latch circuits among said delay latch circuits of N stages in accordance with a selection signal for transmitting and receiving signals to and from said feedback circuit.

18. The frequency-dividing circuit in accordance with claim 17, wherein each of said delay latch circuits provides a delay time of one-half cycle of said clock signal.

19. The frequency-dividing circuit in accordance with claim 17, wherein said delay stage includes a non flipflop type latch circuit and said non flipflop type latch circuit takes in, latches and outputs a supplied signal in synchronization with said clock signal.

20. The frequency-dividing circuit in accordance with claim 19, wherein said non flipflop type latch circuit comprises an inverter latch.

21. The frequency-dividing circuit in accordance with claim 17, wherein said prescribed number is an even integer such that said delay stage provides a first delay time which is less than a second delay time of all N stages by an integer multiple of T.

* * * * *

UNITED STATES PATENT AND TRADEMARK OFFICE
CERTIFICATE OF CORRECTION

PATENT NO.      : 6,313,673 B1
DATED           : November 6, 2001
INVENTOR(S)     : Tetsuya Watanabe It is certified that error appears in the above-identified patent and that said Letters Patent is hereby corrected as shown below:

<u>Title page,</u>
Item [54], change "50" to -- 50% --

Therefor the title should appear as:
FREQUENCY-DIVIDING CIRCUIT CAPABLE OF GENERATING FREQUENCY-DIVIDED SIGNAL HAVING DUTY RATIO OF 50%

Signed and Sealed this

Second Day of April, 2002

Attest:

JAMES E. ROGAN
*Attesting Officer*    *Director of the United States Patent and Trademark Office*